(12) United States Patent
Shainline et al.

(10) Patent No.: US 11,258,415 B2
(45) Date of Patent: Feb. 22, 2022

(54) NEUROMIMETIC CIRCUIT

(71) Applicant: Government of the United States of America, as represented by the Secretary of Commerce, Gaithersburg, MD (US)

(72) Inventors: Jeffrey Shainline, Boulder, CO (US); Sae Woo Nam, Boulder, CO (US); Sonia Buckley, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 1105 days.

(21) Appl. No.: 15/841,701

(22) Filed: Dec. 14, 2017

(65) Prior Publication Data
US 2018/0211158 A1  Jul. 26, 2018

Related U.S. Application Data

(60) Provisional application No. 62/450,266, filed on Jan. 25, 2017.

(51) Int. Cl.
| | |
|---|---|
| H03F 19/00 | (2006.01) |
| G06N 3/04 | (2006.01) |
| G06F 1/08 | (2006.01) |
| G06N 3/067 | (2006.01) |
| G06N 3/08 | (2006.01) |
| G06N 3/063 | (2006.01) |

(52) U.S. Cl.
CPC .............. *H03F 19/00* (2013.01); *G06F 1/08* (2013.01); *G06N 3/049* (2013.01); *G06N 3/0472* (2013.01); *G06N 3/063* (2013.01); *G06N 3/0675* (2013.01); *G06N 3/088* (2013.01)

(58) Field of Classification Search
CPC ......... H03K 3/3015; H03F 19/00; G06F 1/08; G06N 3/049; G06N 3/0675; G06N 3/088; G06N 3/0472; G06N 3/063
USPC ............... 257/14, 21, 23; 327/571; 364/807; 307/311, 324, 317, 116, 117
See application file for complete search history.

(56) References Cited

U.S. PATENT DOCUMENTS 5,508,529 A * 4/1996 Roenker ............... H01L 29/868
257/14

OTHER PUBLICATIONS

Pulsed neural networks consisting of single flux-quantum spiking neurons, T. Hirose et al (Year: 2007).*
S. Jahanmirinejad and A. Fiore, "Proposal for a superconducting photon number resolving detector with large dynamic range", Opt. Express, 2012, 5017, 20.
(Continued)

*Primary Examiner* — Arnold M Kinkead
(74) *Attorney, Agent, or Firm* — Office of Chief Counsel for National Institute of Standards and Technology

(57) ABSTRACT

A neuromimetic circuit includes: a primary single photon optoelectronic neuron; a synapse in optical communication with the primary single photon optoelectronic neuron; and an axonic waveguide in optical communication with the primary single photon optoelectronic neuron and the synapse such that the axonic waveguide optically interconnects the primary single photon optoelectronic neuron and the synapse.

18 Claims, 41 Drawing Sheets

(56) References Cited

OTHER PUBLICATIONS

A. Casaburi, et al., "Experimental evidence for photoinduced vortex crossing in current carrying superconducting strips", Phys. Rev. B, 2015, 214512, 92.

A. Casaburi et al., "Current distribution in a parallel configuration superconducting strip-line detector," Appl. Phys. Lett., 2013, 013503, 103.

F. Marsili, et al., "Physics and application of photon number resolving detectors based on superconducting parallel nanowires". New J. Phys., 2009, 045022, 11.

A. Divochiy, et al., "Superconducting nanowire photon-number-resolving detector at telecommunication wavelengths", Nat. Photon, 2008, 302, 2.

\* cited by examiner (A)
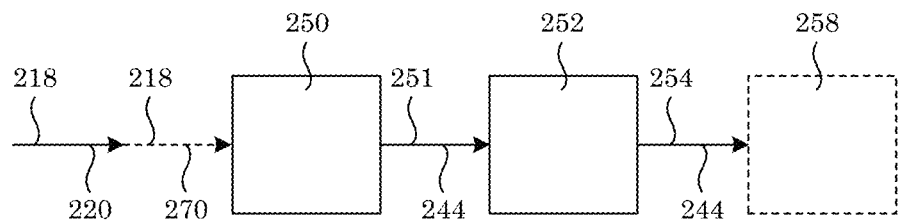
(B)
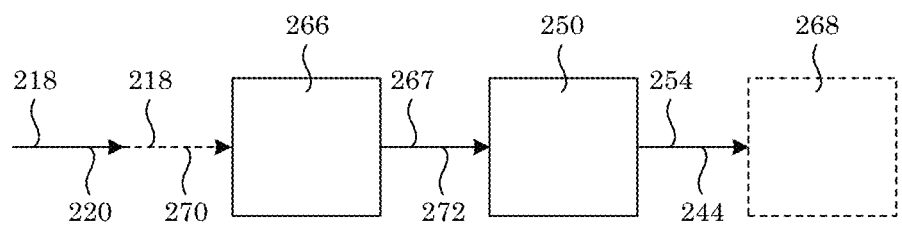
Figure 11

NEUROMIMETIC CIRCUIT

CROSS REFERENCE TO RELATED APPLICATIONS

This application claims the benefit of U.S. Provisional Patent Application Ser. No. 62/450,266 filed Jan. 25, 2017, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 17-001US1.

BRIEF DESCRIPTION

Disclosed is a neuromimetic circuit comprising: a primary single photon optoelectronic neuron; a synapse in optical communication with the primary single photon optoelectronic neuron; and an axonic waveguide in optical communication with the primary single photon optoelectronic neuron and the synapse such that the axonic waveguide optically interconnects the primary single photon optoelectronic neuron and the synapse.

Also disclosed is a process for performing neuromimetic computing, the process comprising: receiving a primary signal by a primary single photon optoelectronic neuron; producing an axonic photonic signal by the primary single photon optoelectronic neuron; communicating the axonic photonic signal to a synapse; receiving the axonic photonic signal by the synapse; producing a dendritic signal in response to receipt of the axonic photonic signal; communicating the dendritic signal from the synapse to a secondary single photon optoelectronic neuron; receiving the dendritic signal by the secondary single photon optoelectronic neuron; producing a second axonic photonic signal in response to receipt of the dendritic signal to perform neuromimetic computing.

BRIEF DESCRIPTION OF THE DRAWINGS

The following descriptions should not be considered limiting in any way. With reference to the accompanying drawings, like elements are numbered alike.

FIG. 11 shows a synapse in panels a and b.

Figure 31:
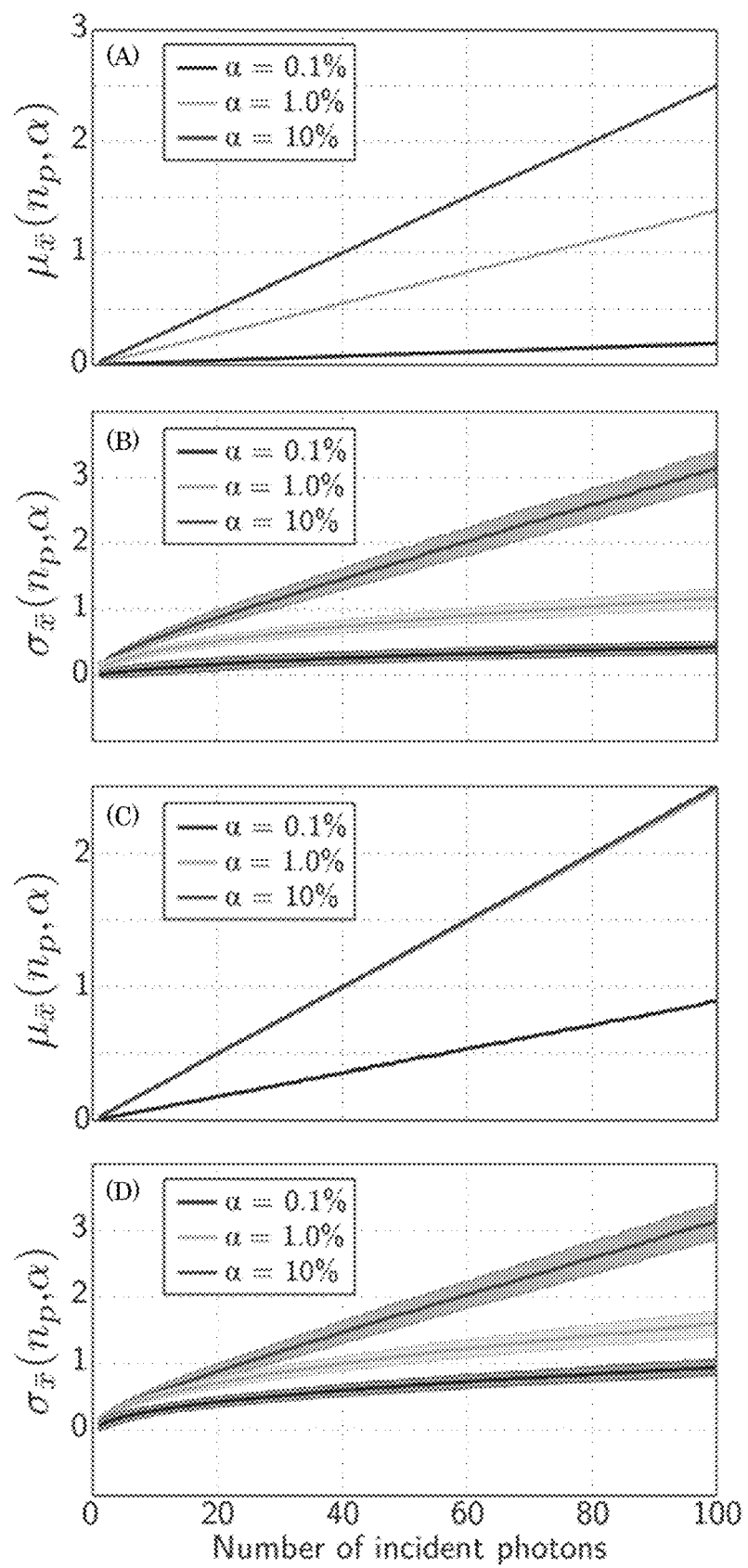
Figure 32:
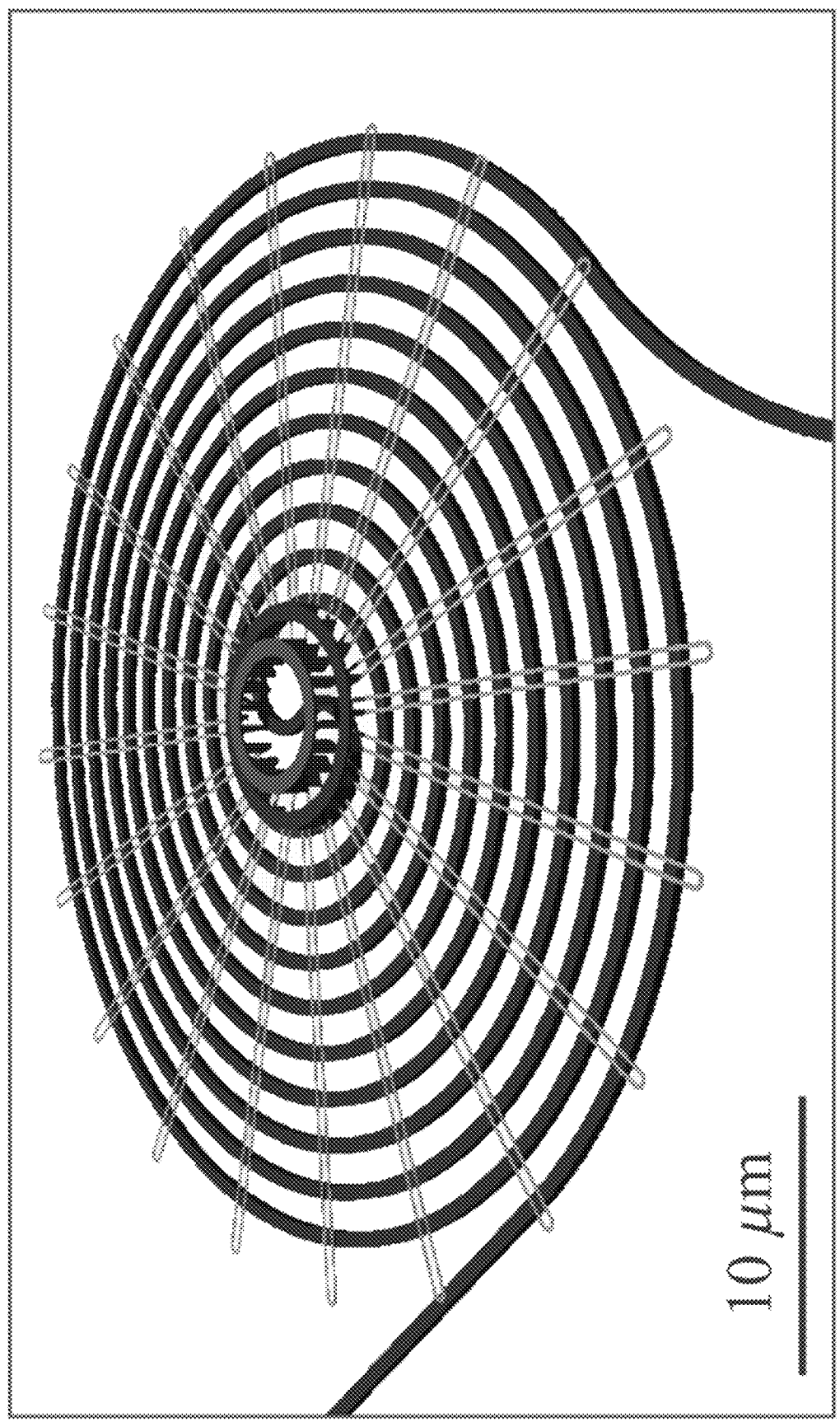
Figure 33:
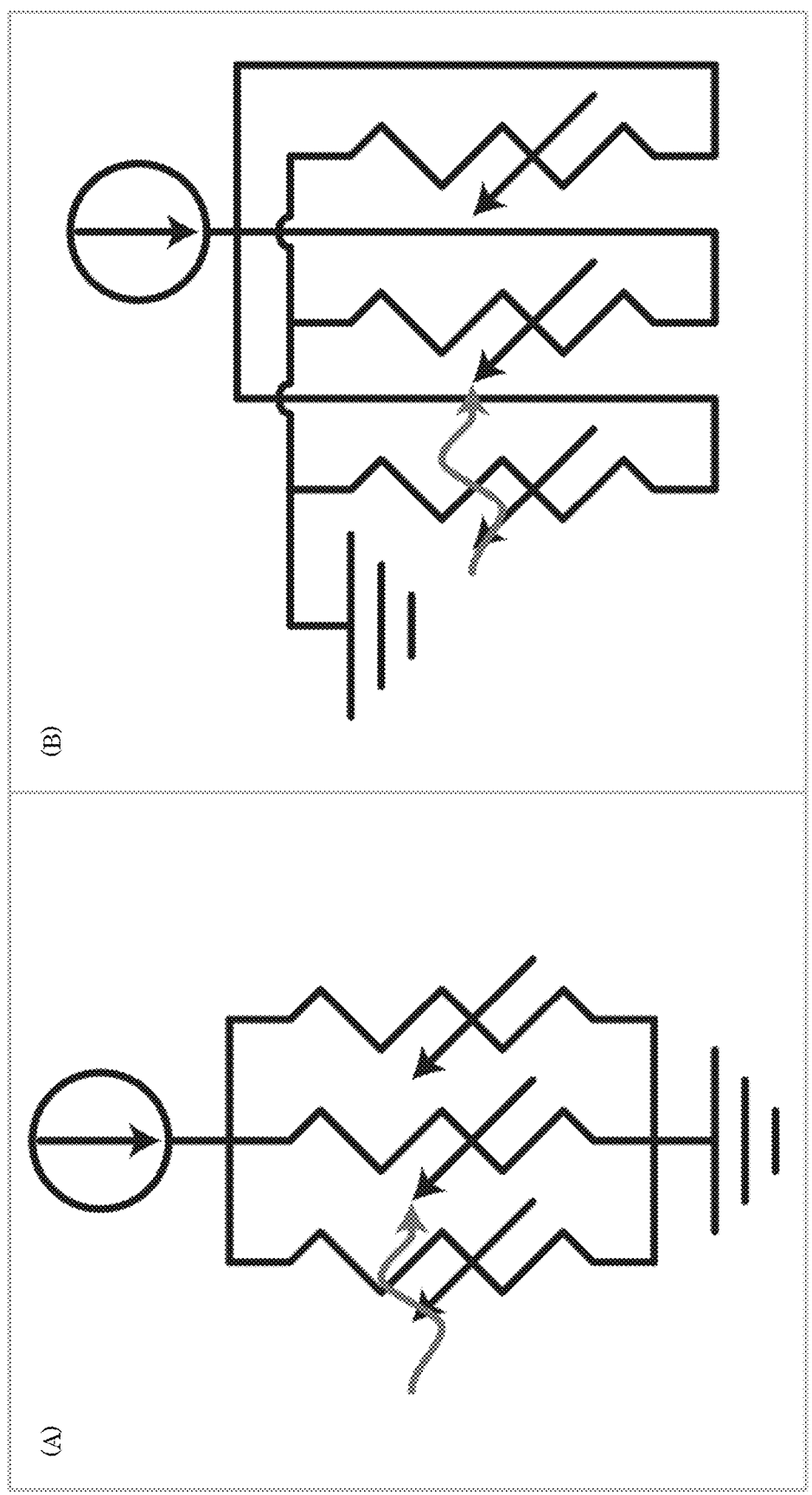
Figure 34:
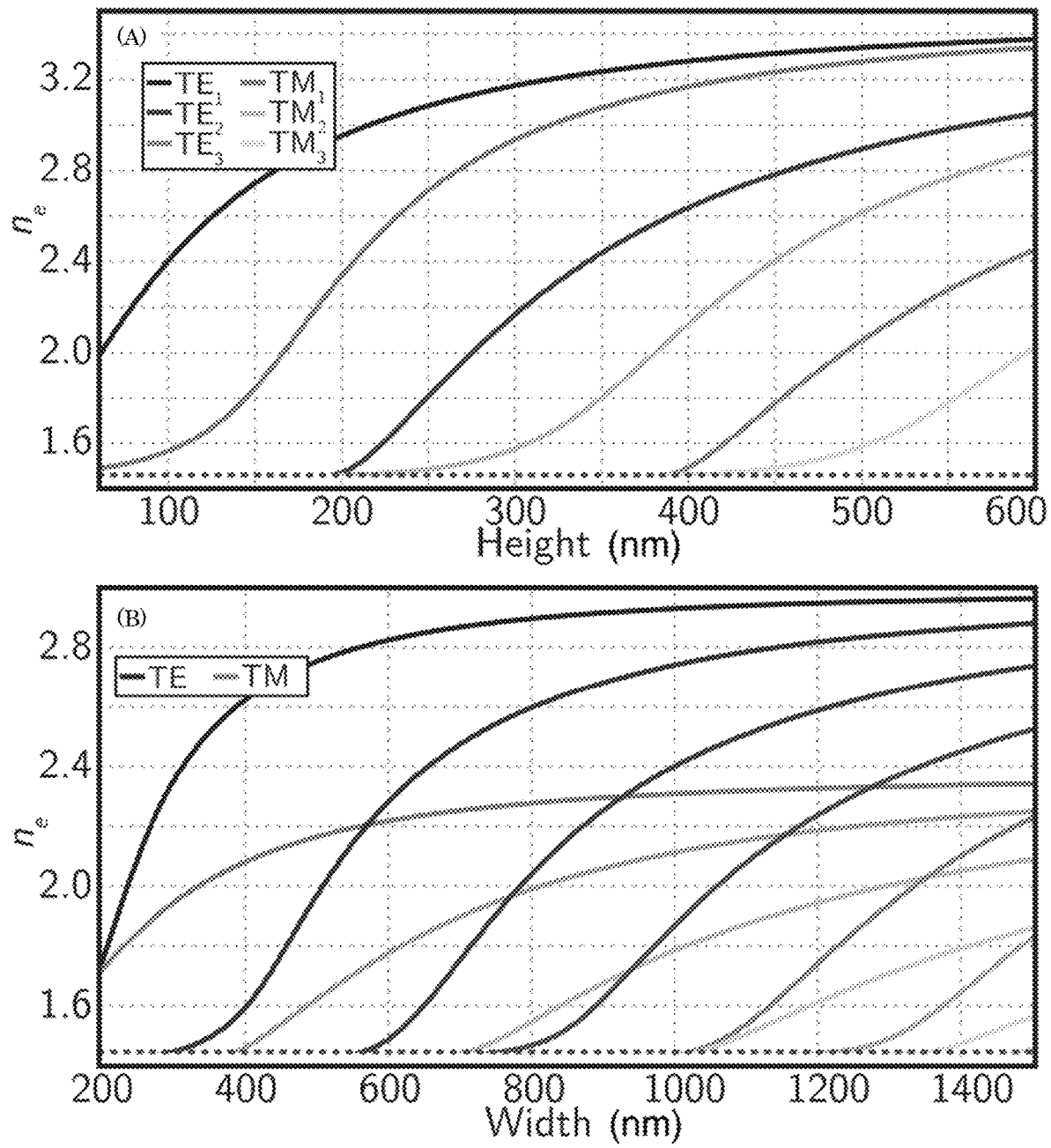
Figure 35:
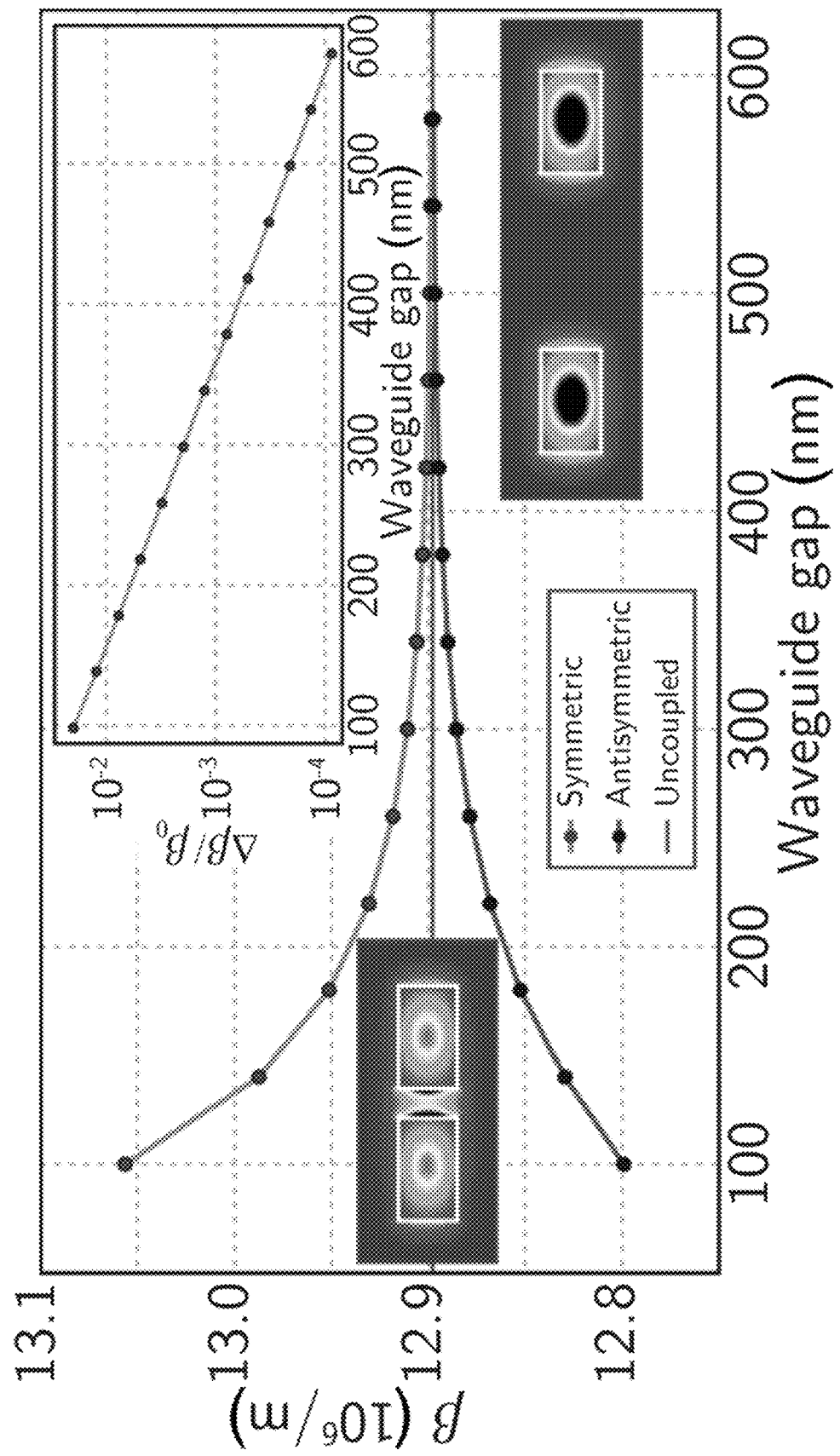
Figure 36:
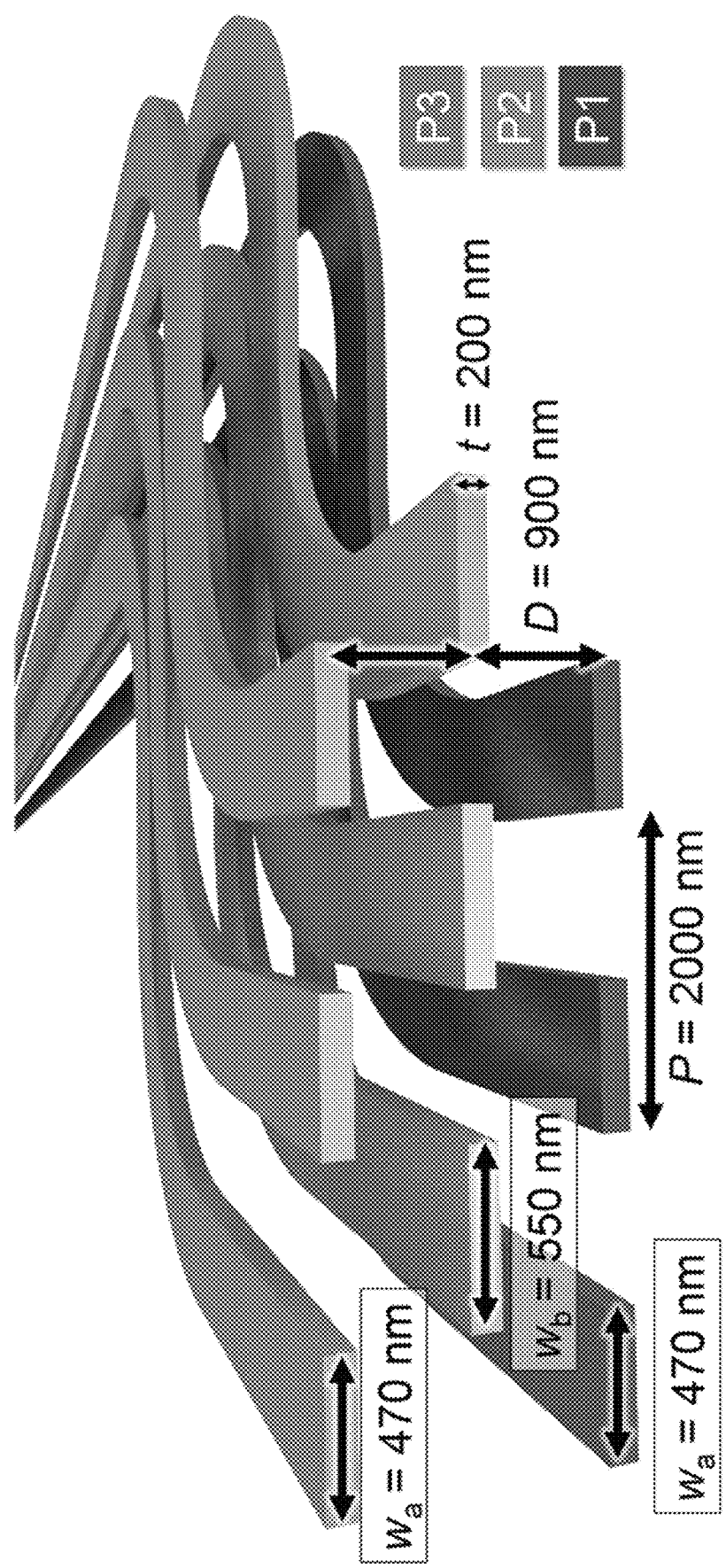
Figure 37:
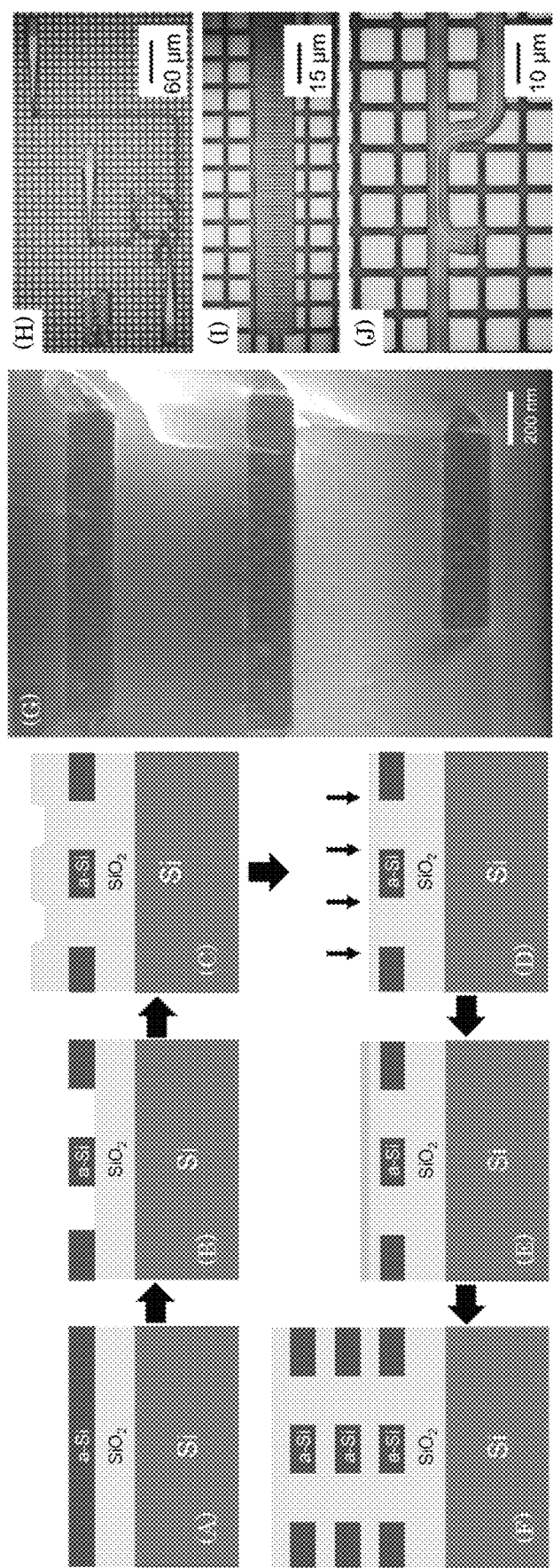
Figure 38:
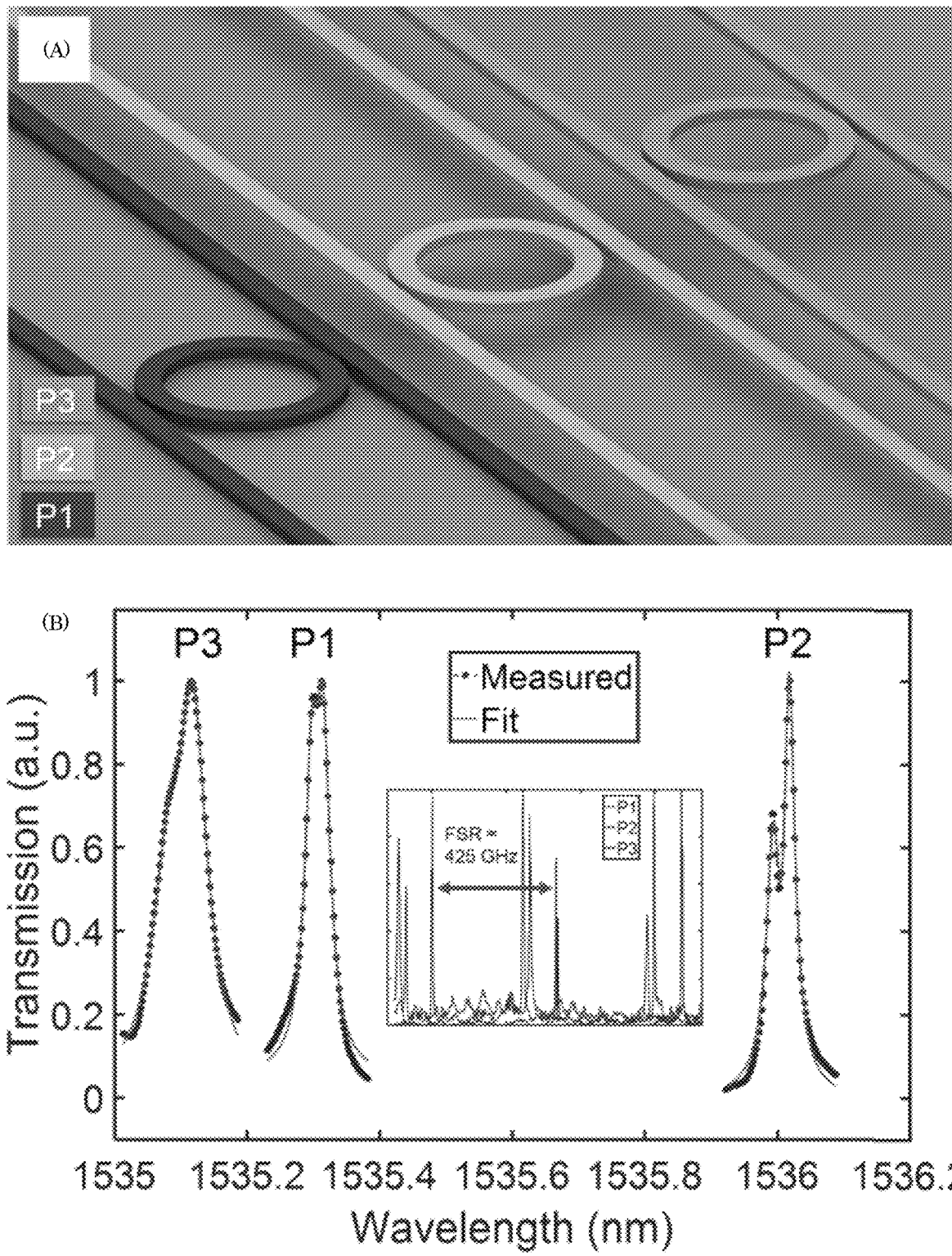
Figure 39:
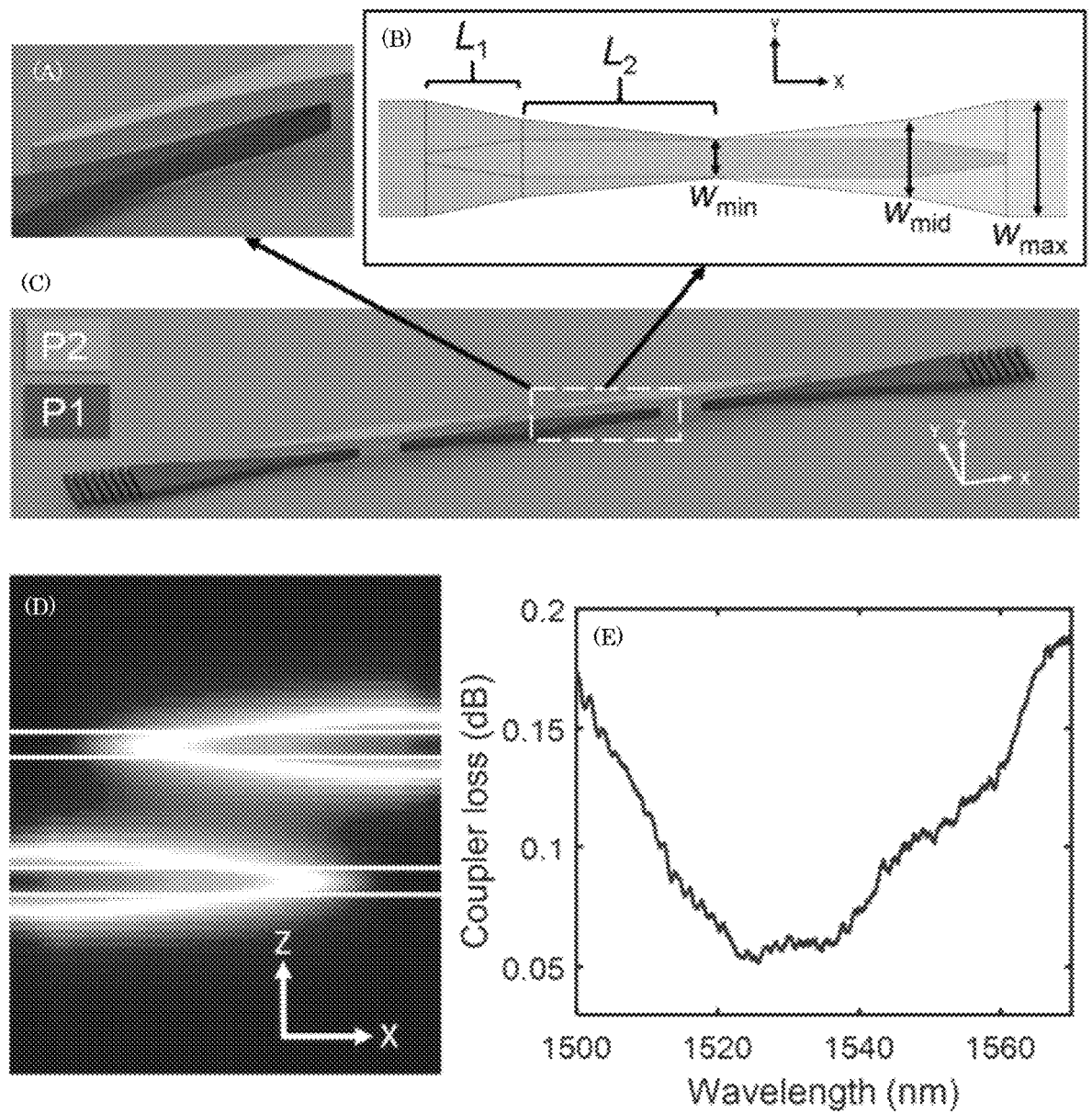
Figure 40:
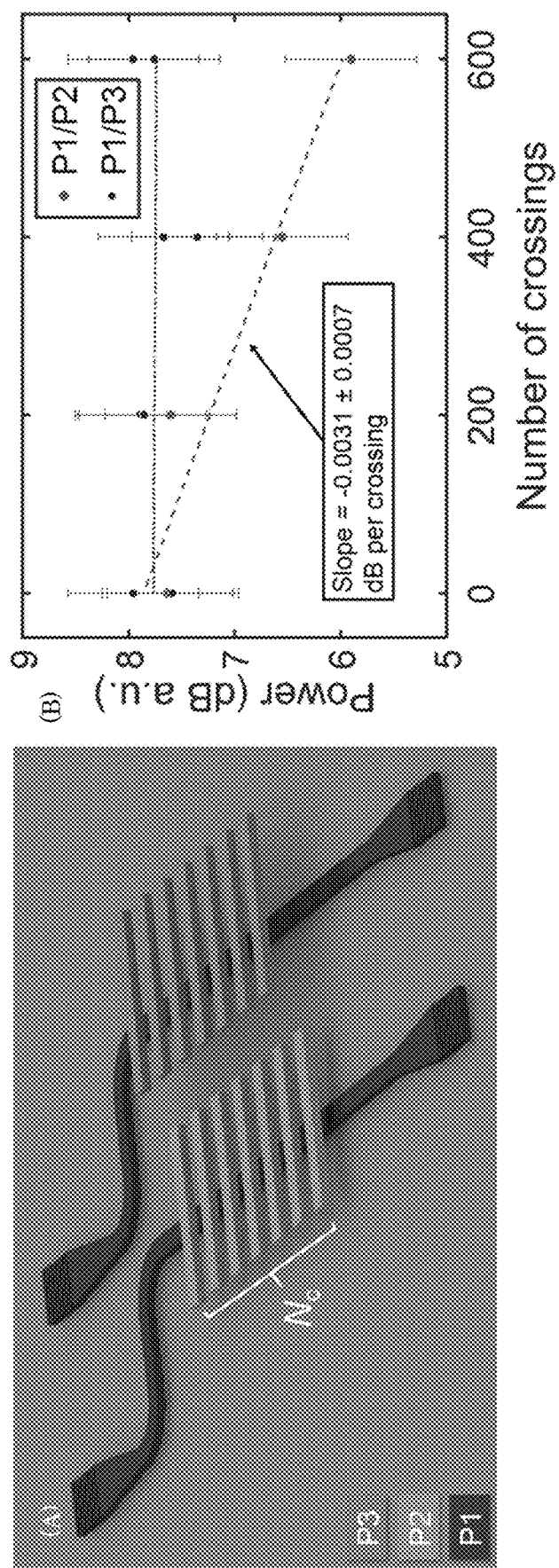
Figure 41:
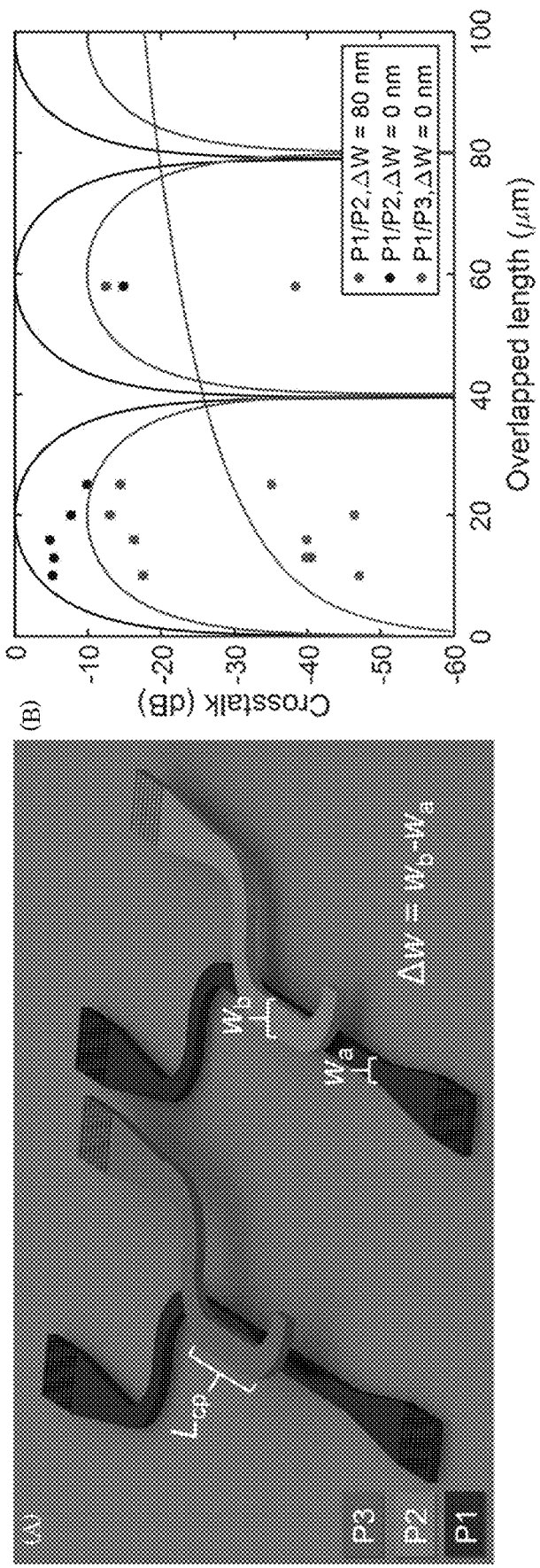

perpendicular configurations, for different spacer heights between the SNSPD and waveguide. (c) Absorption in waveguides of different thicknesses for different spacer heights;

FIG. 31 shows mean number (a) and standard deviation (b) of absorbed photons versus number of incident photons for neuron designs where light is directed past each nanowire once (single pass). Mean number (c) and standard deviation (d) of absorbed photons versus number of incident photons for neuron designs where light is directed past each nanowire ten times;

FIG. 32 shows a flux-dissipating spider web neuron;

FIG. 33 shows (a) a flux-trapping PND circuit. (b) An alternative PND design which avoids flux trapping;

FIG. 34 shows effective indices of refraction for various guided modes in a waveguiding layer with index of refraction n=3.52 and cladding n=1.46. (a) Slab mode calculations of both TE and TM modes for different film thicknesses showing different vertical mode orders. (b) TE and TM modes for different waveguide widths in a film of height 200 nm. The cladding index is shown as the dashed line in both (a) and (b);

FIG. 35 shows supermode propagation constants for 200-nm-thick, 350-nm-wide waveguides with 3.52 core index and 1.46 cladding index at $\lambda$=1220 nm. The inset shows the fractional splitting, and the mode profiles show the symmetric mode for gaps of 100 and 600 nm;

FIG. 36 shows a 3D integration platform, utilizing alternating waveguide widths to mitigate cross talk, which increases the waveguide packing density and allows arbitrary co-propagation lengths;

FIG. 37 shows [(a)-(f)] fabrication in which (a) deposition of the first a-Si film occurs; (b) patterning/etching waveguide structures; (c) deposition of the spacer $SiO_2$ plane (800 nm); (d) chemical-mechanical planarization (CMP) of the spacer (~~300 nm depth); (e) deposition of a ~200 nm $SiO_2$ thickness compensation plane to reach the target gap; (f) repeating [(a)-(e)] based on the number of desired planes. Top surface was not CMP'd after the final cladding deposition of 1100 nm. (g) Scanning-electron-microscope cross section of a-Si fill patterns in three planes; [(h)-(j)] optical micrographs of representative test devices on the wafer;

FIG. 38 shows three planes of micro-ring resonators. (a) Test device arrangement; (b) measured drop-port transmission spectra of one resonance from each ring, showing both raw and fitted curves. Inset: drop-port transmission spectra of identical P1, P2, and P3 rings encompassing three resonance peaks, showing a nominal free-spectral range (FSR) of ~~425 GHz;

FIG. 39 shows an interplane coupler in (a) zoom view; (b) layout showing key design parameters; (c) perspective view of simplified layout for cut-back measurements; (d) 2D E-field slice of simulation result, showing complete power transfer; (e) experimentally measured loss spectrum of 32 successive IPCs;

FIG. 40 shows waveguide crossing performance. (a) Simplified perspective view of test devices for P1/P2 and P1/P3 crossings; (b) experimentally measured transmitted power in cut-back measurements; and FIG. 41 shows waveguide cross talk for (a) a simplified perspective view of test devices for P1/P2 and P1/P3 cross talk paths; (b) experimentally measured cross talk values (dots) and theoretical cross talk data (solid lines).

DETAILED DESCRIPTION

A detailed description of one or more embodiments is presented herein by way of exemplification and not limitation.

It has been discovered that a neuromimetic circuit includes neurons interconnected by integrated photonic waveguides, wherein neurons receive photonic signals from other neurons. Individual neurons sum received signals on a waveguide-integrated photon detector. When a signal exceeds a threshold, a current pulse is delivered to a waveguide-integrated photon source that delivers a signal downstream to other neurons. A strength of connection between two neurons can selectively be varied in hardware or dynamically. The neuromimetic circuit can receive a classical light level and include reverse-biased p-i-n photodetectors with conventional digital electronics components to threshold. Further, the neuromimetic circuit can receive a few-photon signals and can include superconducting single photon detectors to threshold.

Figure 1:
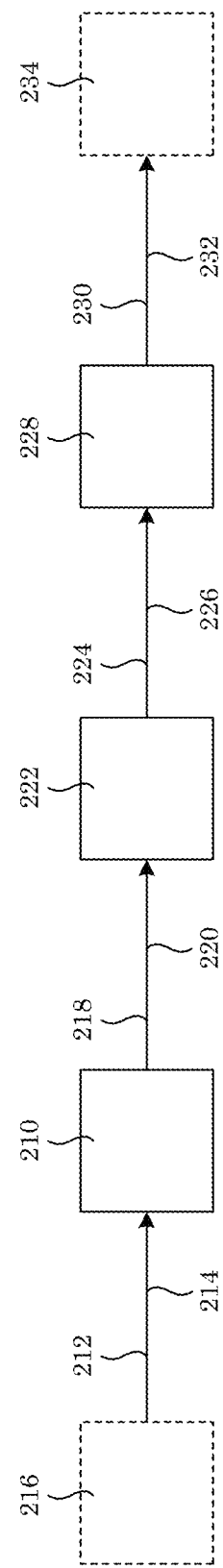
FIG. 1 shows a neuromimetic circuit.

In an embodiment, with reference to FIG. 1, neuromimetic circuit 200 includes: primary single photon optoelectronic neuron 210; synapse 222 in optical communication with primary single photon optoelectronic neuron 210; and axonic waveguide 220 in optical communication with the primary single photon optoelectronic neuron 210 and synapse 222 such that axonic waveguide 220 optically interconnects primary single photon optoelectronic neuron 210 and synapse 222. Dendritic communication path 214 can be in communication with primary single photon optoelectronic neuron 210 and can communicate primary signal 212 to primary single photon optoelectronic neuron 210. It is contemplated that primary source 216 produces primary signal 212.

Neuromimetic circuit 200 can include axonic waveguide 220 that communicates axonic photonic signal 218 from primary single photon optoelectronic neuron 210 to synapse 222. Secondary single photon optoelectronic neuron 228 is in optical communication with synapse 222 such that synapse 222 interconnects primary single photon optoelectronic neuron 210 and secondary single photon optoelectronic neuron 228. Here, dendritic communication path 226 is in optical communication with synapse 222 and secondary single photon optoelectronic neuron 228, wherein dendritic communication path 226 interconnects synapse 222 and secondary single photon optoelectronic neuron 228. In this manner, dendritic communication path 226 communicates dendritic signal 224 from synapse 222 to secondary single photon optoelectronic neuron 228, and secondary single photon optoelectronic neuron 228 can produce axonic photonic signal 230 that is communicated to recipient 234 via axonic waveguide 232.

Figure 2:
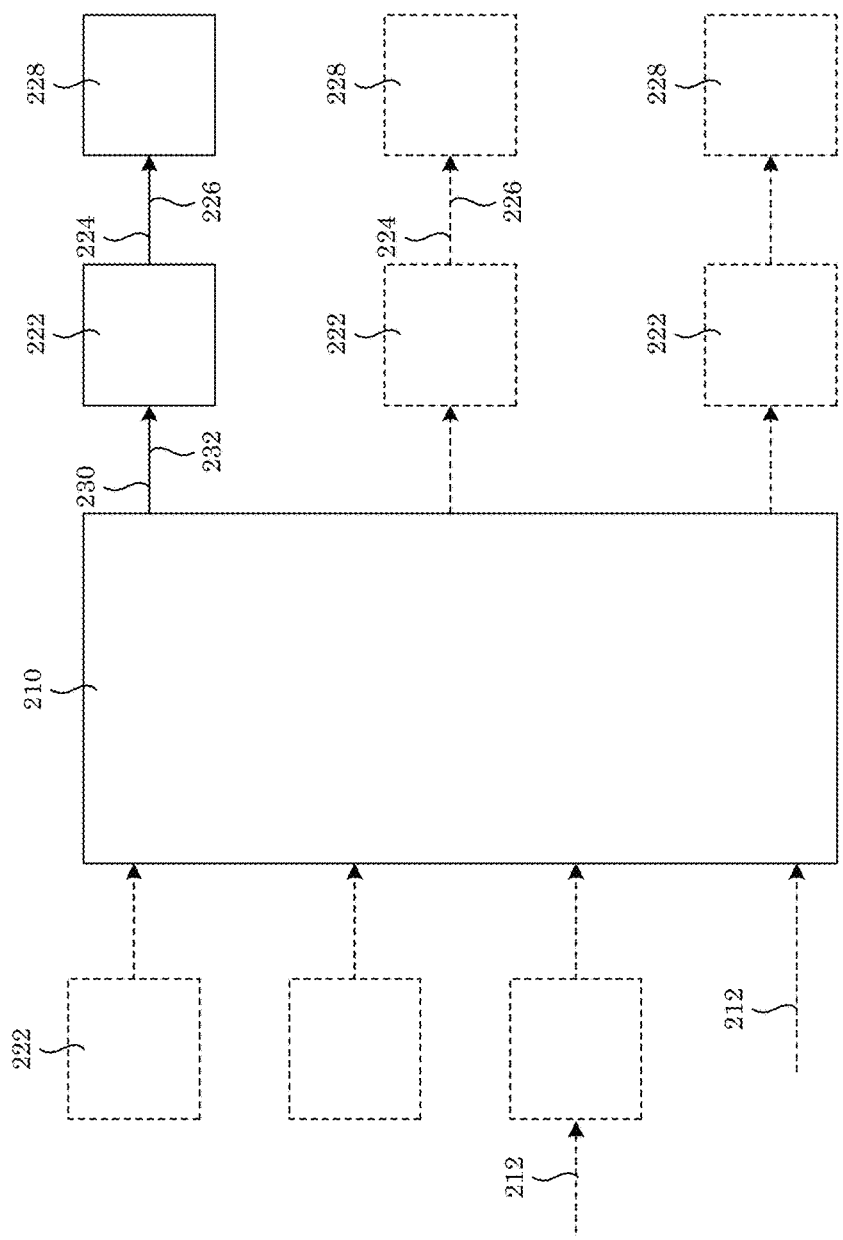
FIG. 2 shows a neuromimetic circuit.
Figure 3:
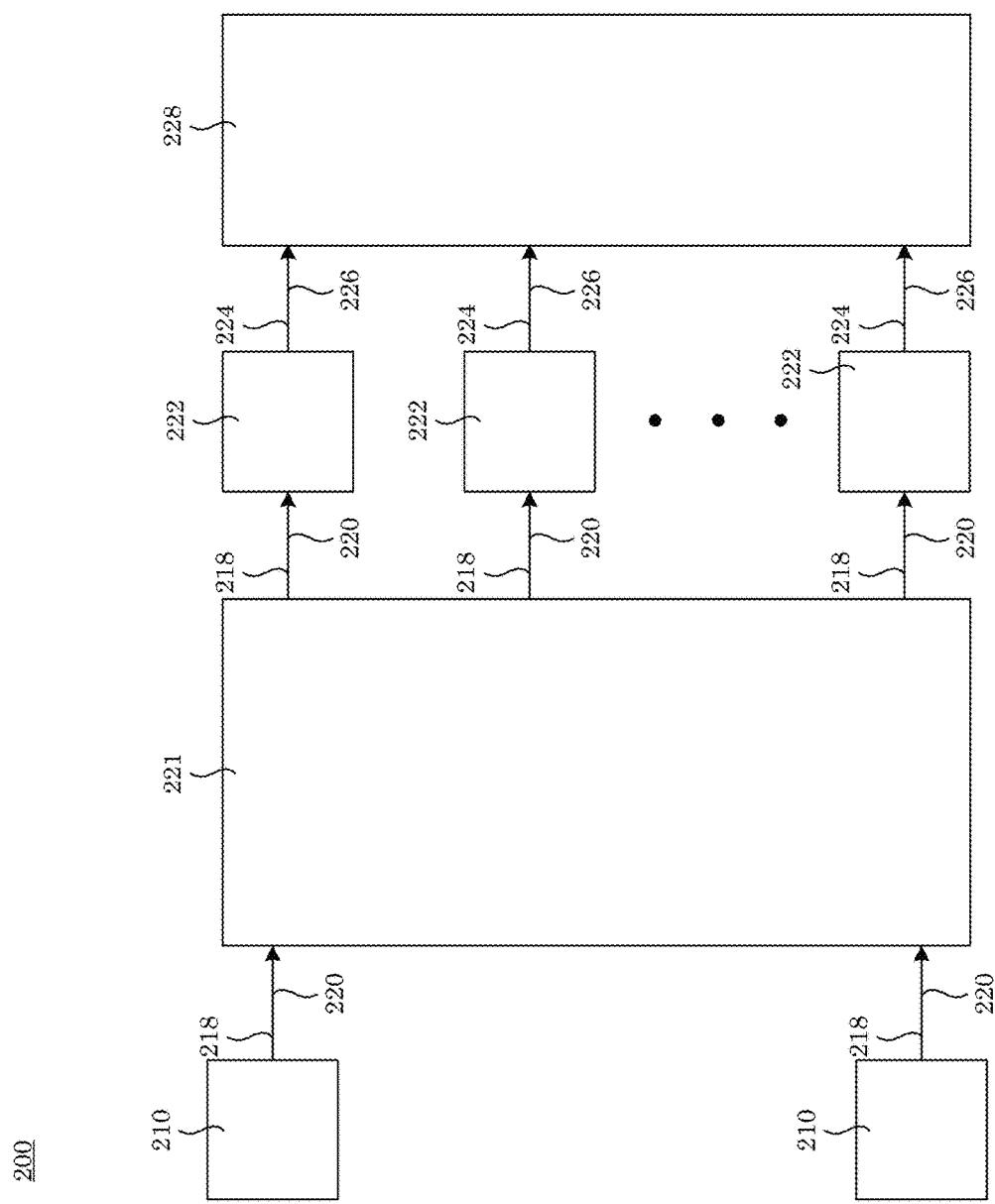
FIG. 3 shows a neuromimetic circuit.
Figure 4:
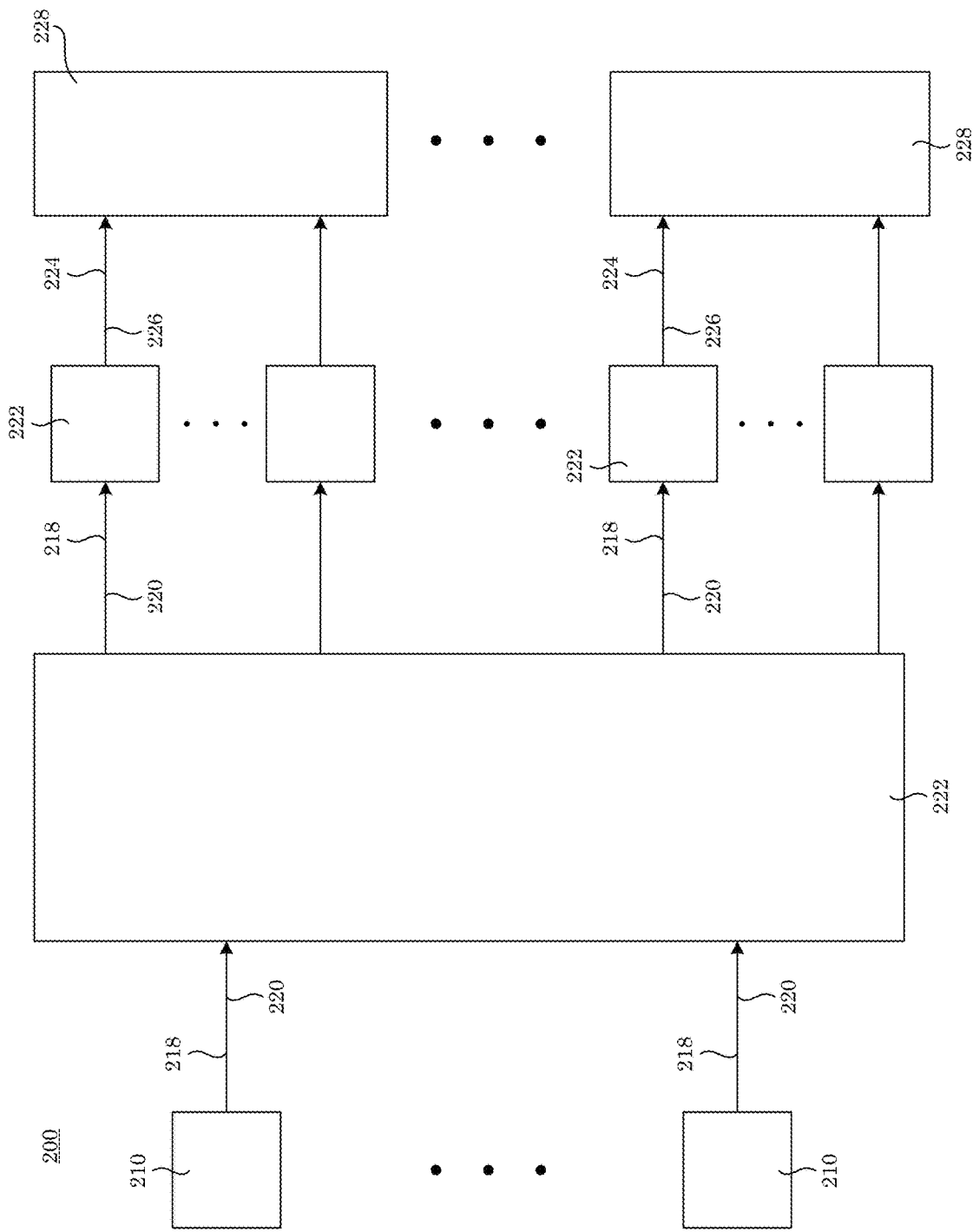
FIG. 4 shows a neuromimetic circuit.
Figure 5:
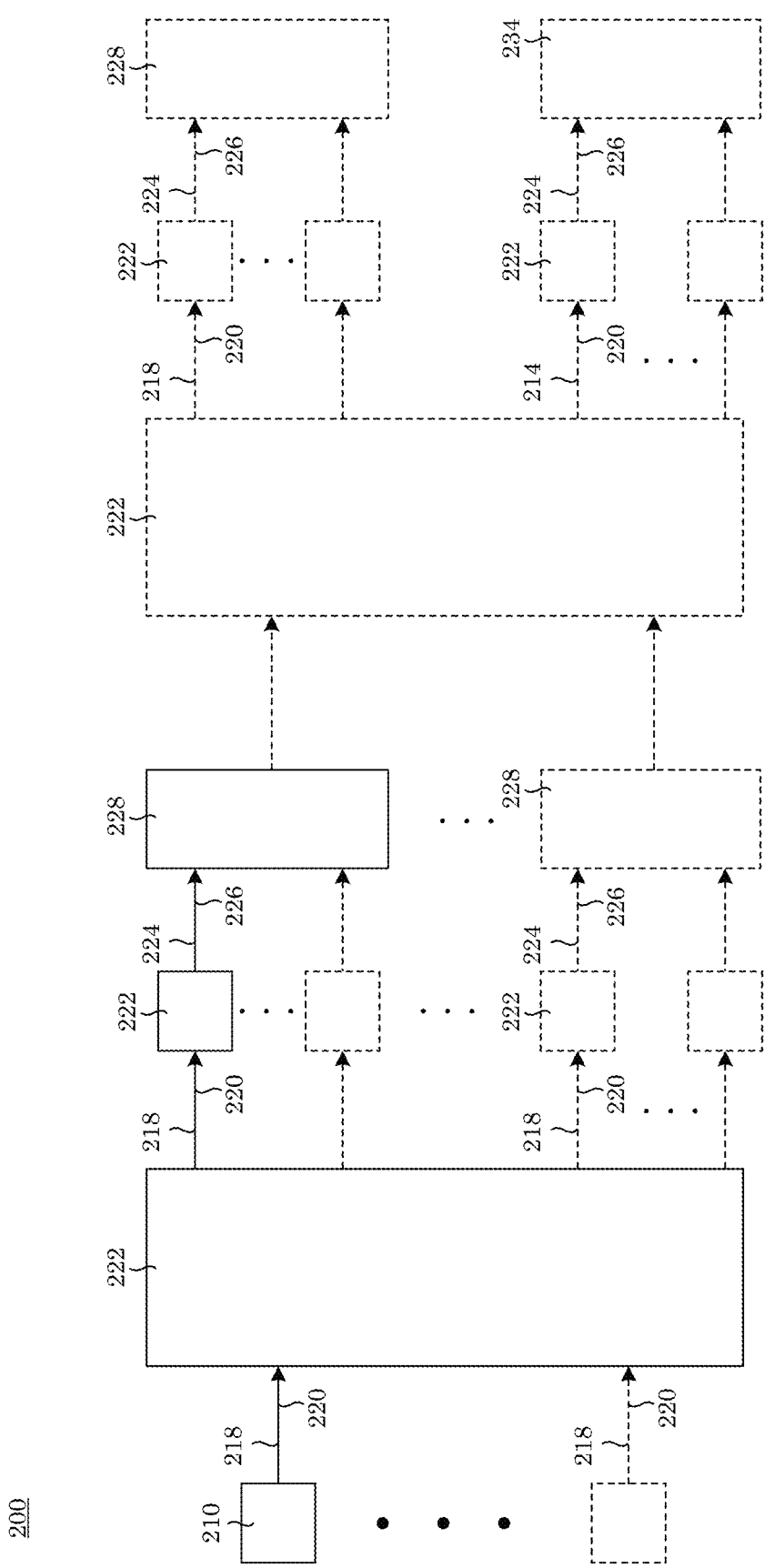
FIG. 5 shows a neuromimetic circuit.

An arrangement or number of primary single photon optoelectronic neuron 210, synapse 222, and secondary single photon optoelectronic neuron 228 can selected, e.g., based on a desired performance of neuromimetic circuit 200, e.g., for performing neuromimetic computing or to achieve a selected architecture. In an embodiment, with reference to FIG. 2, primary single photon optoelectronic neuron 210 provides axonic photonic signal 218 to synapse 222 that produces and communicates dendritic signals 224 to a plurality of secondary single photon optoelectronic neurons 228. In an embodiment, with reference to FIG. 3, primary single photon optoelectronic neurons 210 provide axonic photonic signals 218 to synapse 222 that produces and communicates dendritic signal 224 to secondary single photon optoelectronic neurons 228. In an embodiment, with reference to FIG. 4, a select number of primary single photon optoelectronic neuron 210 provide axonic photonic signal 218 to synapse 222 that produces and communicates dendritic signals 224 to a select number of secondary single photon optoelectronic neurons 228. According to an embodiment, with reference to FIG. 5, a select number of primary single photon optoelectronic neuron 210 provides axonic photonic signal 218 to synapse 222 that produces and communicates dendritic signals 224 to a select number of secondary single photon optoelectronic neurons 228 that can be in communication with a select number of synapses 222, that in turn can be in communication with a select number of secondary single photon optoelectronic neurons 228 that in turn can be in communication with a select number of recipients 234. It should be appreciated that an ultimate secondary single photon optoelectronic neuron 228 is arranged immediately prior to axonic waveguide 232 and recipient 234 and preceded by synapse 222.

Figure 6:
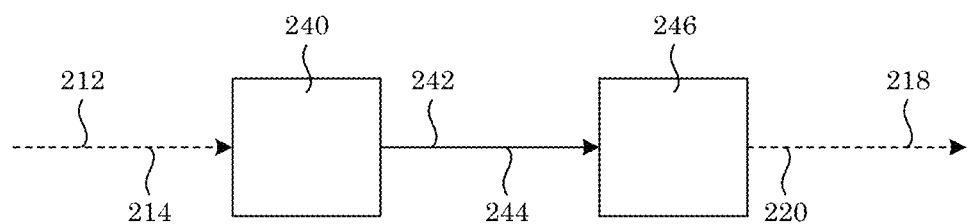
FIG. 6 shows a primary single photon optoelectronic neuron.

In an embodiment, with reference to FIG. 6, primary single photon optoelectronic neuron 210 includes transmitter 246 in communication with synapse 222; receiver 240 in communication with transmitter 246; and superconducting wire 244 that electrically interconnects receiver 240 and transmitter 246. Superconducting wire 244 communicates threshold signal 242 from receiver 240 to transmitter 246. Further, receiver 240 receives primary signal 212, and transmitter 246 produces axonic photonic signal 218.

Figure 7:
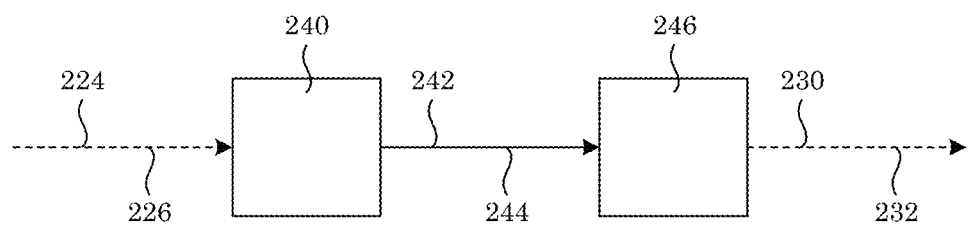
FIG. 7 shows a secondary single photon optoelectronic neuron.

In an embodiment, with reference to FIG. 7, secondary single photon optoelectronic neuron 228 includes receiver 240 in communication with synapse 222; transmitter 246 in communication with receiver 240; and superconducting wire 244 that electrically interconnects receiver 240 and transmitter 246. Superconducting wire 244 communicates threshold signal 242 from receiver 240 to transmitter 246. Further, receiver 240 receives dendritic signal 224, and transmitter 246 produces axonic photonic signal 230.

Figure 8:
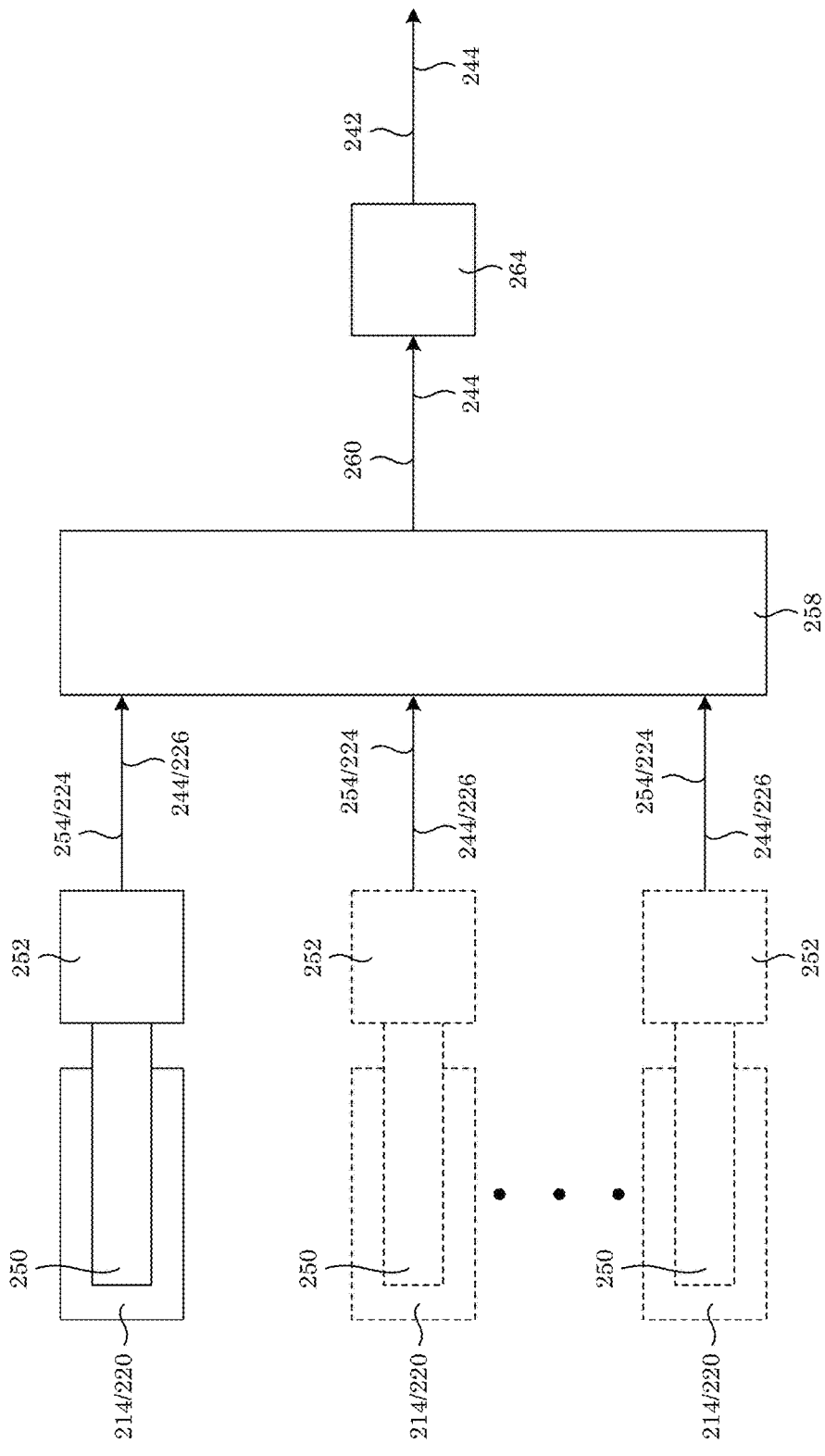
FIG. 8 shows an receiver.

In an embodiment, with reference to FIG. 8, receiver 240 includes a select number of superconducting photon detectors 250. For primary single photon optoelectronic neuron 210, superconducting photon detector 250 is disposed on primary input communication path 214. For secondary single photon optoelectronic neuron 228 superconducting photon detector 250 is disposed on dendritic communication path 226. Receiver 240 also includes superconducting transfer synapse 252 in communication with superconducting photon detector 250 and in electrical communication with integrator 258 superconducting wire 244, wherein superconducting wire 244 communicates synaptic signal 254 from superconducting transfer synapse 252 to integrator 258. Thresholding member 264 is in electrical communication with integrator 258 via superconducting wire 244 that communicates integrated signal 260 to thresholding member 264, wherein thresholding member 264 produces threshold signal 242 that is communicated by superconducting wire 244 to transmitter 246.

Figure 9:
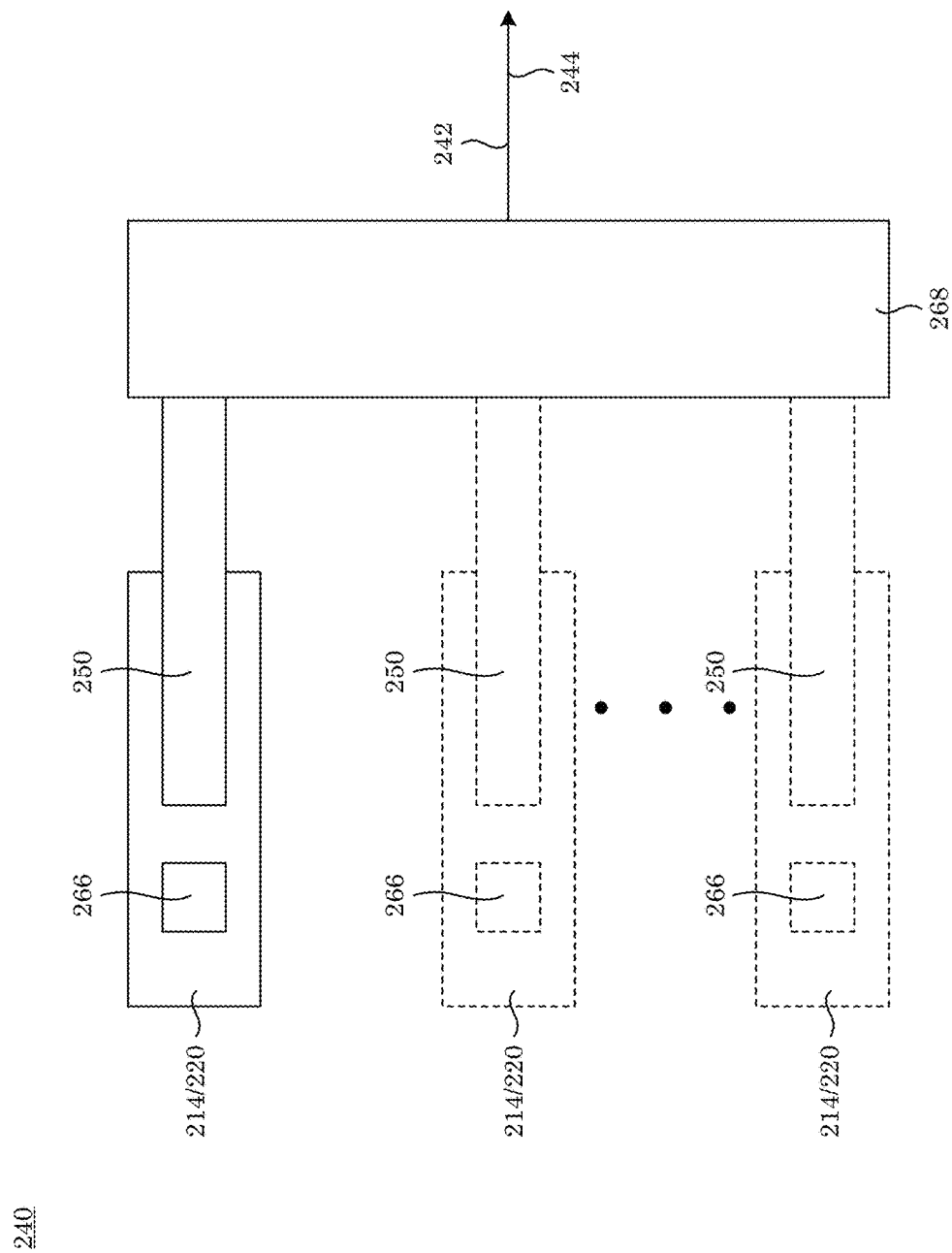
FIG. 9 shows an receiver.

According to an embodiment, with reference to FIG. 9, receiver 240 includes a select number of superconducting photon detectors 250 and photonic transfer synapses 266 in optical communication with superconducting photon detectors 250. For primary single photon optoelectronic neuron 210, superconducting photon detector 250 and photonic transfer synapse 266 are disposed on dendritic communication path 214. For secondary single photon optoelectronic neuron 228 superconducting photon detector 250 and photonic transfer synapse 266 are disposed on axonic waveguide 220. Superconducting photon detector 250 is in electrical communication with integrator 268 that produces threshold signal 242 that is communicated by superconducting wire 244 to transmitter 246.

Figure 10:
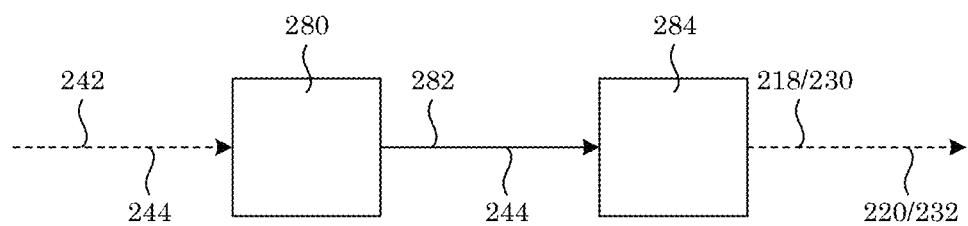
FIG. 10 shows an transmitter.

In an embodiment, with reference to FIG. 10, transmitter 246 includes superconducting voltage amplifier 280 in communication with integrator (258 or 268) of receiver 240; and photon emitter 284 in communication with superconducting voltage amplifier 280. Superconducting wire 244 communicates transmitter electrical signal 282 from superconducting voltage amplifier 280 to photon emitter 284, and photon emitter 284 produces axonic photonic signal (218 or 230, depending on whether transmitter 246 is disposed in primary single photon optoelectronic neuron 210 or secondary single photon optoelectronic neuron 228) that is communicated from transmitter 246 by axonic waveguide (220 or 232, depending on whether transmitter 246 is disposed in primary single photon optoelectronic neuron 210 or secondary single photon optoelectronic neuron 228).

In an embodiment, with reference to FIG. 11a, synapse 222 includes synaptic axon waveguide 270 in communication with axonic waveguide 220; and superconducting photon detector 250 in communication with synaptic axon waveguide 270. Here, superconducting photon detector 250 receives axonic photonic signal 218 from synaptic axon waveguide 270 and communicates photonic detection signal 251 from superconducting photon detector 250 via superconducting wire 244 to superconducting transfer synapse 252. Superconducting transfer synapse 252 communicates synaptic signal 254 via superconducting wire 244 to integrator 258.

In an embodiment, with reference to FIG. 11b, synapse 222 includes synaptic axon waveguide 270 in communication with axonic waveguide 220; and photonic transfer synapse 266 modifies axonic photonic signal 218 to produce post-synaptic photonic signal 267. Post-synaptic photonic signal 267 is in optical communication with superconducting photon detector 250 via synaptic dendrite waveguide 272. Superconducting photon detector 250 communicates synaptic signal 254 via superconducting wire 244 to integrator 268.

Figure 12:
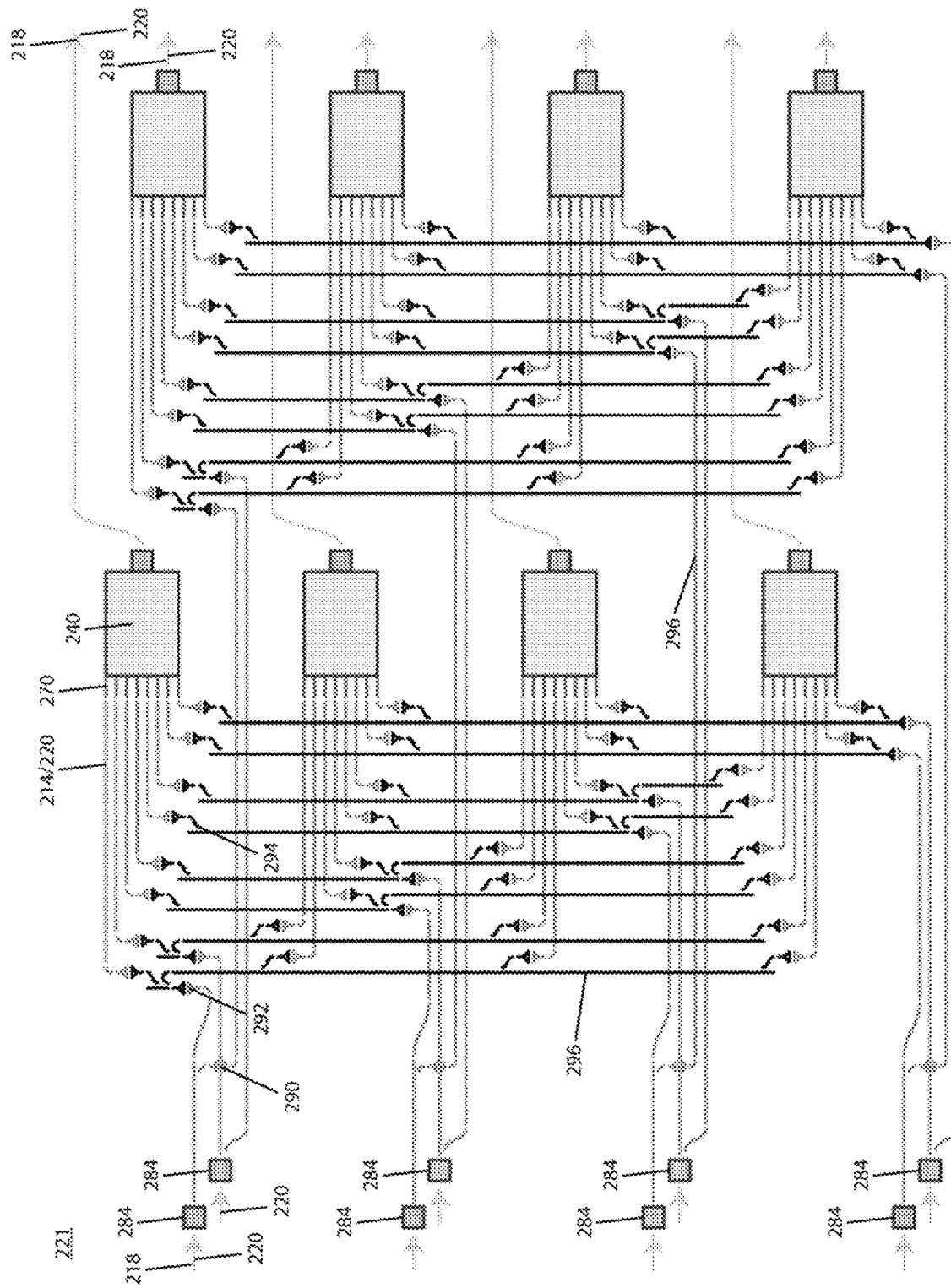
FIG. 12 shows a synapse.
Figure 13:
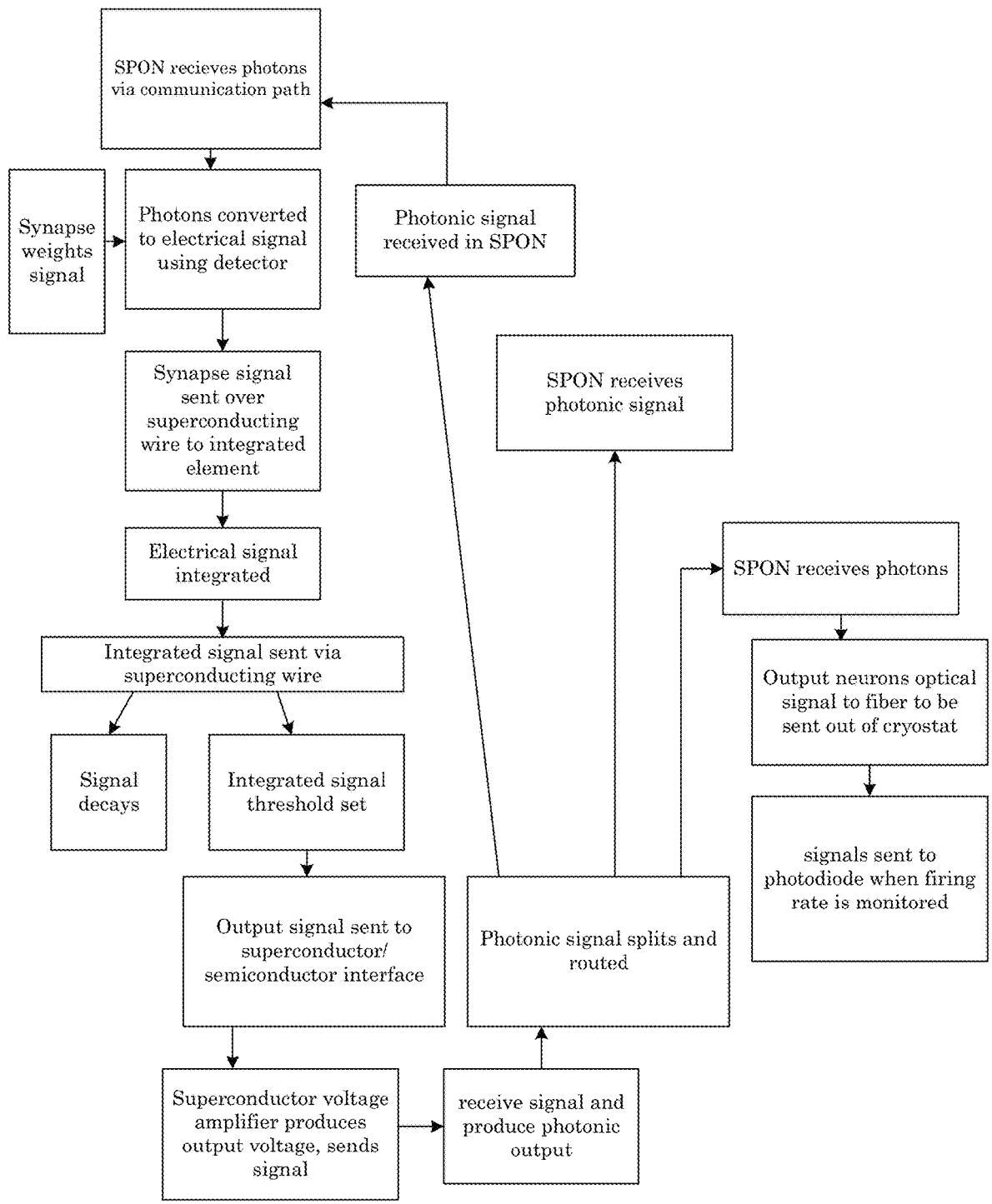
FIG. 13 shows steps in perform neuromimetic computing.

An exemplary axonal waveguide arbor 221 is shown in FIG. 12. Here, photon emitters 284 couple light into axonal arbor waveguides 296. These are routed through components including in-plane waveguide crossings 290, interplanar transitions 292, and photonic beam taps 294. The light couples from an axonic waveguide 220 to a synapse 222 and into a receiver 240.

It is contemplated that primary single photon optoelectronic neuron 210 can include axonic waveguides 220 and axonal waveguide arbors 221 to route photonic signals and 220 and 221 can be nanophotonic waveguides made of silicon, silicon nitride, or other materials with index of refraction larger than the containing material or vacuum. It is contemplated that primary single photon optoelectronic neuron 210 can include synapses 222 utilizing superconducting photon detectors 250 to convert optical signals to electrical signals, and these synapses may be superconducting-nanowire single-photon detectors made from materials such as WSi, NbN, NbTiN, MoSi, or other superconducting materials. The synapses 222 may also include optically absorptive materials. The synapses 222 may also include electronic circuit elements such as resistors, inductors, capacitors, and Josephson junctions. In particular, Josephson junctions may play the role of converting photons to fluxons which can then be stored in the integrator 258.

It is contemplated that primary single photon optoelectronic neuron 210 can include photon emitters 284 to produce light or to redirect light from an external light source. The photon emitters 284 could be light-emitting diodes, lasers, or optical modulators.

It is contemplated that primary single photon optoelectronic neuron 210 can include superconducting voltage amplifiers 280 to produce sufficient voltage to produce light from a semiconductor or redirect light from an external source. These voltage amplifiers 280 could be elements making use of the superconducting-to-normal phase transition by heating a wire above its critical temperature or by exceeding a wire's critical current density. These voltage amplifiers 280 could also be comprised of Josephson junction amplifiers such as Suzuki stacks.

It is contemplated that primary single photon optoelectronic neuron 210 can include an axonal waveguide arbor 221 which routes photonic signals from neurons 210 or 228 to other neurons 228. The axonal waveguide arbor 221 may contain multiple planes of waveguides. The axonal waveguide arbor 221 may contain components such as in-plane waveguide crossings 290, inter-planar transitions 292, photonic beam taps 294, and axonal arbor waveguides 296.

In neuromimetic circuit 200, primary signal 212 can include external light sources, external current sources, external voltage sources, or photonic or electrical signals generated on chip to activate primary single-photon optoelectronic neuron and can include a light or electrical source.

In neuromimetic circuit 200, primary input communication path 214 can include free-space optical communication, fiber optics, waveguides, on-chip waveguides, or electrical wires to produce an optical or electrical signal and can be any optical or electrical communication path.

In neuromimetic circuit 200, primary source 216 can include can include external light sources, external current sources, external voltage sources, or photonic or electrical signals generated on chip to activate primary single-photon optoelectronic neuron and can include a light or electrical source.

In neuromimetic circuit 200, axonic photonic signal 218 can include photonic signals or any nature at any frequency to communicate between primary single photon optoelectronic neuron 210 and any other secondary single photon optoelectronic neuron 228 and can be electromagnetic radiation.

In neuromimetic circuit 200, axonic waveguide 220 can include a propagation path in free space or a dielectric medium, a dielectric waveguide made of silicon, silicon nitride, or other dielectric, insulating, metallic, or superconducting waveguide material to communicate axonic photonic signal 218 and can be a material to guide electromagnetic radiation.

In neuromimetic circuit 200, synapse 222 can include photon detectors, photon absorbers, photon sources, resistors, inductors, capacitors, superconducting circuit elements, Josephson junctions, and the like to modify a photonic signal and can be superconducting photon detectors, superconducting wires, Josephson circuits, or like device.

In neuromimetic circuit 200, dendritic signal 224 can include optical or electrical signals to communicate from the synapse 222 to the neuron 228 and can be photons, currents, supercurrents, or voltages.

In neuromimetic circuit 200, dendritic communication path 226 can include waveguides, electrical wires, superconducting wires, or free space to carry dendritic signal 224 and can be waveguides, electrical wires, superconducting wires, or free space.

In neuromimetic circuit 200, secondary single photon optoelectronic neuron 228 can include superconducting photon detectors, waveguides, electrical components such as resistors, capacitors, inductors, superconducting circuit elements, Josephson junctions, electrical wires, light sources such as light-emitting diodes and lasers to integrate signals and produce an output and can be semiconductors, metals, superconductors, dielectrics, or insulators.

In neuromimetic circuit 200, axonic photonic signal 230 can include light and electrical signals to communicate between secondary single-photon optoelectronic neurons 228 and can be photons, electrical currents, or electrical voltages.

In neuromimetic circuit 200, axonic waveguide 232 can include a propagation path in free space or a dielectric medium, a dielectric waveguide made of silicon, silicon nitride, or other dielectric, insulating, metallic, or superconducting waveguide material to communicate photonic signal 230 and can be a propagation path in free space or a dielectric medium, a dielectric waveguide made of silicon, silicon nitride, or other dielectric, insulating, metallic, or superconducting waveguide material.

In neuromimetic circuit 200, recipient 234 can include photon detectors or electrical signal detectors to receive the signal output from a neuron 210 or 228 and can be a superconducting photon detector, a semiconducting photon detector, a superconducting circuit, a waveguide, a wire, or a secondary single photon optoelectronic neuron 228.

In neuromimetic circuit 200, receiver 240 can include superconducting photon detectors, waveguides, electrical components such as resistors, capacitors, inductors, superconducting circuit elements, Josephson junctions, electrical wires, light sources such as light-emitting diodes and lasers to receive axonic photonic signals 218 and can be superconducting photon detectors, waveguides, electrical components such as resistors, capacitors, inductors, superconducting circuit elements, Josephson junctions, electrical wires, light sources such as light-emitting diodes and lasers.

In neuromimetic circuit 200, threshold signal 242 can include photonic signals, electrical currents, electrical voltages to communicate that a threshold has been reached and can be photonic pulses, electrical current pulses, or electrical voltage pulses.

In neuromimetic circuit 200, superconducting wire 244 can include superconducting wires, films, and materials to transmit electrical signals and can be Nb, WSi, NbN, NbTiN, Al, or other superconducting materials.

In neuromimetic circuit 200, transmitter 246 can include semiconductor lasers, semiconductor light emitting diodes, other semiconductor light sources, modulators, or switches to produce or redirect light and can be semiconductor light-emitting diodes or semiconducting switches.

In neuromimetic circuit 200, superconducting photon detector 250 can include semiconducting or superconducting photon detectors to produce electrical signals due to the presence of photons and can be superconducting nanowire single photon detectors or semiconducting photodiodes operating in photovoltaic or photoconductive mode.

In neuromimetic circuit 200, superconducting transfer synapse 252 can include electrical circuits to convert a photonic signal to the electrical domain and can be resistors, inductors, capacitors, Josephson junctions, or other superconducting circuit elements.

In neuromimetic circuit 200, synaptic signal 254 can include an electronic signal to communicate the output of superconducting transfer synapse 252 to integrator 258 and can be a photonic or electrical signal.

In neuromimetic circuit 200, integrator 258 can include electrical components to integrate the electrical signals 254 and can be superconducting wires, capacitors, inductors, or superconducting loops.

In neuromimetic circuit 200, integrator 268 can include electrical components to integrate the electrical signals 258 and can be superconducting wires, capacitors, inductors, or superconducting loops.

In neuromimetic circuit 200, integrated signal 260 can include an electrical supercurrent to store the inputs 254 and can be a superconducting electrical device such as a superconducting loop or wire.

In neuromimetic circuit 200, thresholding member 264 can include superconducting devices to detect a current or voltage threshold corresponding to a number of received photons or photonic detection events and can be a Josephson junction, nTron, yTron, superconducting wire, constriction, capacitor, or thermal sensor.

In neuromimetic circuit 200, photonic transfer synapse 266 can include photonic absorbers, generators, or switches to modify the axonic photonic signal 230 and can be an electro-absorption modulator, phase change material, quantum well structure, graphene, semiconductor gain medium, mechanically tunable coupler, or electrooptic modulator or switch.

In neuromimetic circuit 200, synaptic axon waveguide 270 can include a propagation path in free space or a dielectric medium, a dielectric waveguide made of silicon, silicon nitride, or other dielectric, insulating, metallic, or superconducting waveguide material to communicate optical signals and can be a propagation path in free space or a dielectric medium, a dielectric waveguide made of silicon, silicon nitride, or other dielectric, insulating, metallic, or superconducting waveguide material.

In neuromimetic circuit 200, synaptic dendrite waveguide 272 can include a propagation path in free space or a dielectric medium, a dielectric waveguide made of silicon, silicon nitride, or other dielectric, insulating, metallic, or superconducting waveguide material to route light and can be a propagation path in free space or a dielectric medium, a dielectric waveguide made of silicon, silicon nitride, or other dielectric, insulating, metallic, or superconducting waveguide material.

In neuromimetic circuit 200, superconducting voltage amplifier 280 can include superconducting and semiconducting circuit elements to produce sufficient voltage to generate or route light and can be a Suzuki stack, an hTron, an nTron, a yTron, or other circuit elements.

In neuromimetic circuit 200, transmitter electrical signal 282 can include electrical voltage or current pulses to drive the photon emitter 284 and can be an electrical voltage or current pulse.

In neuromimetic circuit 200, photon emitter 284 can include semiconducting light emitters such as LEDs and lasers, optical modulators, switches, and microwave sources to produce electromagnetic radiation and can be any source of electromagnetic radiation.

In an embodiment, a process for making neuromimetic circuit 200 includes a wafer on which devices will be fabricated; lithography; deposition; etching; cleaning; and packaging. In an embodiment, a process for making neuromimetic circuit 200 includes producing photon emitter 284; disposing axonic waveguides 220 and axonal waveguide arbor 221 on photon emitter 284 on substrate; disposing superconducting photon detector 250 on axonic waveguides; stacking and interspersing waveguiding and superconducting device layers with cladding layers in between; disposing superconducting wiring layers for superconducting wires 244, integrator 258/268, thresholding member 264, and superconducting voltage amplifier 280 on or in between waveguide and superconducting photon detector layers; packaging of devices with electrical and/or photonic connectivity.

Producing photon emitter 284 includes creating a p-n or p-i-n junction in a semiconducting material such as Si, GaAs, InGaAs, or other material with similar properties. Creating junction includes implanting of dopants and annealing. Producing emitter includes making electrical contact with metals or superconductors.

Disposing axonic waveguides 220 and axonal waveguide arbor 221 includes depositing dielectric waveguide material and optional cladding material on wafer containing photon emitter 284. Depositing materials can be performed at a temperature from 20° C. to 400° C. using plasma-enhanced chemical vapor deposition or sputtering. Disposing axonic waveguides 220 can include etching a selected shape or pattern in the deposited materials. Etching can include patterning with photolithography or electron-beam lithography followed by pattern transfer via reactive ion etching.

Disposing superconducting photon detector 250 on axonic waveguides includes depositing superconducting material and can be performed at a temperature from 20° C. and 400° C. using sputtering. Disposing 250 can include etching specific shapes and patterns in the deposited materials. Etching can include patterning with photolithography or electron-beam lithography followed by pattern transfer via reactive ion etching. Disposing axonic waveguides 220 and superconducting photon detectors 250 can be repeated multiple times, achieving multiple layers of waveguides and detectors, optionally with cladding layers in between. Planarizing between layers using chemical mechanical polishing can be performed.

Disposing superconducting wiring layers for superconducting wires 244, integrator 258/268, thresholding member 264, and superconducting voltage amplifier 280 on or in between waveguide and superconducting photon detector layers can include deposition of wire materials using sputtering or electron-beam evaporation. Patterning will utilize lift-off or etching lithographic techniques.

Packaging of devices with electrical or photonic connectivity can include mounting chips in packages with electrical or photonic connectivity. Making electrical or photonic connections to the devices on the chip can be performed.

Neuromimetic circuit 200 has numerous beneficial uses, including performing neuromimetic computing. According to an embodiment, a process for performing neuromimetic computing includes: receiving primary signal 212 by primary single photon optoelectronic neuron 210; producing axonic photonic signal 218 by primary single photon optoelectronic neuron 210; communicating axonic photonic signal 218 to synapse 222; receiving axonic photonic signal 218 by synapse 222; producing dendritic signal 224 in response to receipt of axonic photonic signal 218; communicating dendritic signal 224 from synapse 222 to secondary single photon optoelectronic neuron 228; receiving dendritic signal 224 by secondary single photon optoelectronic neuron 228; producing axonic photonic signal 230 in response to receipt of dendritic signal 224 to perform neuromimetic computing.

The process for performing neuromimetic computing further can include producing, by receiver 240, threshold signal 242 in response to receipt of primary signal 212.

In the process for performing neuromimetic computing, producing, by receiver 240, threshold signal 242 can include detecting, by superconducting photon detector 250, a photon; producing synaptic signal 254 based on detection of the photon; integrating synaptic signal 254 to produce integrated signal 260; and producing threshold signal 242 based on integrated signal 260.

In the process for performing neuromimetic computing, producing, by receiver 240, threshold signal 242 can include detecting, by photonic transfer synapse 266, primary signal 212; producing a photon in response to detection of primary signal 212; detecting, by superconducting photon detector 250, the photon; producing a signal based on detecting the photon; and producing threshold signal 242 based on the signal from superconducting photon detector 250.

The process for performing neuromimetic computing further can include receiving, by transmitter 246, threshold signal 242; and producing axonic photonic signal 218 in response to receipt of threshold signal 242.

The process for performing neuromimetic computing further can include amplifying, by transmitter 246, threshold signal 242; producing transmitter electrical signal 282 from threshold signal 242; and emitting axonic photonic signal 218 based on production of transmitter electrical signal 282.

In the process for performing neuromimetic computing, producing dendritic signal 224 in response to receipt of axonic photonic signal 218 can include receiving, by synaptic axon waveguide 270, axonic photonic signal 218; communicating axonic photonic signal 218 from synaptic axon waveguide 270 to synaptic dendrite waveguide 272; and producing dendritic signal 224 in response to receipt of axonic photonic signal 218 by synaptic dendrite waveguide 272.

The articles and processes herein are illustrated further by the following Examples, which are non-limiting.

EXAMPLES

Example 1. Superconducting Optoelectronic Circuits for Neuromorphic Computing

Neural networks have proven effective for solving many difficult computational problems, yet implementing complex neural networks in software is computationally expensive. To explore the limits of information processing, it is necessary to implement new hardware platforms with large numbers of neurons, each with a large number of connections to other neurons. Here, a hybrid semiconductor-superconductor hardware platform for the implementation of neural networks and large-scale neuromorphic computing is described. The platform combines semiconducting few-photon light-emitting diodes with superconducting-nanowire single-photon detectors to behave as spiking neurons. These processing units are connected via a network of optical waveguides, and variable weights of connection can be implemented using several approaches. The use of light as a signaling mechanism overcomes fanout and parasitic constraints on electrical signals while simultaneously introducing physical degrees of freedom which can be employed for computation. The use of supercurrents achieves the low power density (1 mW/cm$^2$ at 20-MHz firing rate) necessary to scale to systems with enormous entropy. Estimates comparing the proposed hardware platform to a human brain show that with the same number of neurons (1011) and 700 independent connections per neuron, the hardware presented here may achieve an order of magnitude improvement in synaptic events per second per watt.

Figure 14:
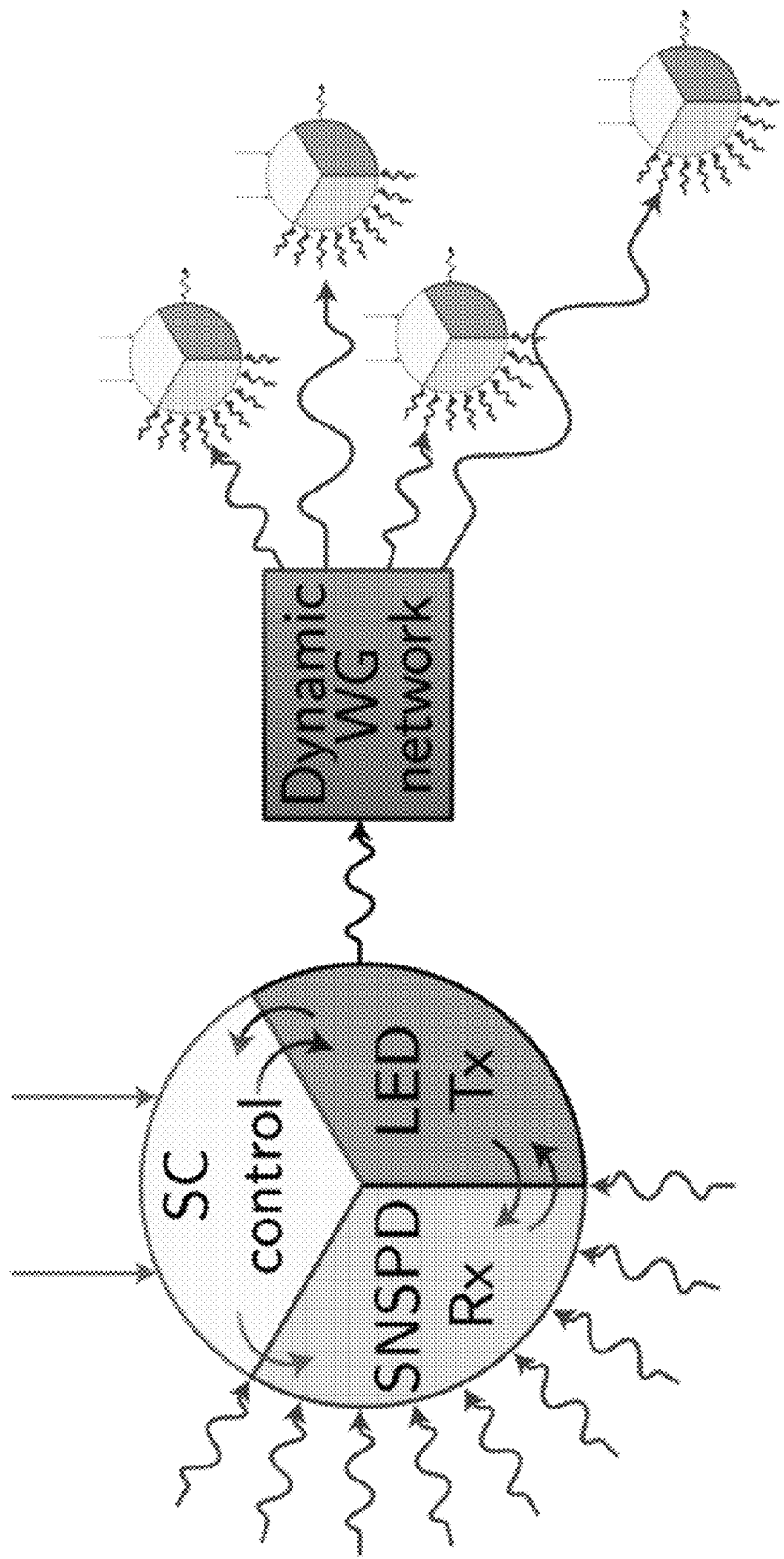
FIG. 14 shows a neuromimetic circuit.

Photons, based on their noninteracting bosonic nature, provide advantages over electrons for achieving spike-based communication over networks with a large number of connections between nodes. That is to say, photonic fanout overcomes limitations of electronic fanout. Superconducting circuits provide lower power densities than semiconducting circuits for systems with a larger number of processing units and greater total complexity. In a hardware platform, integrating photonic with superconducting devices includes a highly scaled, multiphysical system for computing complexity and experiments in information physics. A representation of such a device is shown in FIG. 14.

The optoelectronic hardware platform is based on waveguide-integrated semiconductor light emitters working with superconducting detectors and electronics to implement weighted, directed networks. Optical signals between neurons are communicated through reconfigurable nanophotonic waveguides. Utilization of light-emitting semiconductors allows efficient access to photonic degrees of freedom (frequency, polarization, mode index, intensity, statistics, and coherence), which achieve complex functionality analogous to chemical signaling in biological organisms and possibly with information-processing capabilities far beyond. Light enables massive interconnectivity with no need for time-multiplexing schemes that can limit the event rates of complementary metal-oxide-semiconductor (CMOS) systems. Photonic signals are received and integrated by superconducting single-photon detectors. Firing thresholds and gain are controlled by a dynamic superconducting network, and neuron-generated photonic signals can reconfigure this current-distribution network. By employing superconducting electronics, we can approach zero static power dissipation, extraordinary device efficiencies, and utilize Josephson-junction circuits including single-flux-quantum devices.

Within this hardware platform, memory can be implemented via several means. These include temporally fixed synapses achieved with branching waveguides, synaptic weight variation via the actuation of locally suspended waveguides or through the use of magnetic Josephson junctions, or other magnetic and flux-storage components. The suspended waveguides that we explore in more detail in this work are reconfigurable on a time scale of 1 µs. None of these approaches draw power in the steady state.

The combination of efficient faint-light sources and superconducting-nanowire single-photon detectors interacting in an integrated-photonics environment enables neuronal operation with excellent energy efficiency, enormous intra- and inter-chip communication bandwidth, light-speed-limited latency, compact footprint, and relatively simple fabrication. The optoelectronic hardware platform is predicted to achieve 20 aJ/synapse event. By comparison, many CMOS systems are on the order of 20 pJ/synapse event, or in more recent work, hundreds of femtojoules per synapse event. For these reasons, the proposed platform appears promising for advanced neuromorphic computing at the highest level of performance, while the compact nature and room-temperature operation of CMOS circuits will inevitably remain better suited for a wide range of neuromorphic applications.

Information in neural systems is often referred to as "spike encoded," as interconnected neurons transmit information to one another in pulses. An individual neuron (also referred to as a "processing unit," or simply, "unit") receives pulses from a number of upstream neurons. The neuron's input-output relation will be nonlinear, and if the integrated upstream signals exceed a certain threshold, the neuron may itself fire a pulse to its downstream connections. Superconducting optoelectronic circuits emulate several biological neural responses. These circuits use integrated light-emitting diodes (LEDs) as transmitters with optical detectors as receivers. Detectors and LEDs are included in this platform, and energy per firing event is calculated.

With regard to detector, a neuron that uses photonic signals requires both a source of photons and a photon detector. The choice of detector involves design and analysis consideration of the hardware platform. The hardware platform achieves massive scaling to large numbers of interacting neurons. Therefore, simple waveguide integration, extreme energy efficiency, high yield, and small size are concerns. Superconductors detectors provide single-photon detection in the infrared with zero static power dissipation and single-photon sensitivity to provide operation at the shot-noise limit. Because a system based on superconducting detectors provides operation in this limit, it offers a useful platform to test noise in learning and evolution of complex, dynamical systems.

There is an additional energy cost associated with cooling superconducting detectors to cryogenic temperatures for operation. Therefore, an alternative is to move away from low-light levels and use integrated detectors such as Si, Si defect, Ge-on-Si, or III-V detectors, either bonded to Si or on a fully III-V platform. Such detectors have low signal-to-noise ratio requiring operation with significantly higher optical powers than if superconducting detectors are employed. We choose superconducting-nanowire single-photon detectors (SNSPDs) due to the high efficiencies (>90%) at wavelengths below the Si band gap, simple on-chip waveguide integration, compact size, and speed. While operation at cryogenic temperatures imparts a fixed energy cost, the energy cost per operation is significantly decreased by allowing integration with superconducting electronics. Therefore, cryogenic systems are of use in a subset of neuromorphic applications where the required system size is sufficiently large that the savings in chip power outweigh the cryocooling cost. Additionally, low-temperature operation allows the use of certain LED designs that are not possible at room temperature.

With regard to an integrate-and-fire circuit, to encode information, the nodes of a neural network must have a nonlinear input-output relationship. In the system, that nonlinearity is achieved via the transition of wires from the superconducting phase to the normal-metal phase. These phase transitions can be induced by absorption of a photon or by exceeding the critical current. A single SNSPD can be designed to fire with close to unity efficiency upon absorbing a single photon. We can think of this as an integrate-and-fire neuron in the limit of a single-photon threshold. In order to obtain an integrate-and-fire response with a threshold photon number larger than one, SNSPDs can be configured in parallel (step response) or series (continuous response). In FIG. 15a, we show a circuit diagram of the parallel SNSPD array referred to as a parallel nanowire detector (PND). One example of an integrate-and-fire circuit is accomplished by placing the PND in parallel with a LED. The thresholding mechanism is explained pictorially in FIG. 15(b)-(e). In the steady state, the PND is superconducting and has zero resistance. The semiconducting LED has finite resistance, and, therefore, all current from the source Ib flows through the PND. When a sufficient number of nanowires in the PND has been driven to the normal state by the absorption of photons, the critical current of the array is exceeded, the array becomes resistive, and current is diverted to the LED. This diversion of current and the subsequent production of light via carrier recombination constitutes the firing event. The LED fires with a step response, meaning that the LED output is independent of the exact number of photons absorbed and depends only on whether or not the threshold is exceeded. The diversion of current to the LED allows the PND to return to the superconducting state. Once this occurs, current ceases to flow through the LED, the production of light stops, and the device is reset.

The minimum duration of a spike event is determined by the emitter lifetime. The integration time of the neuron can be engineered to be within the range of a few hundred picoseconds up to seconds.

Figure 16:
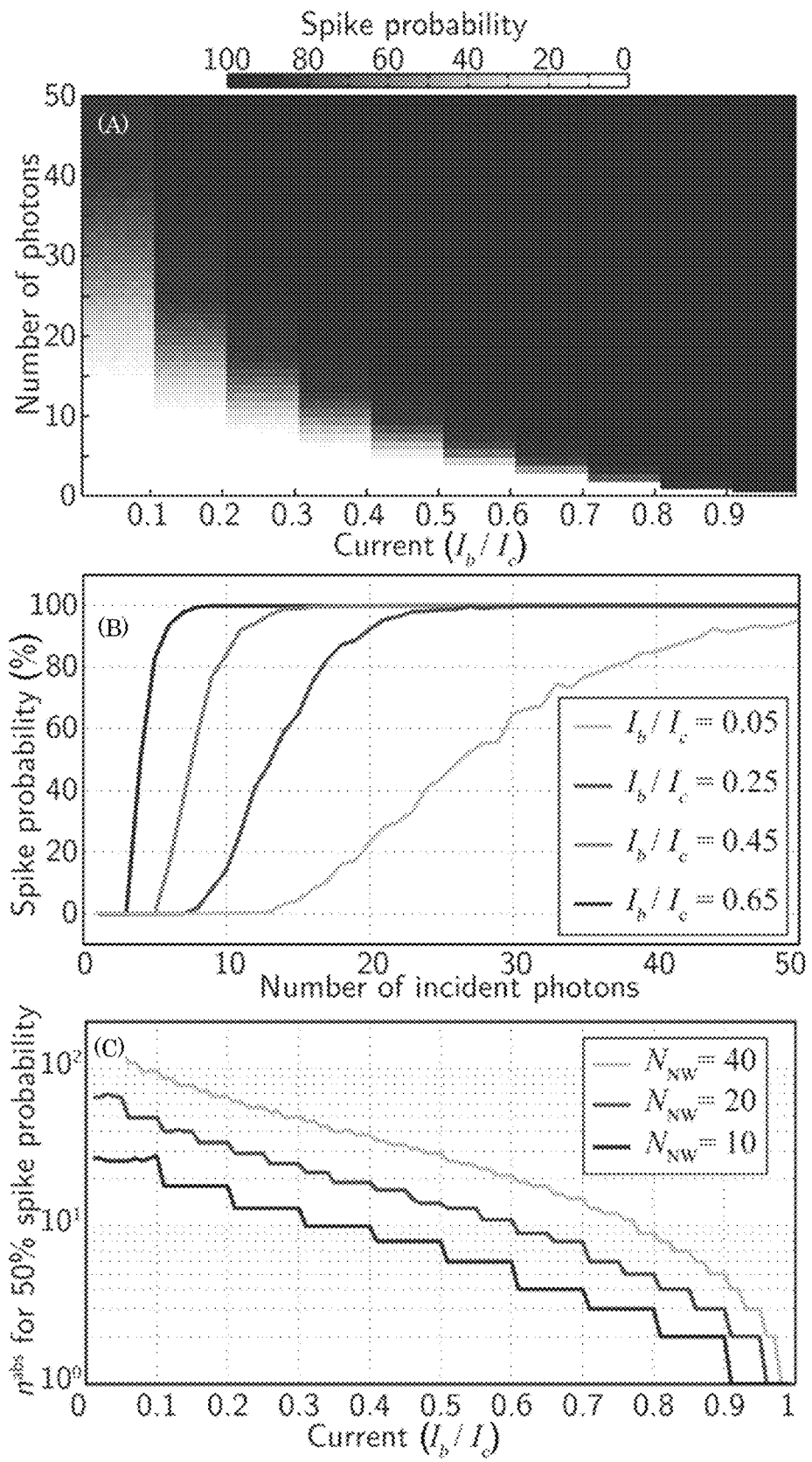
FIG. 16 shows a Monte Carlo simulation of spike probability. (a) PND with ten SNSPDs. (b) The same simulation as (a) but with four traces isolated for clarity. (c) The number of absorbed photons which gives a 50% absorption probability plotted as a function of bias current. Traces for PNDs with 10, 20, and 40 nanowires are shown.

To model the spike probability of this circuit, we conduct Monte Carlo simulations of the device. The critical number of absorbed photons nc is given by $$nc = NNW - Ib ic, \qquad (1)$$

where NNW is the number of nanowires in the array, Ib is the bias current for the entire array, and ic is the critical current of a single wire. Although each individual firing event generates the same current pulse across the LED (i.e., a step response), a given number of input photons causes only the neuron to fire with some probability. This is due to the stochastic nature of the photon-absorption events. The results of these simulations are shown in FIG. 16. The probability of a spike occurring is plotted as a function of the number of photons incident on the device for various bias currents ranging from 0.01 of the array critical current (Ic) to 0.99 Ic in steps of 0.01 Ic. In FIG. 16a, we show the behavior of an array with ten SNSPDs in parallel. FIG. 16b shows the spike probability versus the number of incident photons for four values of bias current; these data are a subset of that shown in FIG. 16a, plotted separately to illustrate the shape of the traces. The Monte Carlo simulations which produce these plots are conceptually based on the neuron design of FIG. 17 and proceed as follows. A given number of photons is assumed to be incident on a PND array. The pulse is assumed to pass each nanowire of the array in sequence. At each pass, a random number between zero and one is generated. If this random number is less than or equal to the assumed absorption probability (1% in these calculations), the number of photons in the pulse is reduced by one, and the state of that nanowire is set to non-superconducting. The photon pulse is allowed to pass each nanowire of the array 100 times. The number of photons in the pulse which cause Eq. (1) to be satisfied is recorded for each bias current. The result of 1000 such simulations is averaged to calculate the probability for spiking to occur.

In FIG. 16a and FIG. 16b, we observe that by adjusting the bias current, we can adjust the shape of the firing function versus photon number. Yet, adjusting the bias current cannot tune the threshold with arbitrary accuracy. In FIG. 16a, it is evident that the spike probability for a PND array with ten nanowires separates into ten bands. Therefore, to achieve higher-photon-number differentiation, more wires must be integrated. This point is illustrated in FIG. 16c. Simulations similar to that of FIG. 16a are conducted for PND arrays with 20 and 40 nanowires, and the number of absorbed photons (nabs) for which the spike probability reaches 50% is plotted versus the bias current. This figure further illustrates that the resolution of the PND array is limited by the number of nanowires in the array, resulting in discrete steps in the number of photons required for a spike event as a function of bias current. Because nc and NNW in Eq. (1) are both integers, the floor of the ratio Ib/ic is effectively taken, and the utility of the current for setting the threshold is discretized. For the case of NNW=40, the steps become quite small, and the curve is approximately continuous.

The simple model of FIG. 16 reveals that the PND array can achieve a high dynamic range in that the threshold can be tuned broadly in hardware by changing the number of wires in the array (from a single nanowire up to potentially thousands) as well as actively during operation by changing the bias current. The state space of the receiver, which scales as 2NNW, can be made quite large in the regime where thousands of nanowires comprise the PND.

Figure 17:
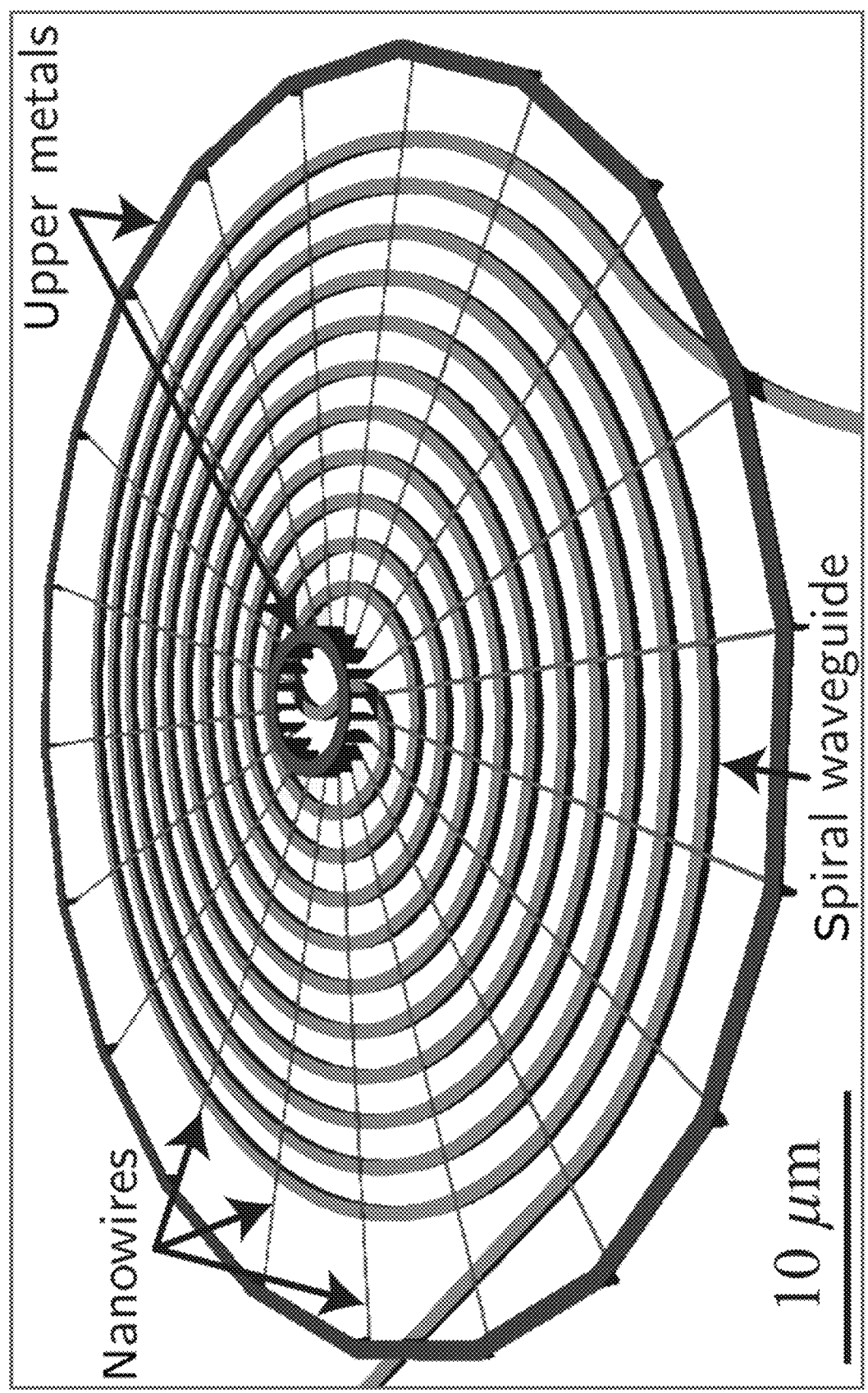
FIG. 17 shows a spider web neuron.

FIG. 17 presents a neuron design well suited to a system with a few tens and possibly hundreds of connections. We refer to this device as the spider web neuron. In this design, all upstream signals are combined on a single waveguide. This waveguide enters a spiral region in which it passes a number of SNSPDs which can be wired in series or parallel. Photon wave packets can pass several tens of SNSPDs several tens of times. The system can, thus, be engineered to spread the absorption probability evenly over the SNSPDs. In FIG. 16, the photons are assumed to pass each nanowire 100 times with a probability of absorption of 1% at each pass. The size of the detector portion of this neuron can be made as small as 10×10 µm² and depends on the thresholding number of photons. For a threshold of 1000 photons, the device is approximately 35×35 µm². In the calculations of FIG. 16, all photons arrive in a short pulse, so nanowire re-biasing dynamics can be neglected. The complex dynamics of the PND receiver array in the case of arbitrary photon-arrival times is the subject of future investigation.

Figure 18:
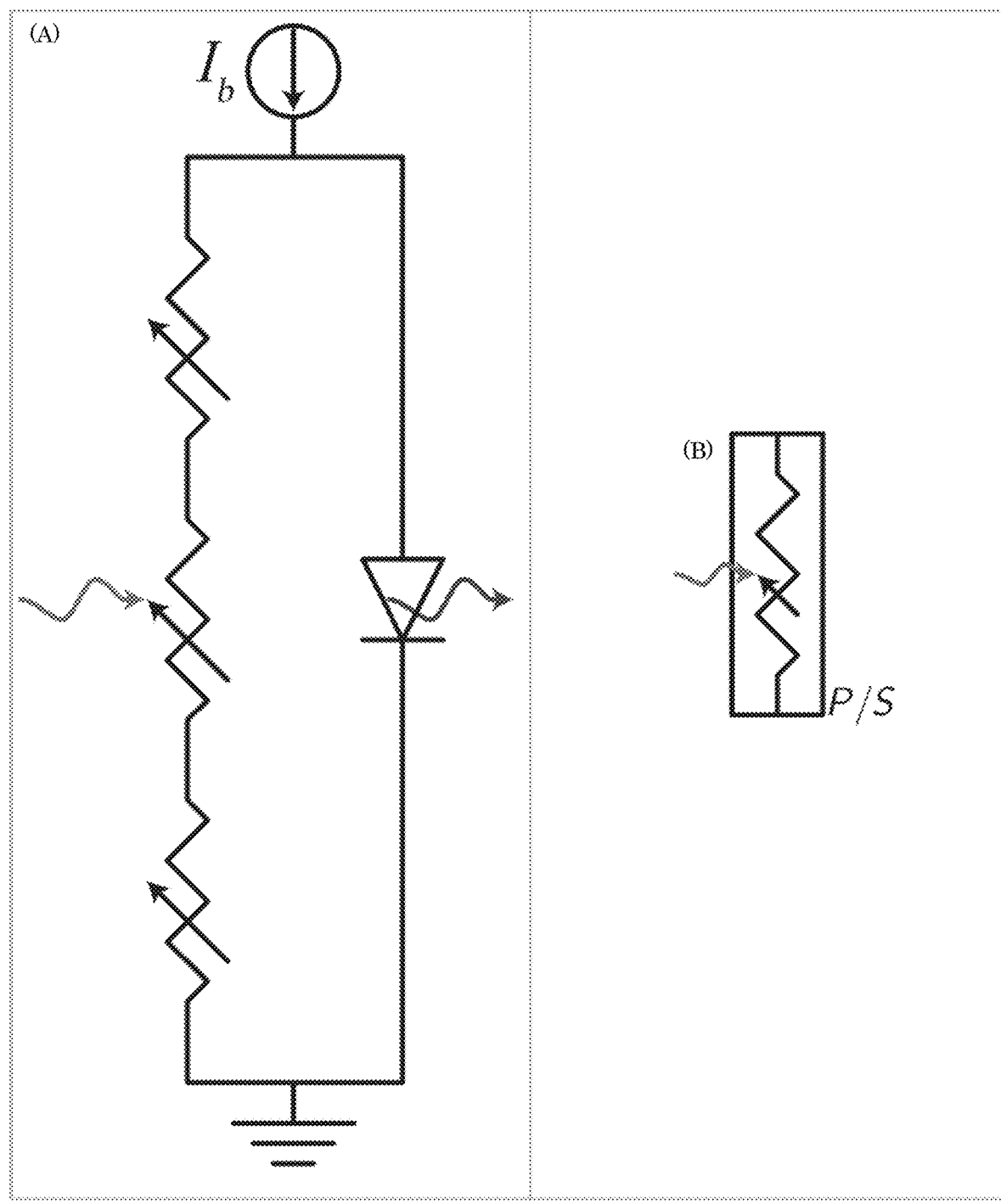
FIG. 18 shows (a) an SND circuit. (b) Component diagram indicating either SND or PND array.

With regard to a differentiable response circuit, in biological systems, the neuron response is not that of a step function but rather a nonlinear response taking the form of a sigmoid. For certain neural-network back-propagation algorithms, the response is continuous and differentiable. FIG. 18a shows the series-nanowire-detector (SND) circuit that achieves a continuous and differentiable nonlinear response. In FIG. 18b, we define a general optoelectronic circuit element symbolizing either the PND (FIG. 15) or the SND (FIG. 18). We envision the SND as a single length of superconducting wire with incident photons spread along the length of the wire. As in FIG. 15a, the detector array is in parallel with the LED. When a single photon is absorbed by the SND, a length of normal wire called a hot spot emerges in series with the superconductor, leading to current redistribution between the two branches of the circuit. For common SNSPD materials, this resistance is approximately 1 kΩ for the typical wire width, while the length of the single hot spot is on the order of 100 nm. As more photons are absorbed, more hot spots are created, and the resistance of the SNSPD increases. This resistance causes the voltage across the LED to increase, and sufficient current can be driven through the diode to produce an optical signal.

We use this circuit in a very different operating regime to detect a single photon with near-unity efficiency, wherein an SNSPD is driven close to its critical current, and the ensuing voltage pulse is measured across a 50-Ω resistor in parallel with the SNSPD. When a photon is absorbed, a 1-kΩ hot spot is produced, and nearly all current is diverted to the 50-Ω load. For the application at hand, the device is not intended to observe events of one or a few photons but rather hundreds to thousands. Thus, diverting the current through a high-impedance diode with I-V relationship approximated by Eq. (D1) enables thresholding with some dynamic range for higher numbers of absorbed photons. The model of this SND-based neuron considers simple joule heating behavior in that each photon-absorption event results in the same hot-spot resistance, when in reality, the hotspot resistance depends on the current through that branch of the circuit, which depends on the temporal dynamics of the preceding absorption events. A thorough study of these dynamics is the subject of future work.

Figure 19:
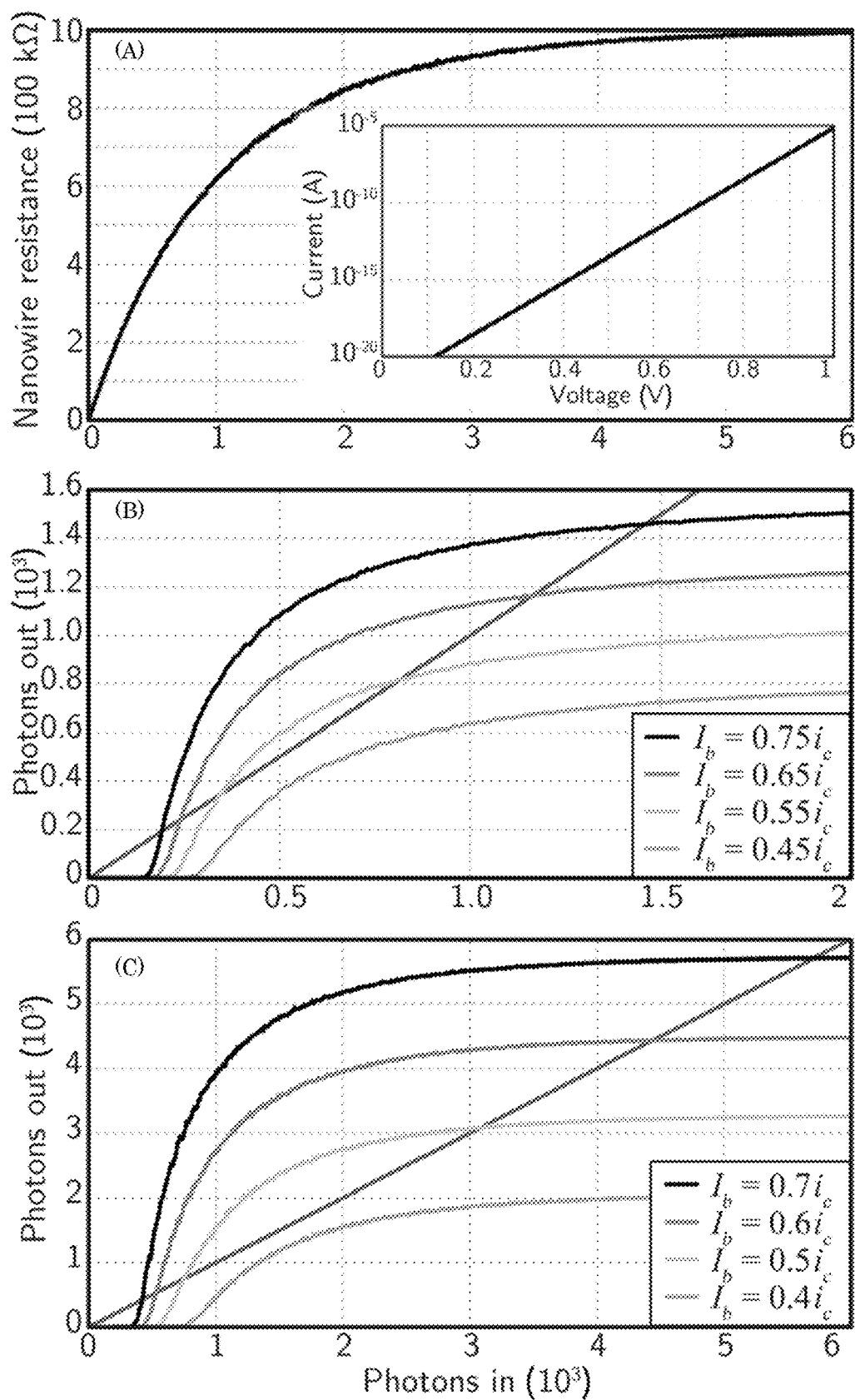
FIG. 19 shows electrical characteristics for SND with lwire=100 µm. (a) Resistance versus number of photons for the SND. Inset shows the exponential current-voltage curve for the LED. Photons out versus photons in for SNDs with (b) ic=4 µA, $\eta$=1% and (c) ic=8 µA, $\eta$=0.1%. Here, $\eta$ is the efficiency of the LED.

The electro-optic performance of the SND is analyzed in FIG. 19. The nanowire resistance as a function of the number of absorbed photons is shown in FIG. 19a. In this model, we assume the photons are incident upon a length of out-and-back nanowire with 100-µm attenuation length, and it is assumed that two photons absorbed at the same location along the nanowire give rise to the same resistance as a single photon absorbed at that location. For this reason, the nanowire resistance levels off as a function of the number of absorbed photons. The current-voltage relationship of the LED is highly nonlinear, as shown in the inset, but above a certain number of absorbed photons, the entire length of the absorbing region of the superconductor is driven normal, and the absorption of additional photons results in no additional resistance, as shown in FIG. 19b and FIG. 19c. Hence, the device has an input-output relationship with an exponential turn-on when a threshold number of photons is absorbed followed by a flattening of the output when the entire SND is driven normal. Figures FIG. 19c and FIG. 19c show the photon input-output relationship for two different nanowire designs with critical currents of 4 and 8 µA, respectively, demonstrating the ability to tune the response in hardware. Note that the photon input-output relationship depends on the refractory period.

Based on the analysis of FIG. 19, in the SND-based neuron, the normal-state resistance of the SND and the applied bias determine the maximum voltage that can be achieved across the LED. This resistance and bias, in conjunction with the optoelectronic design of the LED, determines the number of photons generated, in contrast to the case of the PND where the number of photons generated is a step response determined by the bias current.

Both the PND-based integrate-and-fire circuit of FIG. 15a and (the SND-based continuous-response circuit of FIG. 18a may offer utility for neuromorphic computing. For the case of the PND, the number of nanowires in the array is on the order of the number of photons required for threshold. This is also the order of the number of connections each processing unit makes to other units. Biological systems reveal that scaling to systems with thousands of connections per neuron is desirable. To achieve this number of parallel receiver elements, several geometrical configurations can be utilized to arrange approximately 1000 micron-scale SNSPD elements, and the exploration of this design space is the subject of future work.

The SND device lends itself to hundreds or thousands of connections. In this case, we can expect the thresholding number of photons to be approximately 1000, and, therefore, we select a nanowire with the length of 1000 hot spots. Given the hot-spot length of 100 nm, the entire length of the nanowire is on the order of 100 µm, as simulated in FIG. 19. Such a length becomes compact when coiled in a spiral [see FIG. 24b], and this configuration is well suited to receive inputs from hundreds to thousands of waveguides.

With regard to an nTron current amplifier, introducing an amplifier into the circuits decouples firing threshold and LED gain. In a superconducting circuit, amplification can be achieved using the nTron, a three-terminal supercurrent amplifier. When the current in the gate terminal exceeds the critical current, the path from the source to drain is driven normal, diverting the bias current to the parallel load. This recently developed device has been used to drive loads of tens of kilohms, making it suitable for this application.

Figure 20:
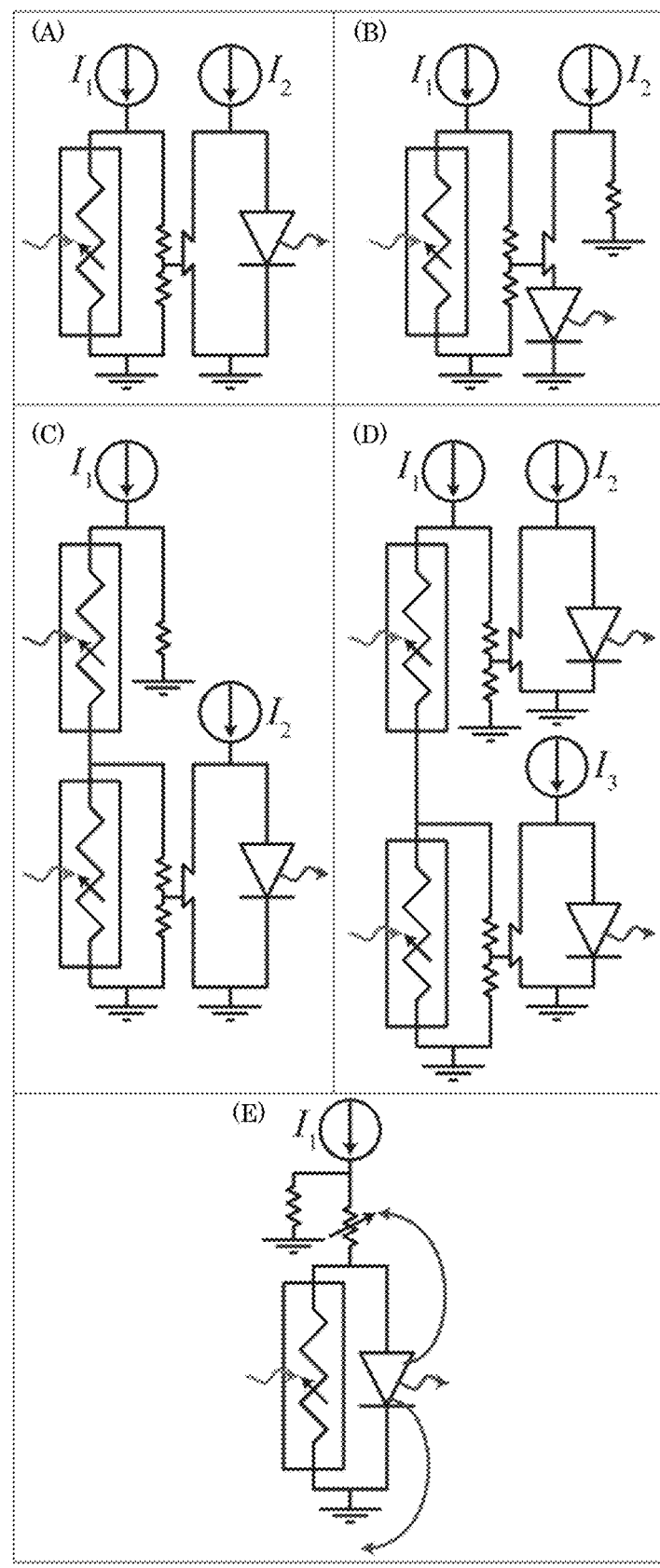
FIG. 20 shows neuromorphic circuit configurations. (a) PND with nTron amplifier. (b) Integrate-and-stop firing. (c) Neuron with the possibility for both excitatory and inhibitory excitation. Green corresponds to photons inhibiting firing and red to photons exciting firing. These photons can have different colors. (d) Firing of the upper neuron inhibits firing of the lower neuron. (e) Circuit for achieving self- and upstream feedback.

In FIG. 20a, we show a variation of the circuit of FIG. 15a, but instead of driving the same current I1 through the LED after firing, this circuit utilizes a nTron current amplifier to provide gain to the light emitter. The nTron allows us to decouple the current used to bias the receiver from the number of photons produced in the firing event. Note that in this configuration, I2 can be less than I1, making it possible to cover a broad range of input-output responses. The circuit of FIG. 20a also expands the state space in which information can be encoded.

With regard to other neuromorphic circuits, we introduce several variants on those cells which enable diverse functionality desirable for neuromorphic computing. FIG. 20b shows an alternate configuration in which the LED is driven by current I2 until a firing event occurs and cuts off the current supply. This circuit is shown with the LED below the nTron, but it can also be implemented without a nTron. This circuit is an example of an integrate-and-stop-firing neuron which can be useful in neuromorphic architectures to provide a means of stimulating various regions of the cortex until a certain level of activity is reached, at which point the firing neuron is quenched.

Another functionality of neuromorphic circuits is that of inhibitory connections. Most neuronal connections provide feedforward excitation wherein an action potential produced by upstream neurons increases the probability of action potentials being produced by downstream neurons. But biological systems also exhibit connections wherein the firing of upstream neurons suppresses the probability of firing events by downstream neurons. FIG. 20c shows a configuration which achieves this. The lower portion of the circuit is identical to that of FIG. 20a, but the current I1 feeding the receiver first passes through a preliminary nanowire array. Absorption of photons in this region of the circuit reduces the current through the primary receiver, increasing the threshold photon number. Waveguides from different upstream neurons can be routed to these two different ports to establish inhibitory or excitatory connections. In FIG. 20c, the inputs to the two receivers are drawn with different colors, emphasizing the possibility that integrated-photonic filters placed before the neuron can be employed to route different frequencies to the two receivers. With this approach, we can employ the use of color to perform inhibitory or excitatory functionality in much the same way that different neurotransmitters perform inhibitory or excitatory functions in biological systems. We note that low-loss spectral filters performing this function are commonplace in many integrated-photonic applications.

From an architectural standpoint, it may also be useful to establish purely electrical inhibitory connections. In FIG. 20d, we show a circuit in which two neurons, each with only a single excitatory port, are connected in series. In this configuration, firing events in the upper neuron inhibit firing events in the lower neuron. Such a configuration is useful for moderating the net filing activity of groups of neurons.

It is also advantageous to have a means by which a single neuron can moderate its own firing activity. Such behavior is straightforward to implement, as is shown in FIG. 20e. A power tap is added to the output of the LED, and some fraction of the produced light is incident upon a receiver in series with the current supply to the receiver array. The superconducting wire in this location may be wider than the integrating receiver, and it, therefore, may be designed to quench the current only when a large number of photons drives the superconducting wire normal.

In addition to self-feedback, biological neurons send both downstream signals as well as upstream signals when an action potential fires. The upstream signals are believed to be critical for spike-timing-dependent plasticity and synchronization of circuit behavior via threshold modification. To briefly hint at how self-feedback may be implemented in the proposed platform, the green arrow leaving the LED in FIG. 20e indicates that a power tap can also be used for upstream feedback. The color of this arrow is meant to remind us that it may be advantageous to use different frequencies of light for downstream and upstream signaling. A LED can be fabricated to emit at two distinct wavelengths or across some region of bandwidth, and integrated spectral filters can be employed to route the two signals. Alternatively, two different LEDs coupled to two different waveguides can be utilized.

We describe several superconducting optoelectronic neuromorphic circuits covering a wide range of functions. We refer to members of this class of circuits as single-photon optoelectronic neurons (SPONs). We now proceed to discuss additional aspects of their performance.

With regard to energy consumption, SPON circuits are included in the neuromorphic computing platform, and we estimate the energy required for a firing event. A neuron firing event includes supplying current to the inductors associated with superconducting wires (including the detectors), charging the capacitor associated with the LED p-i-n junction, and driving current through the LED to produce light. For the case of the PND circuit of FIG. 20a, we analyze the energy consumption of each of these three contributions.

In this model, we assume one inductor LSNSPD in the PND array for each photon, as well as a series inductance to achieve the desired temporal response. We assume each element of the PND is 500 squares, while the entire receiver array is in series with 5000 squares of inductance. At low photon numbers, the energy consumption from inductance is dominated by the series inductance, but for higher numbers, it is dominated by the PND array and grows linearly. The energy required for photon production is calculated simply as $E_g n_v/\eta$, where $E_g$ is the band gap of Si, $n_v$ is the number of photons created, and $\eta$ is the efficiency. Thus, within this model, the contribution to energy consumption due to photon creation is linear throughout. We use $E_g$ in this model because it is an upper bound on the photon energy. Any photon transmitted through a Si waveguide will have energy below the band gap. We assume a superconducting material with a sheet inductance of 400 pH/Y (such as WSi), and a parallel-plate capacitive model for the LED.

Figure 21:
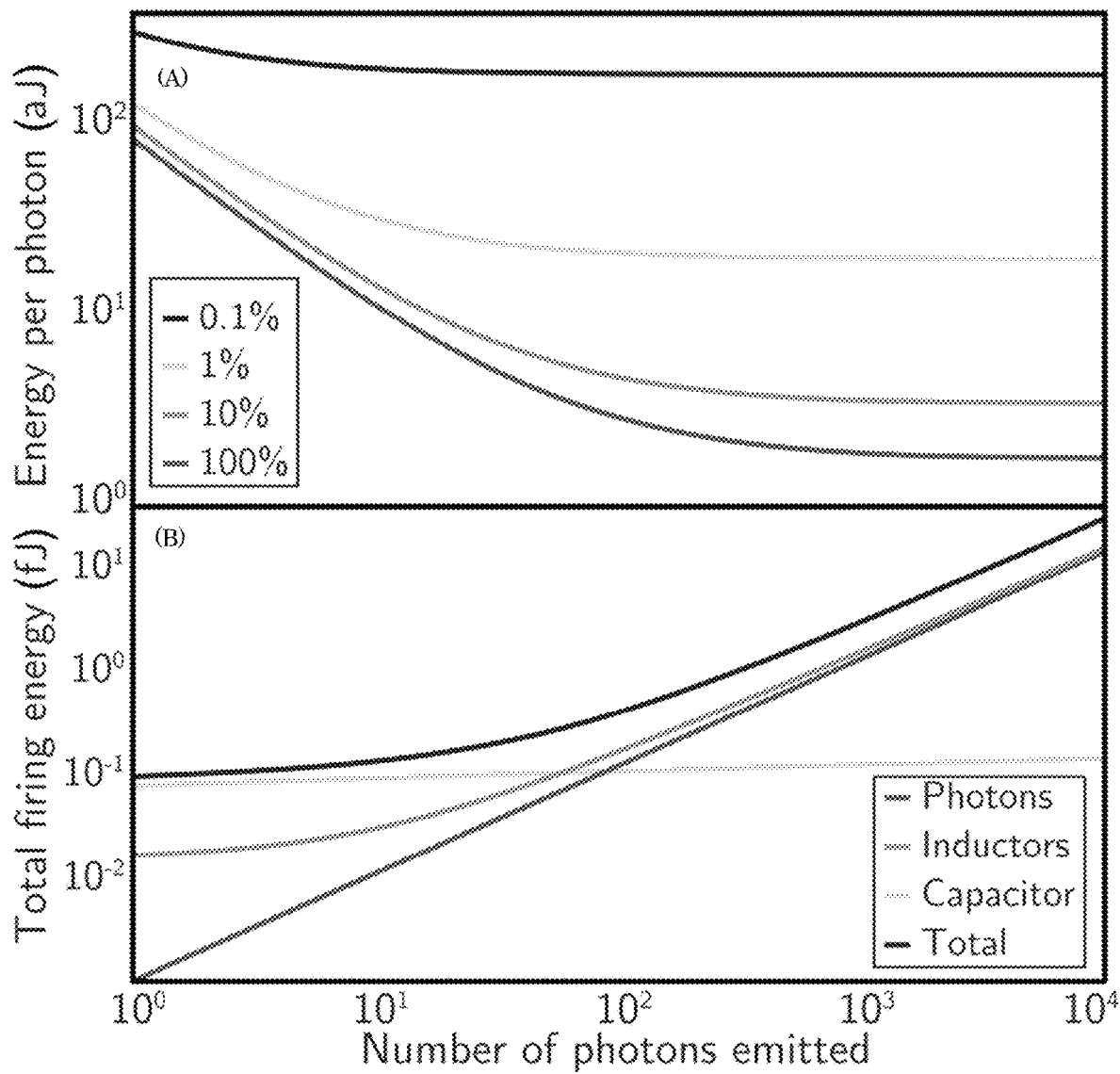
FIG. 21 shows (a) an energy to generate a single photon versus number of photons emitted for four different LED efficiencies. (b) Contributions to total energy consumption for a 10% efficient LED.

In FIG. 21a, we plot the total energy per photon as a function of the number of photons emitted for four values of LED efficiency. We find that with a unity-efficiency LED, the energy per photon can be as low as 2 aJ when larger photon numbers are created. This remarkably low number is still an order of magnitude greater than the 0.16 aJ stored in the hv of the light quantum itself (assuming $\lambda=1.22$ μm), with the extra energy going to supplying current to the inductors and charge to the capacitor. The figure reveals that producing LEDs with efficiency above 10% has only a modest benefit, as the contribution to energy consumption from inductance will become the limiting factor. However, for thresholding on larger photon numbers, as is desirable for neurons with more connections, the inductance per photon can likely be reduced. While a 100% efficient LED may not be realized, even a 1% efficient LED leads to 20 aJ/synapse event. This energy efficiency illustrates the promise of superconducting electronics and faint-light signals.

In FIG. 21b, we show the contribution to the total energy from the various circuit elements for the case of a 10% efficient LED. This efficiency is chosen for this plot because it is the value at which the contributions from inductance and photon production are nearly equal for photon numbers near or above 100. For low photon numbers, the dominant contribution is in charging the LED capacitor. Because of the highly nonlinear LED current-voltage relationship, a small increase in the voltage across the LED leads to a large gain in current. The capacitive energy is nearly constant across the range of photon numbers considered here, and for larger photon numbers, it makes a negligible contribution.

In the case of the SND circuit of FIG. 18 with parameters as shown in FIG. 19b driven at 0.6 Ic and receiving $10^3$ photons, and assuming a hot-spot recovery time of 50 ns and a LED with 1% efficiency, the device achieves 100 aJ/synapse event. While not as efficient as the PND neuron, this device design still lends itself to massive scaling.

An LED with 1% system efficiency operates in a nanophotonic environment at cryogenic temperature and with faint-light levels. We use 20 aJ/photon as a representative number for what this platform may achieve. We use the energy per photon as the energy per firing event per synapse (commonly referred to as the energy per synapse event) because the system produces neurons that threshold on a number of photons roughly equivalent to the number of connections made by the neuron. A neuron receiving 100 signals from upstream will threshold on 100 photons. It will produce 100 photons in a firing event and distribute them amongst 100 downstream synapses. Therefore, the energy per synapse event is calculated as the total energy of the firing event divided by the number of connections. In our case, for systems with 100 to 10 000 connections per unit, 20 aJ/synapse event is a realistic number.

The second law of thermodynamics informs us that to keep a system at 2 K, 150 W of cooling power is used per watt of power dissipated at 2 K. Assuming a 15% efficient cooling system, this gives an estimate of 1 kW of cooling power per watt of device power. Multiplying our conservative estimate of 20 aJ/synapse event by this factor of $10^3$, the hardware achieves an energy consumption of 20 fJ/synapse event. Similarly, while the human brain uses 20 W to perform roughly $10^{14}$ synapse events per second, a power budget of 20 W corresponding to 20 mW of device power will enable our system to achieve 1015 synapse events per second. Success in developing LEDs with higher efficiency, reduction of the device inductance, and utilization of superconducting materials operating at higher temperatures will further increase the advantage. Additionally, while transistor technologies inevitably leak current, superconducting devices can be engineered to draw no power in the steady state and can be dc biased without loss using Josephson junctions.

With regard to an electrically injected light source, we analyze the operation and performance of the LED. We target operation efficiencies of around 10%. This efficiency is relatively easy to attain in III-V semiconductors such as GaAs and InP. However, for the application at hand, massive scaling is a priority, and massive scaling involves photonic electronic process integration. A single source with 100% efficiency is less desirable than the ability to scale to millions (and eventually billions) of sources each with 1% efficiency. We also use low-loss waveguides with the potential for reconfigurability.

One option is to implement these devices on a GaAs or InP substrate. These have been the materials of choice for photonic integrated circuits where light sources are of the utmost importance. Quantum-dot-well LED lasers can be electrically injected with high efficiency on this platform and combined with high-index (III-V) waveguides to form the synaptic connections. Another option is to implement the light sources in the III-V material and then couple to low-temperature deposited materials with low-loss waveguides such as a-Si or SiN. A III-V platform has the advantage of high-efficiency light sources, but massive scaling on III-V substrates has historically been more difficult and expensive than on Si substrates.

Another option is hybrid III-V silicon integration. Hybrid III-V silicon has followed one of three approaches: direct mounting, wafer bonding, or III-V material grown on Si. While direct mounting or wafer bonding are currently the preferred methods for optical interconnect applications, these applications typically require a single source that can be diverted to multiple components. For the proposed neuromorphic computing platform, we desire a separate electrically injected source for each neuron. Direct mounting, therefore, is not an option, but wafer bonding may be able to achieve the yield and reproducibility required for this application. Direct heteroepitaxial growth offers the most promise for hybrid integration with this system. In this case, the desired light source is templated III-V quantum dots grown in the intrinsic region of a lateral Si p-i-n junction. Promisingly, electrically injected single-photon emission has been demonstrated in these materials. While single-photon emission is not a requirement for the present application, a desirable property of the emitters is that they have low-photon-number variance (defined as the standard deviation of the number of photons output for a given input current pulse over an ensemble of measurements).

A light source is emissive centers in Si. These have proved unattractive for optical interconnects due to very low efficiencies at room temperature. Much work in this area was motivated by the prospect of room-temperature light sources for CMOS and telecommunications and, in particular, room-temperature lasers. This includes various point defects in Si including Er and other emissive centers giving rise to electric-dipole-mediated transitions as well as band-edge or Si nanocrystal-based emission processes. While the efficiencies of many of these emitters fall off exponentially with increasing temperature, the SNSPDs required for this application operate at cryogenic temperatures where many point defects have suitable efficiencies. A large number of emissive centers are under consideration for this application.

Figure 22:
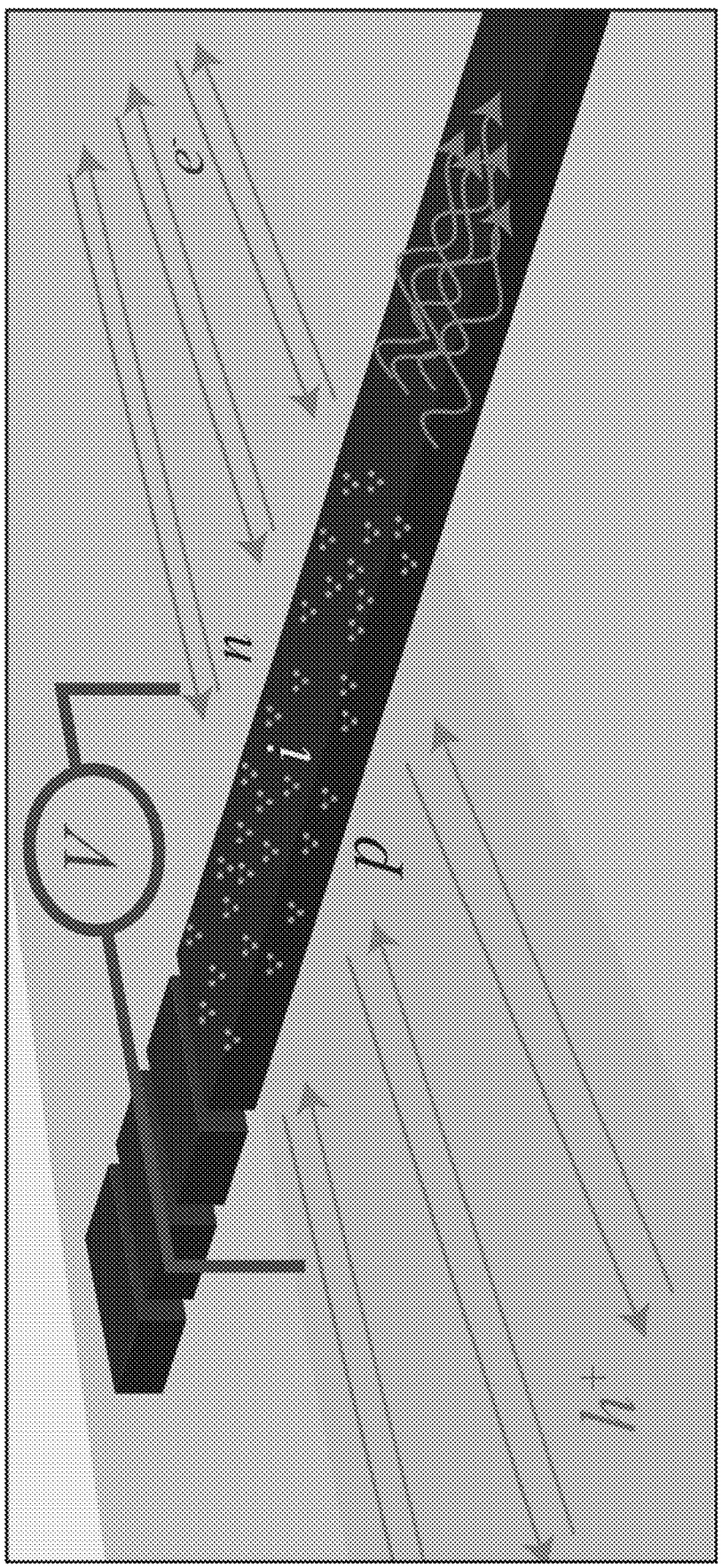
FIG. 22 shows a monolithically integrated electrically injected emissive-center LED in Si for the proposed neuromorphic computing application.

A challenge is integration of large numbers of emitters with the ultimate goal being billions integrated in a system. Many emissive centers can be easily fabricated in a CMOS-compatible process via ion implantation and annealing. A schematic of the desired device is depicted in FIG. 22. A p-i-n junction is created in a ridge waveguide. Emitters are located only in the ridge (intrinsic) region via lithographic patterning, and light is obtained from forward biasing the junction. While this is a relatively standard configuration of a LED, for the application at hand it is important to keep the emitters localized only in the intrinsic region of the LED, as their presence elsewhere in the waveguides leads to intolerable loss. Thus, the ability to lithographically control the location of emitters is a factor.

With co-implantation of multiple impurities, additional (color) degrees of freedom can be included in the platform. Similarly, on a III-V platform, we can take advantage of inhomogeneous broadening of the quantum-dot spectrum and tuning of dot size via templating or growth conditions.

The neuromorphic computing platform is not tied to any one of these light sources, and other possible light sources can be used that we have not discussed. For the calculations throughout the present work, we assume LEDs with 1% efficiency at 1.22 μm in a waveguiding medium with index of 3.52 with a cladding of 1.46 above and below.

A network of waveguides connects the processing units. Optical waveguides can provide improved performance over electrical connections by allowing individual neurons to integrate signals from many sources without the need for time multiplexing. Because of the additional energy cost associated with the capacitance of additional wires, electrical neurons use shared wires. Voltage pulses from different neurons on the same bus will interact. To prevent this, pulses can be delayed in time.

A network of optical waveguides can be implemented to form the connections between the SPON circuits presented. Each neuron has a waveguide exiting the LED and leading to many branching waveguides, which we liken to the axon and its arbor, and another set of integrating waveguides combining signals received from upstream neurons, which we liken to the dendritic arbor, as shown schematically in FIG. 14. The connections between these input and output waveguides act as synapses in this network. We outline a mechanism for varying the strength of the connections between various input and output waveguides, which is similar to varying synaptic weights in biological systems. Other methods of connecting neurons in three dimensions using the same optoelectronic neurons are possible. One can envision using gratings, flat lenses, metasurfaces, or optical phased arrays to direct signals between neurons. Additionally, electrical means of changing synaptic weights at the receivers may prove useful.

With regard to a dendritic arbor, the dendritic arbor of a neuron collects signals from upstream neurons. For optoelectronic neurons, the equivalent of this is a waveguide network that combines optical signals from many other neurons to the neuron for detection. At each neuron, the device must be designed to combine the modes from a large number of waveguides on a PND or SND with low loss.

A schematic of the first approach is presented in FIG. 23a that shows the spiral waveguide receiver of the spider web SPON, the nTron, and the LED emitter. The major challenge of this device design is the merging of many single-mode waveguides into one multimode waveguide which enters the spiral. The proposed technique for accomplishing this is shown in FIG. 23b. Two single-mode waveguides cannot be combined into one single-mode waveguide without significant loss. However, two single-mode waveguides can be combined into one dual-mode waveguide nearly losslessly. In FIG. 23b, several single-mode waveguides combine their power on a given main spine. That spine can receive at its input one single mode. As it continues to receive more modes, its width must grow. The lower-order modes of this adiabatically tapering multimode waveguide can pass each new single-mode input nearly losslessly as long as the width of the spine has grown to support an additional mode by the location of the next input waveguide. Modal simulations reveal that a waveguide width of 2 µm in 200-nm-thick Si is sufficient to support several tens of modes at 1220-nm wavelength, each with tolerably small bending loss with a 10-µm radius of curvature. Therefore, this dendritic arbor and receiver design is suitable for the compact combining signals from approximately 40 upstream neurons.

Figure 24:
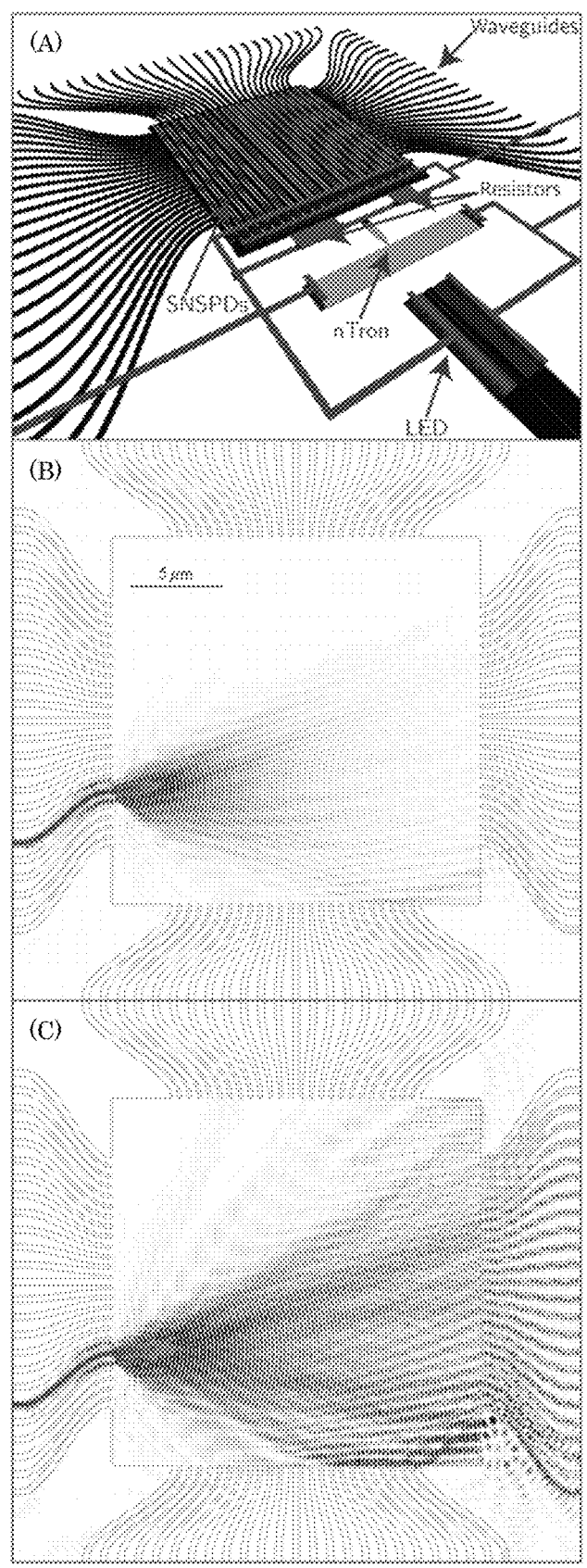
FIG. 24 shows (a) a stingray neuron. (b) FDTD simulation of the dendritic arbor for the stingray neuron with SNSPDs present to absorb the light and (c) without SNSPDs present.

The second proposed design is better suited to scaling to larger numbers of inputs. It is shown in FIG. 24. In this design referred to as the stingray SPON, the input waveguides are directly combined on a landing pad housing the PND or SND array. The implementation with a PND is shown in FIG. 24a. A minimum spacing to avoid modal coupling is 600 nm at the input of the cell. From these input ports, the waveguides enter an array of sine bends where their spacing is reduced to enter the smaller landing pad containing the nanowires. In this sine region, intermodal coupling is tolerated (and perhaps even desirable to spread the photons across the nanowires), as all waveguides ultimately terminate on the detector array. FIG. 24b and FIG. 24c show 2D finite-difference time-domain (FDTD) simulations of the structure. FIG. 24b shows the propagation of light into the receiver body in the presence of absorbing nanowires, while FIG. 24c shows propagation without the absorbing nanowires. Here, 100 waveguides terminate on a receiver body with less than 0.2-dB insertion loss from any port, with the outermost ports giving the most loss, and the innermost ports achieving near-zero insertion loss. In this context, insertion loss refers to light entering and leaving the simulation without being absorbed in the nanowire array. Calculated quantitatively with pulsed excitation, we find the majority of loss is due to light scattering and not entering the detector array rather than being transmitted through the receiver due to inadequate absorption. The entire receiver of FIG. 24b occupies 30×30 µm$^2$. A design with 204 input waveguides and less than 1-dB insertion loss with a footprint of 60×60 µm$^2$ is also found. For larger numbers of inputs, the simulations become cumbersome. Yet, scaling to larger systems is clearly possible.

For threshold-based computation, processing units with large numbers of connections are advantageous. Biological systems achieve massive interconnectivity with 3D branching networks and dedicated wires for each connection. To achieve this level of massive interconnectivity, we can use multilayer photonics. For massive scaling, we can use waveguide routing networks and dendritic arbors spanning several—and up to tens—of photonic and superconducting layers. A hybrid of the aforementioned spider web and stingray neuron designs can be implemented in which higher vertical-mode orders are utilized as well as higher lateral-mode orders, and massively multimode waveguides deliver their photon pulses to SNSPD receivers. These receivers can be implemented between waveguiding layers. The fully 3D multilayer photonic approach can be included in the neuromorphic platform for scaling, but such sophisticated processing can be included in advanced systems with 2D interconnectivity supporting hundreds of high-bandwidth connections per unit.

With regard to the axon and its arborization, the output waveguide (axon) from a unit's LED can split into as many branches as there are connections to be made. While such a power splitter may seem to be the time-reversed case of the dendritic arbor, the initial conditions make this device significantly easier to implement. In the case of the dendritic arbor, one cannot assume the optical field will populate the arbor modes in a particular manner. Thus, while a power splitter can readily couple from a single-mode waveguide into many other single-mode waveguides, multiple single-mode waveguides cannot simply merge their power into a single-mode waveguide unless a particular distribution of power is present in the input waveguides. Such power splitters can be made with a small footprint and low loss. Power splitters can be made in the third dimension with multilayer photonics, and such an implementation provides thousands of synapses with a volume of 10 µm$^3$/synapse.

With regard to learning, reconfiguration, and plasticity, a neuromorphic computing system includes a strength of interaction between the connected units. These connection strengths, often referred to as the weight matrix, affect memory and learning. This weight matrix determines how much light from the firing of a particular neuron is coupled into any other neuron, analogous to the synaptic strength between two neurons in a biological system.

As a first implementation, fixed connection weights are useful for computing applications. This can be accomplished by branching the output waveguide from one neuron and routing those waveguide branches to various downstream target-neuron input waveguides.

Figure 25:
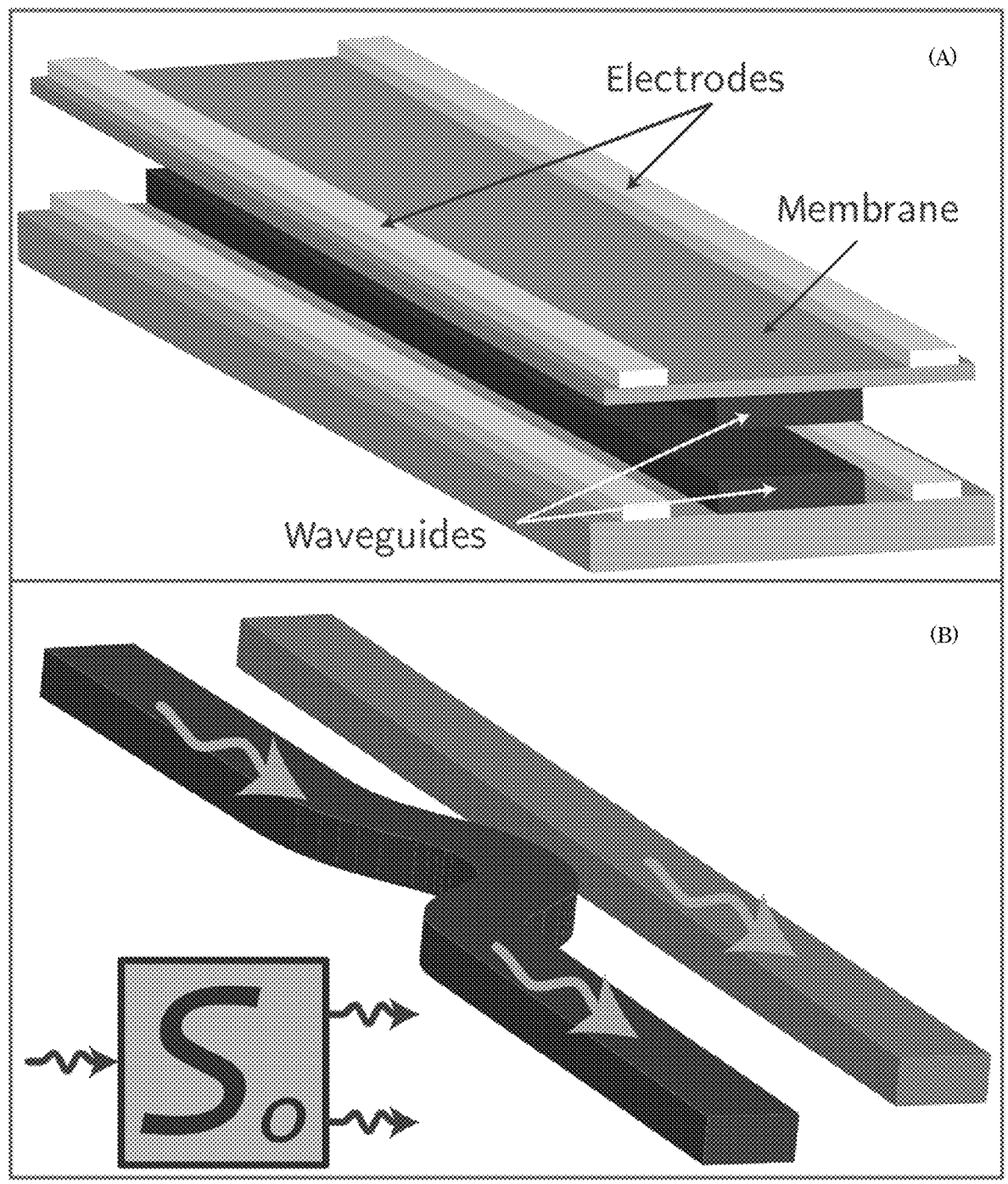
FIG. 25 shows synapses with electromechanically tunable coupling. (a) Interplane waveguide coupler. (b) Lateral waveguide coupler. The inset shows an abstract representation of the synaptic circuit element used in subsequent network diagrams.

While fixed interaction weights are useful, we develop a system in which the interaction strengths are variable. At cryogenic temperatures, modulators that rely on the thermo-optic effect or free-carrier injection may be ineffective, while electro-optic switches use a lot of space for this application. We include the electromechanically actuated waveguide couplers shown in FIG. 25a and FIG. 25b. The amount of light coupled from one waveguide to the other is determined by the distance between them. These waveguides can be coupled vertically [FIG. 25a] or laterally [FIG. 25b]. This distance can be controlled electromechanically, and anywhere from 0% to 100% of the light can be coupled from one waveguide to the other. The minimum coupling will be set in hardware, as the gap at 0 V is the maximum. Any applied voltage (positive or negative) produces an attractive force between the two waveguides. We then want activity within the circuits to build up voltage between the waveguides and increase the strength of the synapse. Such couplers have been demonstrated in a highly scaled configuration with 4096 such switches operated with >60-dB extinction ratio and actuation voltage of 40 V. Because of the relaxed visibility requirements for this application, lower voltages are used.

To assess the utility of such synapses for neuromorphic computing, one can specify a target application. Two classes of applications include supervised and unsupervised systems. For supervised systems, an input stimulus is injected into the system, the output is recorded, and the weight matrix is updated through a training algorithm to improve the output relative to a target. For such an application, one anticipates using control electronics to interface with the neuromorphic system, and arbitrary voltages can be applied to the various synaptic elements.

For more highly scaled implementations emulating the behavior of biological organisms, we turn our attention to unsupervised systems. Each synapse can be small as possible to enable massive scaling, but voltages can be modest because we want the activity in the circuits to be capable of reconfiguring the synapses. In particular, we want firing events from upstream neurons followed closely by firing events by downstream neurons to place charge on this MEMS capacitor (waveguide coupler) and thereby decrease the gap between the two waveguides and increase the optical coupling and, therefore, the synaptic strength. This coordinated charging of the membrane will accomplish spike-timing-dependent plasticity, an important learning and memory reinforcement mechanism in biological neural systems. In this mode of operation, we envision eliminating external control circuits and achieving the capacitor charging using integrated superconducting circuits to distribute current based on photon-absorption events. The storage of charge on a capacitor required for this device operation is very similar to dynamic random-access memory (DRAM), which is a mature technology. While implementing what is essentially spike-timing-dependent DRAM with suspended waveguide membranes presents a technical challenge, it offers a promising means to implement truly neuromorphic learning within this optoelectronic platform.

While the size of mechanical waveguide couplers and the voltages required for their operation are commensurate with the requirements for scaling this technology, an implementation of variable synaptic weights which does not rely on mechanically mobile components will be advantageous. It may be possible to implement synapses in the electronic domain by making use of superconducting circuit elements or magnetic elements such as magnetic tunnel junctions or magnetic Josephson junctions. Such an approach to memory will be investigated in future work. Additionally, we note that a variable weight can be achieved with a tunable Mach-Zehnder interferometer. However, the size of such devices makes them poorly suited to highly scaled systems.

Figure 26:
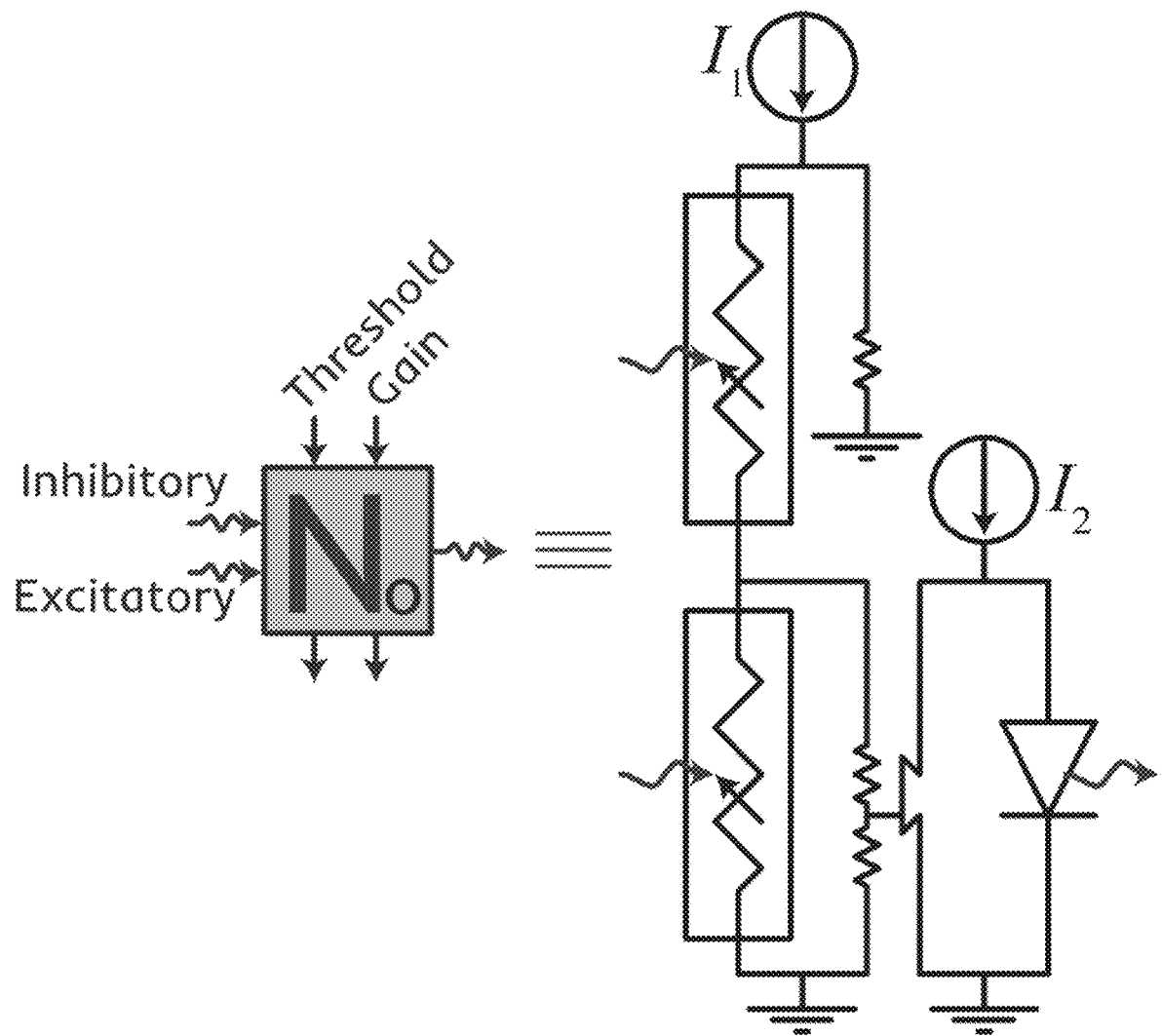
FIG. 26 shows an abstract symbol definition for general neuron with inhibition and gain.

With regard to networks and scaling, in FIG. 26, we again show the inhibitory SPON and introduce an abstract symbol to represent the circuit labeled No, which is used in the following sections as an element in networks. We refer to networks comprising interconnected SPONs as superconducting optoelectronic networks (SOENs). In this and the following schematics, we represent electrical inputs and outputs as black arrows running vertically and optical inputs and outputs as colored wavy arrows running horizontally. In FIG. 26, we emphasize that the optical processing unit can receive and transmit electrical and optical signals each in two ports. The electrical signals affect SPON threshold and gain, while the optical ports are either excitatory or inhibitory. This full functionality need not be employed, and as few as one optical input and output and one electrical input can be utilized.

We now illustrate how the circuits can be used in systems by considering multilayer perceptron (MLP) and a general discussion of SOEN scaling.

Figure 27:
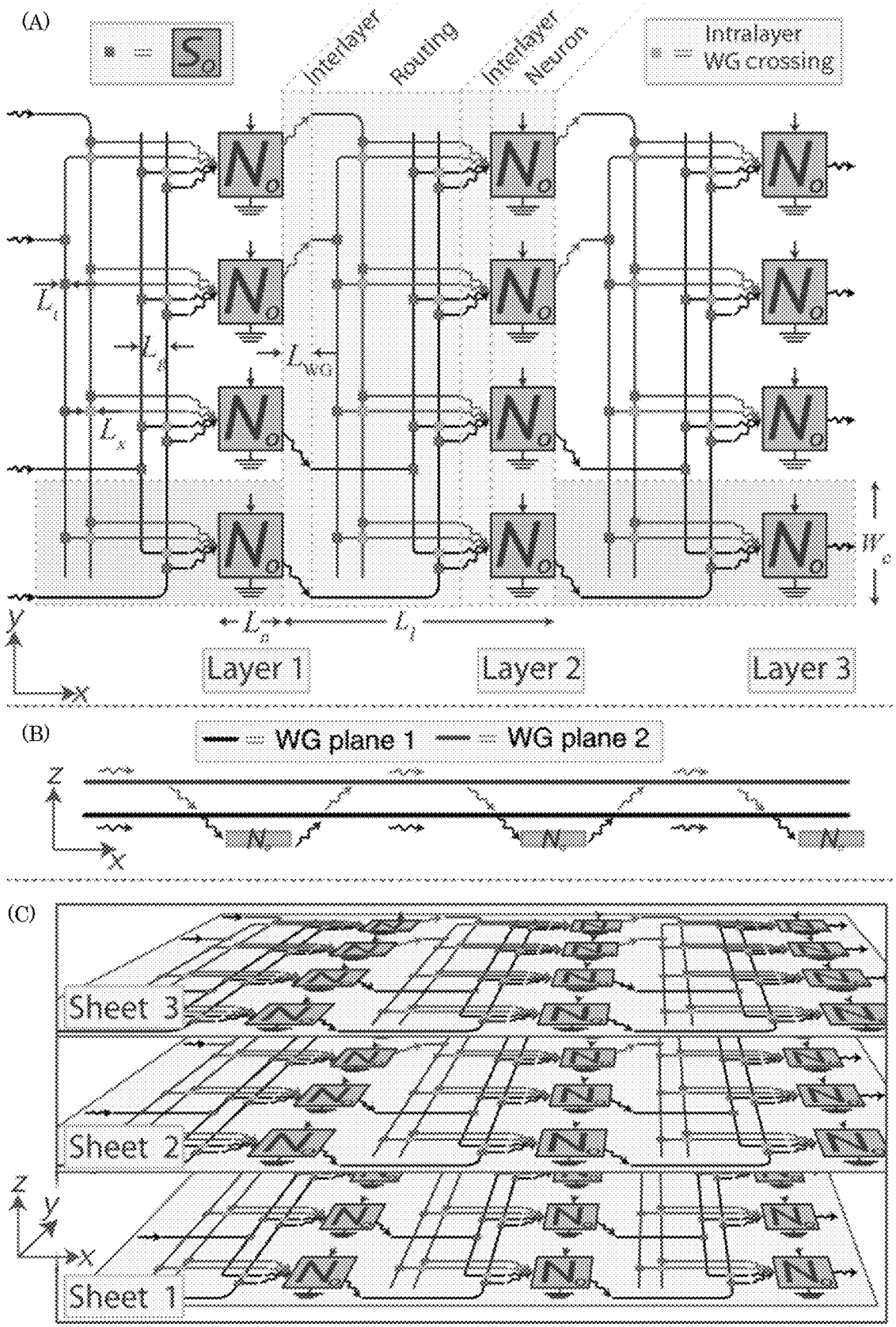
FIG. 27 shows (a) an MLP implemented with the SOEN platform. (b) Cross section in the x-z plane. (c) Three-dimensional schematic of stacked die. (a) illustrates layers of neurons in the network, (b) illustrates planes of routing waveguides, and (c) illustrates sheets of stacked die.

With regard to multilayer perceptron, MLP provides insight into other applications of this platform in terms of quantities such as speed, size, and dynamic range. The MLP can include inputs incident on a weight matrix (array of synapses) that feed into a layer of neurons. The output of this layer of neurons projects to at least one more layer of weights and neurons, and often several, before being output from the system. In FIG. 27a, we show a schematic diagram of how such a MLP is likely to be implemented. Such a MLP can be achieved with a single plane of routing waveguides or many such planes. Here, we use "plane" to refer to vertically stacked dielectric layers to avoid confusion with the processing layers of the MLP progressing horizontally in FIG. 27a. The processing layers of the MLP are labeled in FIG. 27a, and the cross-sectional view of planes of routing waveguides is shown in FIG. 27b. Stacked sheets of die are illustrated in FIG. 27c.

Several factors determine the functionality of a MLP. These include the dynamic range of the inputs, the speed with which the inputs can be received, the bit depth of the synaptic weights, and the speed with which the weights can be reconfigured. From FIG. 19c, we see that for 0.7 Ic, the response turns on at around 500 photons, and it roughly levels out by 3000 photons. For this case, the dynamic range of the inputs is, therefore, $\log 2(2500) \approx 11$ bits. The speed with which inputs can be received is limited by the device reset time of 50 ns, so a 20-MHz input rate is achievable. The bit depth of the weights depends on the number of discrete values of coupling achievable between the two waveguides involved in a synapse, and further investigation is required to report a valid estimate for this number. The speed with which the weights can be changed is at least 1 MHz.

Figure 28:
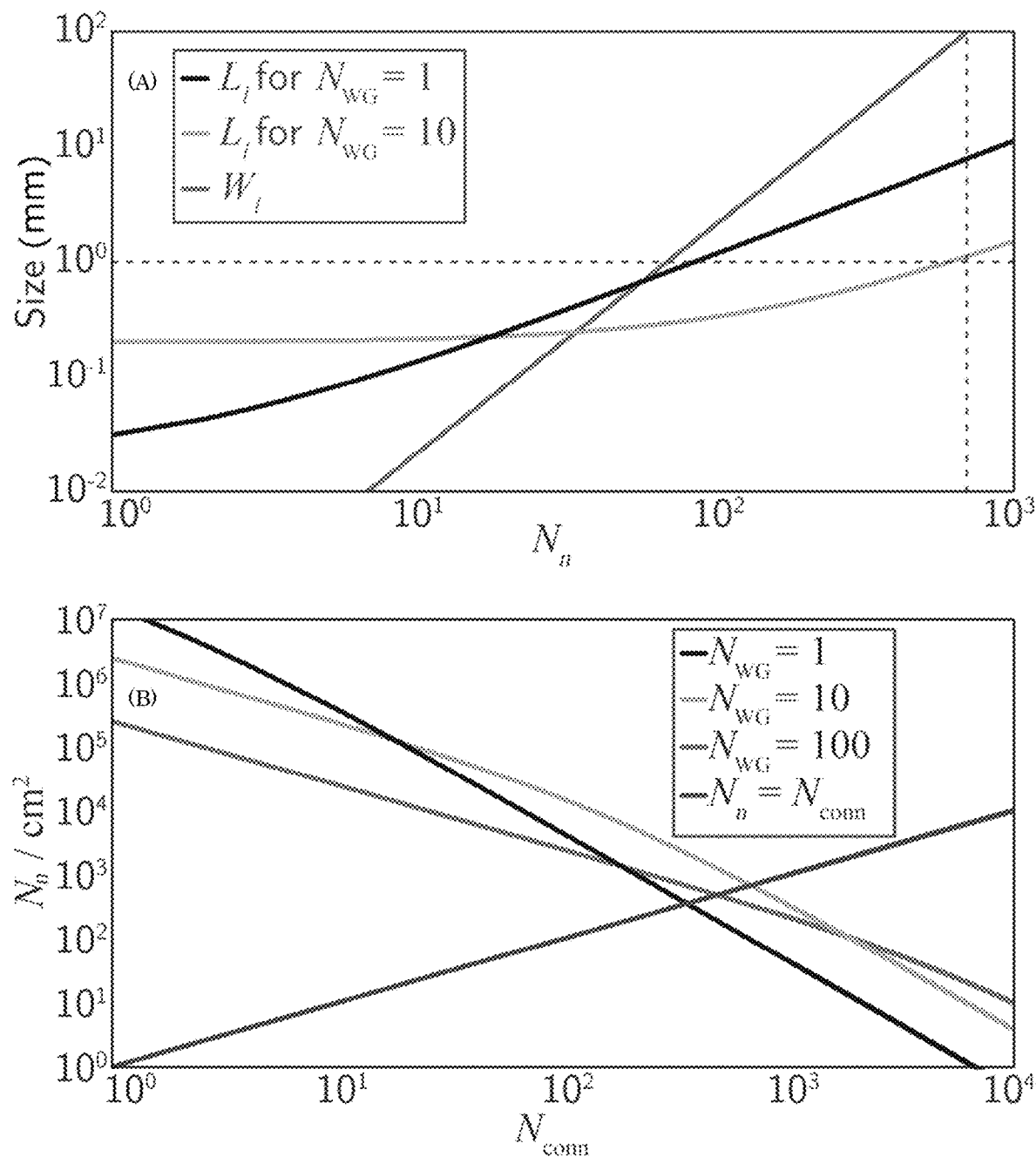
FIG. 28 shows (a) a length and width of layer versus number of neurons in a layer assuming each neuron in a given layer is connected to each neuron in the next layer. (b) Number of neurons per centimeter squared versus the number of connections per neuron.

The number of inputs, the number of connections per neuron, and the number of MLP layers all affect the size and complexity of MLP that can be fabricated on a given die. In FIG. 28a and FIG. 28b, we consider a model of these factors to estimate what may be achieved with reasonable size. FIG. 28a assesses the length L1 and width W1 of a single MLP layer, as given by Eq. (F1) as a function of the number of neurons in a MLP layer Nn for two different values of the number of vertically stacked waveguide planes NWG. The model assumes a feedforward configuration wherein every neuron in a given MLP layer is connected to every neuron in the next MLP layer with a variable-weight connection. The total width of a MLP layer is also plotted. If we assume that a 10×10 cm$^2$ die is the largest we want to fabricate, we find the width limits the number of connections per neurons to 700, and we are, thus, considering MLP layers with 700 inputs and 700 neurons per layer. For the case with NWG=10, the length of a MLP layer with 700 connections per neuron is 1 mm. We can, therefore, fit 100 such MLP layers on the 10×10 cm$^2$ die. The total number of neurons is 70000. A MLP or CNN with 700 inputs, 700 connections per neuron, and 100 layers receiving inputs at 20 MHz with weight reconfiguration speed of 1 MHz is a very powerful tool. While it is not necessarily optimal to work with a neural network of 100 layers, as shallower networks are advantageous for several reasons, we present this model to quantify SOEN spatial scaling keeping in mind that network depth can be traded for a larger number of inputs or larger connectivity. As a point of comparison, the recent demonstration of a computer defeating the world champion Go player input the state of the board as a 19×19 matrix (361 inputs) to the 13-layer-deep neural network. The bit depth of the synapses proposed here is unlikely to reach the 32 bits utilized in software implementations running on modern graphics processing units, but there are likely many applications in which such a constraint is minor compared to the system advantages of speed, complexity, and connectivity.

With regard to scaling of the MLP (or other similar neuromorphic computing systems), we consider the number of neurons in an area of 1 cm$^2$ versus the number of connections per neuron, Nconn. FIG. 28b shows the results of the model of Eq. (F1) for NWG=1, 10, and 100. If Nconn=10 is sufficient for a given application, we can achieve a neuron density of 400 000 neurons per centimeter squared. Because of the size of the interlayer couplers, this is achieved more compactly with NWG=1 than with NWG=10. For Nconn in the range of 100 to 1000, it becomes advantageous to utilize NWG=10. For Nconn=100, over 10 000 neurons will fit within a centimeter squared, and for Nconn=1000, 300 neurons fit within a centimeter squared. It does not become advantageous to use NWG=100 until Nconn=2000, and even then, the gain is modest. To achieve 10000 connections per neuron (comparable to a mammalian brain), only a few devices fit within a centimeter squared (given the present model), and we are left in awe of the massive interconnectivity and scaling achieved by the bottom-up nanofabrication of biological organisms.

While the scaling to 10000 connections per neuron is formidable, the range of Nconn=100-1000 is promising and technologically consequential. As is the case for scaling CMOS neuromorphic platforms, utilization of die tiling plays a role in this technology. For this purpose, the SOEN platform is in an excellent position. Die can be tiled in 2D with several types of connectivity to adjacent die including electrical, single-flux-quantum, and photonic communication over interdie bridge waveguides. Additionally, tiling in the third dimension is possible with the usual bump-bonding approach for electrical connectivity as well as with free-space optical signals sent from one chip using vertical grating couplers and received by a chip above or below using SNSPD arrays. Information over such links can be encoded temporally, spatially, or in frequency with forgiving alignment tolerances. From FIG. 28b, we find that 700 neurons with 700 connections per neuron can fit on a 1×1 cm$^2$ die if ten waveguiding planes are utilized.

To analyze long-term scaling, we consider a system on the scale of the human brain. To this end, we envision tiling a 215×215 array of these die in a sheet to build a system with 32×10$^6$ neurons. Such a sheet will be approximately 1 mm thick. To achieve the scale of the brain, 2150 such sheets need to be stacked with inter-sheet coupling to construct a cube 2.15 m on a side and with a total volume of 10 m$^3$. The system then comprises 7×10$^{10}$ neurons or roughly the number contained in the human brain.

To achieve such a system, we envision sheets of die mounted in trays with in-plane fiber-optic connections leaving from the perimeter of the trays and out-of-plane free-space grating-to-SNSPD interconnects, thus, enabling the trays to slide laterally. Achieving inter-sheet connectivity without physical bonds enables access to die within the volume of the cube for diagnostics, repair, and local iteration and evolution. Massive interconnectivity between neurons on different die can be accomplished using such grating interconnects.

Of greater importance than the size of highly scaled systems is the power consumption. We again consider a system of SPONs with 700 connections each. Such a device consumes 2×10$^{-17}$ J/synapse event, and with 700 connections, each firing event consists of 700 synapse events. Information processing in neuromorphic systems requires sparse event rates, so for the SOEN hardware wherein 20 MHz is achievable based on device limitations, 20 kHz represents a sparse rate. Note that this rate is a factor from (2×10$^4$) to (2×10$^5$) faster than biological event rates and a factor of 1000 faster than the CMOS demonstration which achieved 26 pJ/synapse event and was limited by time multiplexing. For the system under consideration, we have 7×10$^{10}$ processing units which we consider to be firing at this rate with this energy per firing event, giving a total device power consumption of 20 W. These numbers give 5×10$^{16}$ synapse events per second per watt. The system must be kept around 2 K, so we also include an additional 1 kW of cooling power per watt of device power. While this cooling power does not affect the power density (which ultimately limits scaling), and this 20 kW is minuscule compared to the tens of megawatts of a modern supercomputer, if we include this additional power in the calculation, we find that we achieve 5×1013 synapse events per second per watt.

To put this in perspective, the human brain also uses 20 W of device power, but by analogy to the inclusion of the cooling power in the above calculation, one must include the human's total power of 100 W which is necessary to sustain the brain's operational state. The brain has roughly 10$^{11}$ neurons with roughly 7×10$^3$ synapses per neuron firing between 0.1 and 1 Hz. For the purposes of this calculation, we generously assume the rate is 1 Hz. This equates to 7×1012 synapse events per second per watt. Even with the 1-kW/W cooling power of the cryostat, we find that the number of synapse events per second per watt of the SOEN system exceeds that of the brain by an order of magnitude. The size of the SOEN system (10 m$^3$, 2.15 m on a side) is, however, much larger than the biological brain.

Because signaling occurs predominantly in the optical domain, firing events can be directly imaged with a camera. For massively scaled systems, this direct optical imaging becomes a powerful metrological tool. Such a measurement technique can be used to monitor device and system performance across spatial and temporal scales in a manner analogous to functional magnetic resonance imaging of biological organisms.

With regard to cryogenics for a 1-m³ SOEN system. We seek a ⁴He sorption refrigerator capable of cooling a 1 m³ volume to 2 K with 20 W of cooling power. While this is a relatively large cryostat, it is certainly well within the realm of possibility. No new physical principles of operation need to be developed; it is simply a question of scaling up existing ⁴He cryogenic systems. Additionally, if suitable SNSPD materials can be found which operate at 4 K with high yield, 20 W of cooling power is straightforward to achieve. We are of the opinion that with the advancement of single-flux-quantum processors, superconducting qubit devices, and SOENs, large-scale cryogenic technology will advance significantly in the coming years. Presently, many conversations in advanced computing debate whether the technology which proves victorious will operate within a cryostat or at room temperature. A supercomputer can leverage optoelectronic devices on various material platforms to employ quantum principles, neuromorphic principles, and digital logic principles across various temperature stages. The device designer is faced with the task of optimizing hardware performance at each temperature stage.

With regard to advantages of optoelectronic neural networks, the unparalleled performance of the brain emerges from the enormous number of connections between neurons and the numerous complex signaling mechanisms available to the neurons. Optical signaling has an advantage over electronics in terms of the ability to route noninteracting signals in three dimensions without wiring parasitics.

The two components to enable photonic fanout and routing at an intradie level are multilayer waveguide power dividers and in-plane waveguide crossings. Both of these devices occupy a small area and operate with low loss and no RC penalty. Implementing these devices with roughly ten waveguiding layers appears optimal, comparable to the number of back-end-of-line metal layers used in CMOS for interconnect. With ten waveguiding layers, the desired routing between optoelectronic neurons involves in-plane waveguide crossings. The ability to implement multilayer power dividers and in-plane waveguide crossings with low loss and low cross talk allows dedicated communication lines for each interneuron connection.

On the receiving end, signals from an arbitrary number of SPONs can be received simultaneously, and time multiplexing is unnecessary. The system is conducive to encoding of information in both spike rate and timing. On an electronic platform, the length of an electronic signal line increases as the number of connections grows, resulting in a larger RC time constant. This increase in RC time constant with number of connections forces a speed or connectivity trade-off, leading most electronic neuromorphic implementations to share communication lines. Such a shared interconnect can transmit only a single voltage pulse within a time window, and this involves the number of connections between neurons and the firing rate of each neuron.

Other approaches that leverage phenomena unique to optics for neuromorphic computing have employed optical devices such as lasers and integrated microresonators. Laser cavities with strong light-matter interaction can be leveraged to realize complex nonlinear dynamics which can emulate the behavior of neurons. The frequency selectivity of integrated ring resonators can be used to achieve synaptic weights. Optical neural networks and spiking neurons based on these effects have been proposed and demonstrated. The SOEN platform operates in the few-photon regime with compact, energy-efficient components, enabling a large degree of scalability.

With regard to a visual cortex, a simple neural network (the MLP) can be built with SPONs, and the SOEN platform can be used in complex systems. The visual cortex is the most thoroughly studied region of the mammalian brain, yet there is still a great deal to be understood about information encoding from the retina through the thalamus and on to the visual cortex. A nonbiological experimental test bed is highly desirable to explore hypotheses. Biologically realistic supercomputer simulations of the brain can simulate only a small fraction of the brain cells in a small mammal at significantly reduced speed. The massive parallelism enabled by a scalable, biologically realistic hardware implementation of the many thousands of neurons involved in the visual system can provide more quick and efficient simulations, which may give further insight into the visual system, while also offering potential for image-processing applications.

Figure 29:
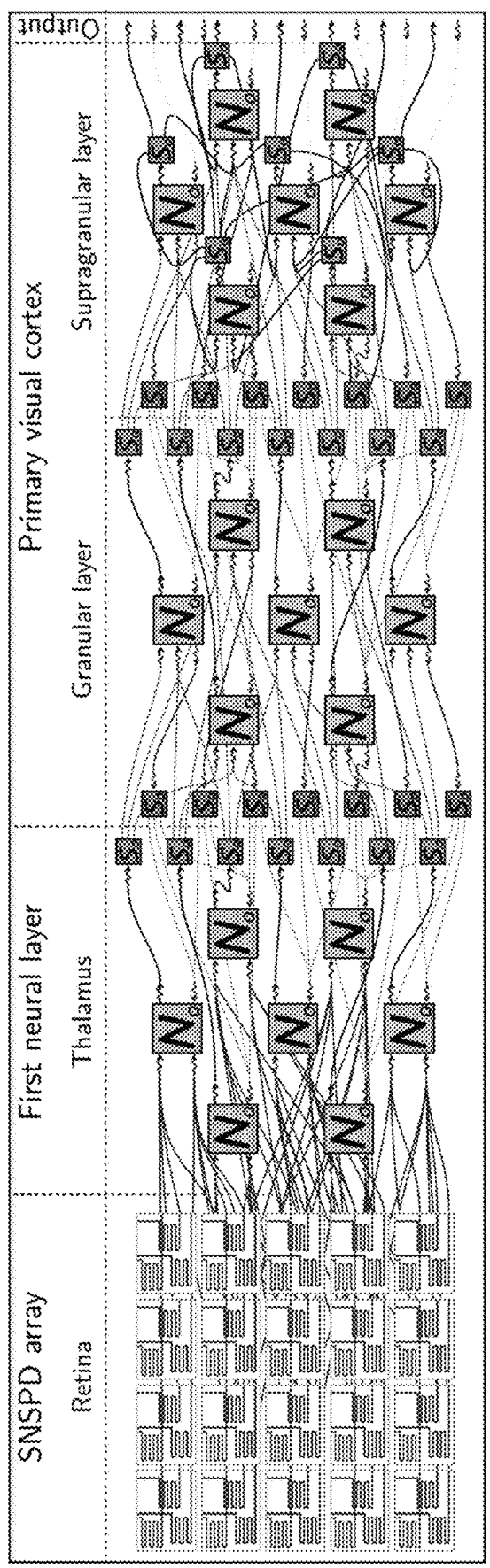
FIG. 29 shows a superconducting optoelectronic network (SOEN) model of the mammalian visual cortex.

An exemplary application of the hardware platform is a built-in retina that includes integrated SNSPDs, which are used as a pixel array for monolithic image acquisition and analysis. In FIG. 29, we show an SNSPD array integrated with a multilayer neural network as a visual system. The visual system includes a retina, a thalamus, and a primary visual cortex. In biological systems, the primary visual cortex is highly sophisticated, being organized into six layers each with their own sublayers. Our primary visual cortex includes two layers that are referred to as a granular layer and a supragranular layer.

At the left of FIG. 29, the SNSPD array receives light from the environment and converts it to signals to be sent to the first layer of neurons in the thalamus, in direct analogy with a biological retina. Much like the cones in a human eye, the pixels of the SNSPD array can be designed to be more sensitive to particular frequencies simply by varying the thickness of an antireflection coating locally above each pixel.

From the retina, a small number of pixels project to each neuron in the thalamus without a large amount of branching. Similarly, the neurons of the thalamus project to the first layer of the visual cortex with minimal branching. Importantly, some of these connections are inhibitory and some are excitatory. While inhibitory connections are known to play a central role in information encoding in the visual system, the full scope of that role remains the subject of investigation. The biologically realistic mechanism for implementing inhibitory connections, as illustrated in FIG. 20c is of great utility in using SOENs to study information encoding in the visual system. In the thalamus, there is little if any recurrence, meaning the neurons in that layer project forward but do not form synapses on each other. The thalamic neurons do, however, receive feedback from the granular layer of the visual cortex. The ability to straightforwardly implement feedback with SOENs, as illustrated in FIG. 20e, is another feature in using SOENs as the visual system.

The granular layer receives feedforward signals from the thalamus, projects feedforward signals to the supragranular layer, and receives feedback from the supragranular layer. While still only minimally recurrent, neurons in the granular layer branch more heavily to form a larger number of connections across more neurons in the supragranular layer. The supragranular layer projects its output to other regions of the cortex and is also heavily recurrent. At the right of FIG. 29, we show the neurons in the supragranular layer making connections with other neurons within the layer.

For an initial SOEN visual system, we envision implementing the retina and thalamus on a single die, with a separate chip of 700 neurons being employed for the granular layer and a third chip of 700 mutually interacting neurons representing the supragranular layer. This experimental test bed may offer insight into outstanding questions such as how and why concentric circular patterns of retinal response are mapped to bars for processing in the visual cortex. With a simple system like that illustrated in FIG. 29, experiments relate to object recognition, edge detection, the perception of motion and spatial frequency, as well as many other subjects in contemporary visual system research.

It is contemplated that neuromorphic systems can find trends and extract features from large and noisy data sets, reducing the dimensionality of those data sets. They can learn over time based on the temporal evolution of the data under consideration. Several societal challenges require this type of analysis of large numbers of complex, interacting units—exactly the type of system for which neuromorphic computing excels. These applications include monitoring of markets, Internet traffic metrology, detection of hacking attacks, modeling of climate systems, and phenotypic prediction from genomic data. For these applications, supercomputers at the limit of what is possible with CMOS implementations of the von Neumann architecture are presently in use. For many computational tasks, massively scaled systems employing parallel computation in a neuromorphic architecture can play a role in which the system can be used.

Another likely solution to the current bottlenecks facing supercomputers is superconducting electronics. In particular, Josephson-junction processors with single-flux-quantum logic are poised for use in the next generation of supercomputers. These processors can provide an improvement over CMOS in speed by roughly a factor of 100 with extremely high-energy efficiency. Our platform integrates into supercomputers, offering neuromorphic capability to von Neumann implementations and additional degrees of freedom to neuromorphic Josephson-junction systems, which are purely electronic. In addition, the SOEN platform may offer a means to transduce single-flux quantum pulses to the optical domain, for interconnects between chips and with the outside world (cryostat I/O) via photonic signaling.

With regard to integration time and refractory period, an integration time of a SPON is the time from the absorption of a photon until the receiver no longer has a memory of that absorption event. The behavior of integrate-and-fire devices with integration times less than infinity are referred to as leaky integrate-and-fire neurons. In the context of SPON devices, in the most basic case, this integration time is determined by the hot-spot relaxation time of the superconductor, which depends on the material quasiparticle dynamics which are governed by the electron-phonon coupling and the thermal conduction to the substrate. This thermal relaxation is a material-dependent quantity and can be as fast as 200 ps in NbN. In WSi, it is closer to 1 ns, and there may be materials for which it is even slower. Additionally, the bias current is shown to affect the quasiparticle recombination time. The choice of superconducting material and substrate may be leveraged to tune the integration time to a desired value in hardware, and the bias current may be used to modify it dynamically.

Figure 15:
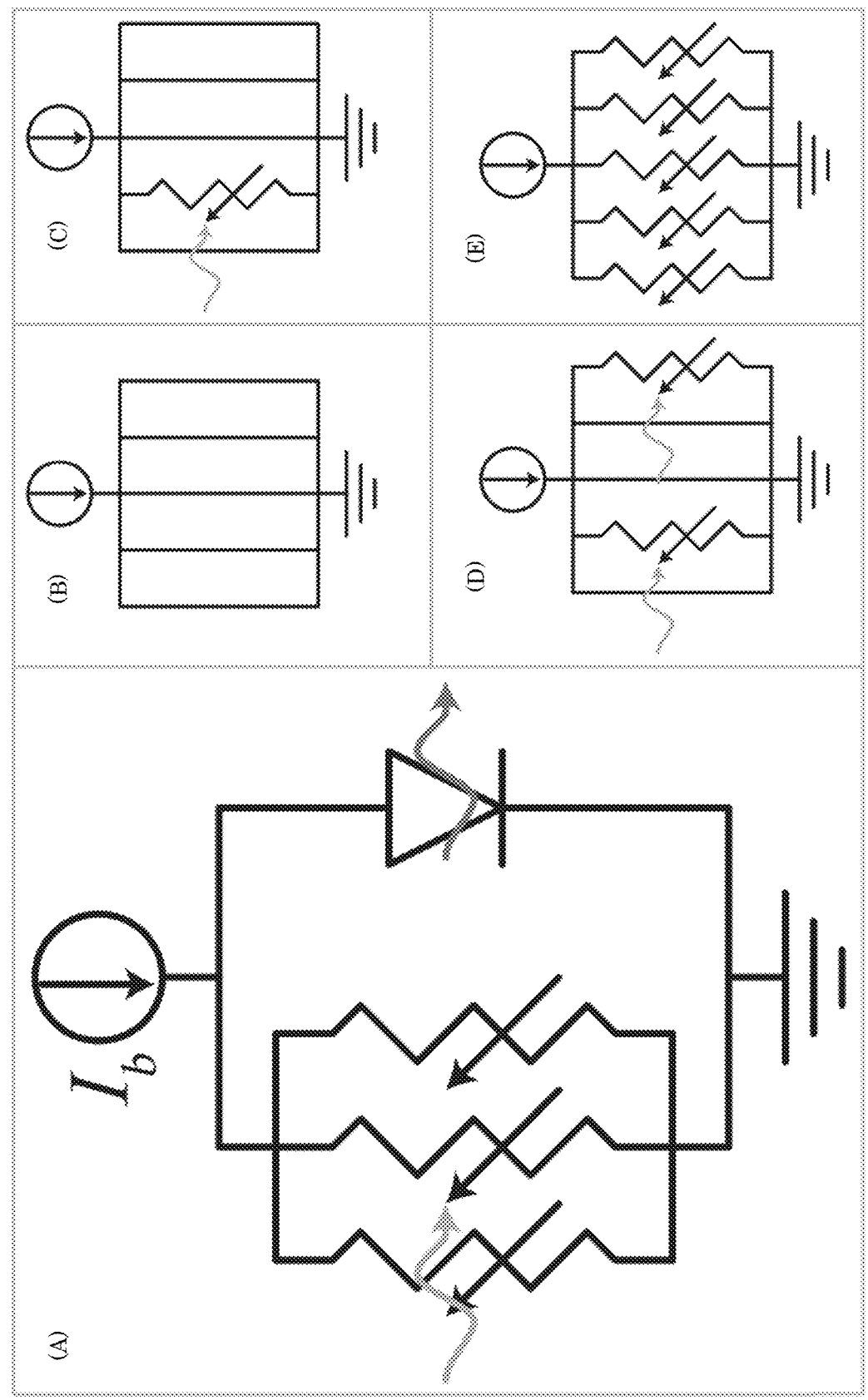
FIG. 15 shows (a) a parallel nanowire detector (PND) neuron circuit. (b) A PND with all wires superconducting. (c) A PND where one of the wires is driven normal by absorption of a single photon, redirecting the current through the other four. (d) A PND with two normal wires due to absorption of two photons. (e) A PND with all wires driven normal by exceeding the critical current. A LED in parallel with this PND now receives current, causing a firing event.

Further, the PND circuit shown in FIG. 15 can be modified so that each wire in the PND array is in parallel with a small shunt resistor. In this configuration, the L/R time constant of each receiving wire can be chosen to set the integration time. In this case, the hot-spot relaxation time represents a lower limit on the integration time, but the integration time can be extended to very long times relative to other time scales of the system simply by adjusting the L/R value.

The cylindrically symmetric nanowire arrays of FIG. 17 and FIG. 32 can provide a geometry, wherein no nanowire occupies an edge, so supercurrent is evenly distributed after each firing event. A PND can trap flux after a photon-absorption event. To utilize this to extend the integration time to infinity, the geometry of FIG. 17 is used. To dissipate flux to reduce the integration time, the topological variant of FIG. 32 is used. The differing circuit designs of these two devices are shown in FIG. 33. In the flux-dissipating configuration shown in FIG. 32 and FIG. 33$b$, flux-trapping superconducting loops are avoided, and all locations where hot spots can be created are on a boundary with the normal environment. Therefore, vortices created during absorption events are not trapped.

We note that in biological systems, the integration time is set by the RC time constant of the membrane and is typically approximately 1 ms or approximately 10-4-10-5 the firing period. Taking the 1-ns quasiparticle lifetime as the integration time, this corresponds to operating the system with (10-100)-kHZ event rates, a range that is straightforward to achieve.

The refractory period of a neuron refers to the time following a firing event during which the neuron cannot fire again. For a standard SNSPD, this dead time is governed by the L/R time constant of the series inductance of the SNSPD and the resistance across which the voltage pulse is being measured. In the case of WSi, this L/R time constant is usually 50 ns. This resistance is usually 50Ω, but in the present case, it is the impedance of the LED, which will be several kilohms, giving a shorter refractory period. If an application requires a longer refractory period, an additional series inductance can be added to achieve the desired delay. We note that in some SNSPD material systems, the L/Rtime constant must be chosen sufficiently large to avoid latching, while in the present application, the feedback circuit of FIG. 20$a$ can also be utilized to avoid latching and control the refractory period.

With regard to threshold condition for the PND array, we derive the expression of Eq. (1). The number of nanowires in the PND array is denoted by NNW. The number of nanowires driven normal by photons is denoted by nabs. The critical number of nanowires driven normal is denoted by nabsc. The bias current through the entire array is denoted by Ib. The current through a single wire of the array is denoted by i. The critical current of a single wire is denoted by ic.

In the steady state, before any photons are absorbed, nabs=0, and i=Ib/NNW. Upon absorption of a single photon, nabs=1 and i=Ib/(NNW-1). In the general case that n nanowires are driven normal by photons, nabs=n and i=Ib/(NNW-n). The condition for nabsc is i=ic=Ib/(NNW-nabsc). Rearranging gives nabsc=NNW-(Ib/ic).

Figure 30:
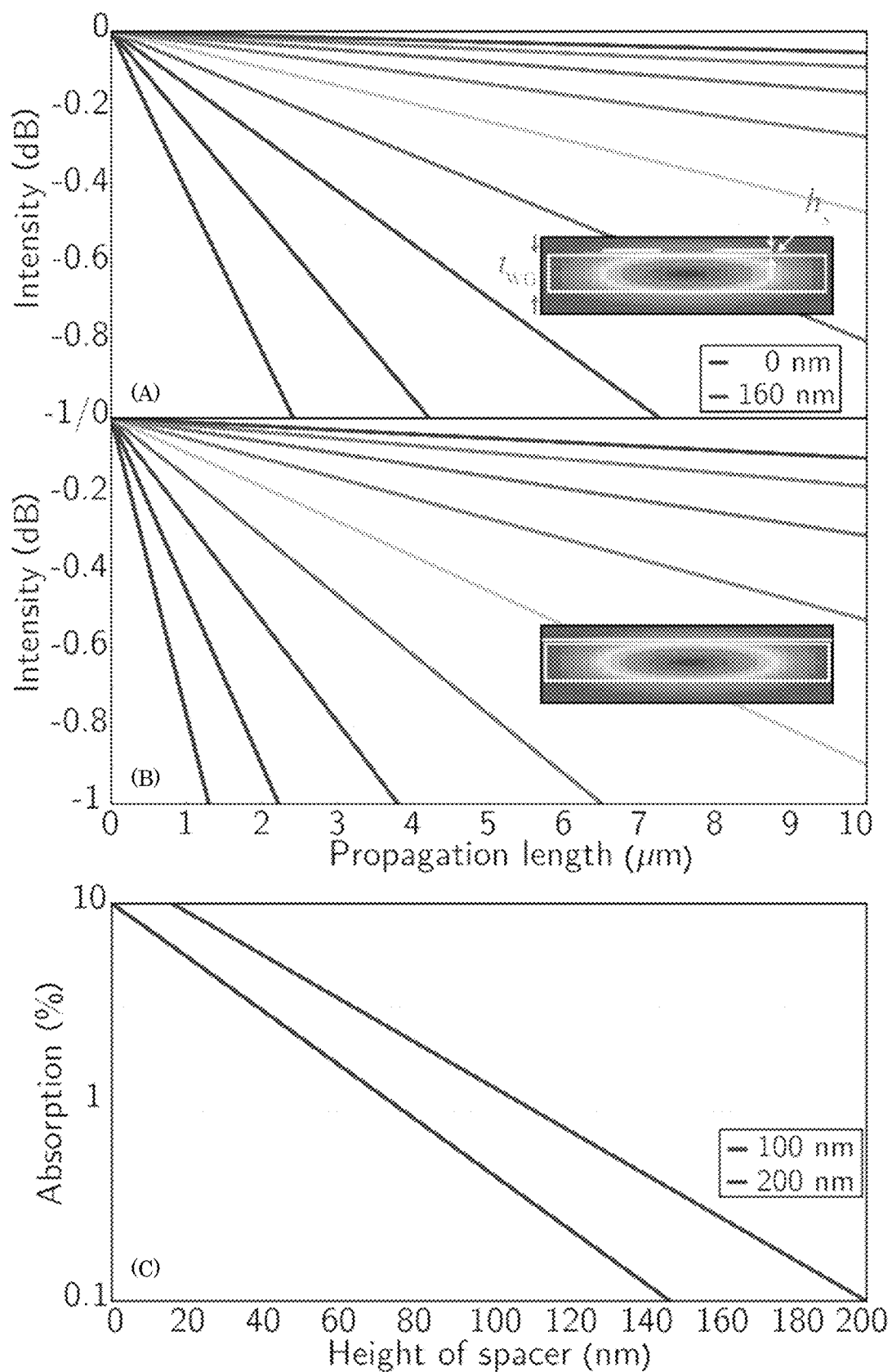
FIG. 30 shows an absorption of light propagating in a waveguide with SNSPD on top in (a) parallel and (b)

With regard to integration of superconducting and wire detectors, the behavior of the SNSPD receivers are analyzed by optical absorption and statistical behavior of waveguide-integrated SNSPDs. We calculate the attenuation of light as a function of propagation length for 200-nm-thick waveguides (tWG) in the asymptotic slab regime. The waveguide refractive index is 3.52, the cladding index is 1.46, and our calculations are at a wavelength of 1220 nm. The nanowire is assumed to be 4 nm thick, 300 nm wide with a 50% fill factor, and n=3.25+2.19i. In FIG. 30, we show the results for the common out-and-back configuration [light propagating parallel to the nanowire. FIG. 30$a$] and the slab configuration [light propagating perpendicular to the nanowire, FIG.

30b]. In each case, the various traces are for different spacer thicknesses, (hs, refractive index 1.46) between the waveguide and nanowire, ranging from zero to 160 nm in steps of 20 nm. The modal distribution is shown in the inset. The data in FIG. 30a and FIG. 30b are fractal in nature so an increase of the x axis by one decade is accompanied by an increase in the y axis by a decade (on the decibel scale). From these plots, one can see that for both the parallel and perpendicular configurations, a wide range of attenuation coefficients can be achieved.

In FIG. 30c, we show the probability of absorption after a single pass by a nanowire as a function of spacer thickness for waveguides with 100 and 200 nm thickness, illustrating another degree of freedom for tuning the absorption. It is important to be able to engineer the statistical distribution of absorption across the SNSPD receiver. For the case of the PND, each SNSPD should absorb an average of one photon each, as an additional photon absorption in the same SNSPD will not contribute to the spike event. For the case of the SND, the requirement is less stringent, but one still wants to spatially distribute absorption events so that hot spots do not overlap until a certain (large) number of photons is absorbed.

To address the design requirements of the PND, we consider the absorption statistics as calculated via Monte Carlo simulations. We perform 1000 trials each for different photon numbers incident on a PND with 40 SNSPDs. FIG. 31a shows the mean number of photons absorbed (out of 1000 trials) in the PND as a function of the number of incident photons for different absorption probabilities, in the case where only a single pass by each nanowire occurs. This behavior may be achieved with a design like that of FIG. 24. For each of the 1000 simulations, the arithmetic mean of the number of photons absorbed per nanowire is calculated for each value of incident photon number as $$\mu x(np,\alpha) = \frac{1}{N_{NW}} \sum_{NNW}^{i=1} x_i, \quad (C1)$$

where $x_i$ is the number of photons absorbed in the ith nanowire. From these values, the mean number of photons absorbed per nanowire $\bar{\mu}x$ is then calculated as the mean of the means (grand mean) in Eq. (C1).

The absorption probability in the PND has a mean number of absorbed photons per nanowire per pulse and the standard deviation of this number are both less than or equal to 1. In FIG. 31b, we show the standard deviation data for the single-pass case. For each of the 1000 trials, the standard deviation of the number of absorbed photons is calculated as $$\sigma x(np,\alpha) = \sqrt{\frac{1}{N_{NW}} \sum_{NNW}^{i=1} (x_i - \mu x)^2}, \quad (C2)$$

where $\mu x$ is given by Eq. (C1). The mean of these standard deviations over the 1000 Monte Carlo trials ($\bar{\sigma}x$) is calculated, as is the standard deviation of the standard deviations. The center trace of each curve in FIG. 31b is $\bar{\sigma}x$ for a given value of $\alpha$, and the width of the trace is calculated by adding and subtracting the standard deviation of the standard deviations. The standard deviation with $\alpha=10\%$ is roughly three photons. Thus, such large absorption is undesirable for this purpose, as the initial wires tend to absorb more than a single photon, and the latter wires absorb zero photons. For the one-pass case, 1% absorption appears to be close to ideal. The mean number of absorbed photons is close to 1, as is the standard deviation. The standard deviation for $\alpha=0.1\%$ is even lower, yet the mean number of absorbed photons is only approximately 0.2. Therefore, many photons are passing through the array without being absorbed.

Figure 23:
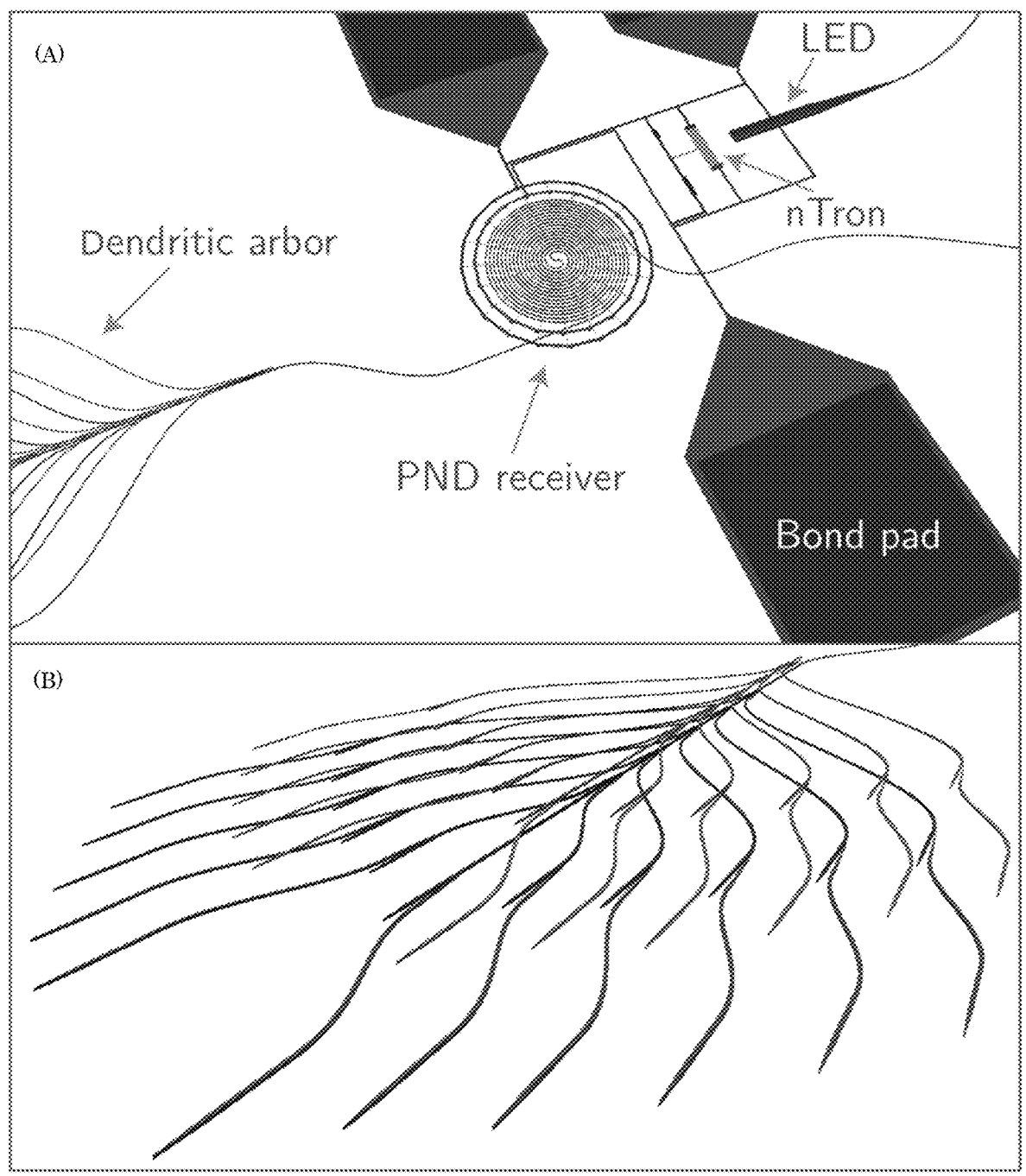
FIG. 23 shows a spider web neuron. (a) Overview of the device. (b) Dendritic arbor design which combines light from multiple neurons.

In FIG. 31c and FIG. 31d, we show results for the case where ten passes by each nanowire occur, as may be achieved with the spider web neuron design of FIG. 23. For the case of ten passes, $\alpha=0.1\%$ performs much better, although all photons are still not absorbed.

Consider the case where 40 photons are incident. We want all 40 of these photons to be absorbed by the 40 nanowires of the array, and, therefore, we want $\bar{\mu}x$ to be near unity. In FIG. 31c, we see that we achieve this for both $\alpha=1\%$ and 10%, yet in the case of $\alpha=10\%$, all photons are absorbed on the first pass [as seen in FIG. 31a], so the mode of the distribution is greater than 1, and the standard deviation is larger than desired. By comparing the standard deviations for the $\alpha=1\%$ and $\alpha=0.1\%$ cases in FIG. 31d, we find that $\alpha=0.1\%$ gives a more desirable spread of absorption events (smaller standard deviation). From this analysis, we find that for the PND receiver array, it is desirable to operate with low a and a high number of passes.

With regard to p-n junction model of the light-emitting diode, to model the performance of the emitters, we work with an analytical model of a p-n junction. Within this model, the current-voltage relationship for the junction is given by $$I_{p-n}(V) = eA(\sqrt{D_p \tau_p} p_n + \sqrt{D_n \tau_n} n_p)(e^{eV/k_B T} - 1). \quad (D1)$$

In Eq. (D1), the electron and hole diffusion coefficients are given by $D_n = \mu_n(kT/e)$ and $D_p = \mu_p(kT/e)$, where $\mu_n$ ($\mu_p$) is the mobility of electrons (holes). The electron and hole lifetimes are given by $\tau_n$ and $\tau_p$, respectively, which we take to be 40 ns. $n_p$ is the concentration of electrons on the p-doped side of the junction, and $p_n$ is the concentration of holes on the n-doped side of the junction. To achieve low-temperature operation, we assume degenerate doping, and, therefore, a low mobility is to be expected. We use a value of 100 cm$^2$/(V s) for both electron and hole mobilities. Because this value will be limited by ionized impurity scattering, it is likely to change little as the temperature decreases to 1 K.

From the electronic current, we calculate the photonic current as $$I_v(V) = \eta I_{p-n}(V) e. \quad (D2)$$

This model for the current through the diode is derived for an abrupt p-n junction, yet for the waveguide-integrated LED, one employs a p-i-n junction. Also, the present model breaks down at low temperature. We use T=300 K in Eq. (D1) because our measurements inform us that in the degenerate doping regime, the behavior is relatively constant to low temperature. Therefore, we use this model only as an approximation, and a more thorough numerical and experimental investigation of the devices to be used in the platform is the subject of future investigation. With this in mind, we approximate the capacitance of the junction using a simple parallel-plate model where the capacitance is given by $C=\varepsilon A/d$, where $\varepsilon$ is the material permittivity. A is the capacitor area, and d is the distance between the plates. We assume $\varepsilon=12\varepsilon_0$. A=10 µm×100 nm, and d=300 nm. The energy associated with charging this capacitor is then calculated as $E_c = 1/2 CV^2$. We note that for all values of photon number generated by the LEDs within this model, the applied voltage is below the built-in potential of the junction, so true forward-bias operation is not required. We anticipate that for the case of a p-i-n junction, the voltages required to achieve the same number of photons will increase slightly, but this can easily be accommodated by utilizing nanowires with larger critical currents.

With regard to waveguide design for the dendritic arbor, in FIG. 34a, we show effective indices at 1220 nm for slab thicknesses up to 600 nm to illustrate that many vertical modes can be present with high effective indices with only modest film thicknesses. We find that for <200 thick waveguides, only the first vertical order TE and TM modes are present. Therefore, a waveguide height can be 200 nm. For massive scaling, multimode waveguides with higher vertical as well as lateral modes and both polarizations can be used.

Having selected 200 nm as our waveguiding layer thickness, we consider the lateral mode spectrum, as shown in FIG. 34b. Here we see that the second-lateral-order TE mode emerges above the cladding index around 350 nm; we choose this as the single-mode width for the dendritic arbor simulations. From FIG. 34b, we also find that a large number of higher-lateral-order modes are present with high effective index and modest waveguide width. For the dendritic arbor design presented in FIG. 23b, a compact multimode waveguide can be used. From this analysis, we find that a waveguide with tens of modes can be achieved while still maintaining a compact bend radius.

We select a minimum inter-waveguide gap that avoids undesired coupling of modes in space. To do this, we calculate the supermode propagation constants as a function of the waveguide gap, as shown in FIG. 35. We see the splitting between the symmetric and antisymmetric modes is quite large for a gap of 100 nm, but both modes converge to the uncoupled value for a gap of 600 nm. The fractional splitting $\Delta\beta/\beta 0$ is shown in the inset. Here, $\Delta\beta$ is the difference between the propagation constants of the symmetric and antisymmetric supermodes, and $\beta 0$ is the uncoupled propagation constant. Based on this analysis, we choose 600 nm to be the inter-waveguide gap for the dendritic arbor design of FIG. 24.

With regard to scaling, a length of an MLP layer is $$L1=(Lt+Lg+Lx)NnNWG+2LWGNWG+Ln, \quad (F1)$$

where Lt is the length of a single tap (or synapse) taken to be 10 μm; Lg is the length of a gap between two vertically running waveguides taken to be 5 μm, which is sufficiently wide to allow for undercut of the mechanically mobile synapses; Lx is the length of an intraplane waveguide crossing taken to be 3 μm; Nn is the number of neurons in a MLP layer [four in FIG. 27a]; NWG is the number of vertically stacked waveguide planes used for routing; LWG is the length of an interplane coupler between two waveguiding planes taken to be 10 μm. Ln is the length of a single neuron as shown in FIG. 24. Ln is determined predominantly by the number of inputs and, therefore, is taken to be the inter-waveguide gap, 600 nm×Nn. The width of a single neuron is taken to be equal to its length, and within this model, we assume each neuron in a given layer has a synapse connecting to each neuron of the next layer.

Application of Shannon's theory of communication to neural systems provides quantification of information-processing capacity. The mutual information (in bits) between a neural system and a stimulus can be represented as $$Im=\int ds \int dr P[s]P[r|s]\log 2(P[r|s]P[r]). \quad (G1)$$

In Eq. (G1), P[r] is the probability of spike rate r occurring given a stimulus s, P[s] is the probability of stimulus s occurring from the set of all possible stimuli, and P[r|s] is the conditional probability of response rate r being evoked when the system is presented with stimulus s. With a neuromorphic computing platform, one wants to maximize the mutual information. Because Im within this model is calculated simply as a double integral over stimuli and response rates, we can maximize this quantity by increasing the limits of the integral. Because the proposed devices can operate at 20 MHz—and potentially up to 1 GHz by employing superconductors with faster thermal recovery—they can achieve response rates as well as receive stimulus across this entire bandwidth. The intrinsic speed of SPONs is greater than biological systems by a factor of 104, and this affects both the stimulus and response bandwidths in the double integral.

In addition to increasing the double integral by increasing the bandwidths, we can also maximize the bit depth. Signals can be discretized into roughly 11 bits. However, it is possible to increase this number further at the expense of size and efficiency.

We discuss the s and r in Eq. (G1) with the photonic input to the receiver array and photonic output pulse rate of the transmitter in mind, but the neuron of FIG. 26 can receive more stimulus and generate more output. For example, if one considers not only the photons incident upon the receiver as stimulus but also the current through the SNSPD, the bit depth of the discernible stimuli increases further.

Equation (G1) is derived by considering the difference between the entropy of a neuron's responses to a given stimulus and the noise entropy. As such, it is a measure of the information content at the device level and not at the system level. Information content of a population grows with the size of that population. Therefore, the high bandwidth of SPON devices, the ability to scale to units with large numbers of connections, and the ability to scale to systems with large numbers of units while maintaining a low power density points to the potential for complex systems with enormous information content. We note that these attributes are enabled by photonic signaling and superconducting electronics.

Example 2. Multi-Planar Amorphous Silicon Photonics with Compact Interplanar Couplers, Cross Talk Mitigation, and Low Crossing Loss A photonic routing architecture efficiently uses space of a multi-plane (3D) photonic integration. A wafer with three planes of amorphous silicon waveguides was fabricated and characterized, demonstrating less than $3\times10^{-4}$ dB loss per out-of-plane waveguide crossing, 0.05±0.02 per interplane coupler, and micro-ring resonators on three planes with a quality factors up to $8.2\times10^4$. We also explore a phase velocity mapping strategy to mitigate the cross talk between co-propagating waveguides on different planes. These results expand the utility of 3D photonic integration for applications such as optical interconnects, neuromorphic computing and optical phased arrays.

An advantage of photonic integration is the ease with which signals can be routed over a wide range of distances without incurring excessive power penalties, losses, or cross talk. Photonic interconnects are an approach for applications including massive connectivity, such as phased arrays and optical transceivers. The field of neuromorphic computing using photonics may realize all-to-all connectivity at the scale of $10^3$ synaptic connections per neuron. The footprint of the interconnections is minimized if signals can cross paths at least a similar number of times. For single-plane photonics, compact multimode waveguide crossings with 0.02 dB loss per crossing have been demonstrated, allowing several dozen such junctions in a path without significantly impacting the power budget. However, to achieve connectivity orders of magnitude greater, multi-planar (3D) photonic integration becomes necessary to minimize the crossing loss and to increase the maximum photonic waveguide density.

Once the decision to expand vertically has been made, we are faced with many more choices concerning the platform:

waveguide materials, confinement strength, interplane pitch, and interplane coupler (IPC) mechanism. These elements are intricately related through their impact on the critical metrics of crossing loss, cross talk, and the horizontal and vertical waveguide density that can be attained. To minimize the crossing loss and cross talk between out-of-plane waveguides, the optical modes must be sufficiently far apart to avoid scattering or evanescent coupling. However, increasing the interplane pitch also compromises size and efficiency of the IPCs. Previous work has demonstrated a two-plane crystalline/amorphous (c-Si/a-Si) platform with a 1.12 µm interplane pitch. Such a large separation allows reasonable mitigation of cross talk and crossing loss. However, it also poses a challenge for the IPC, which suffered from high loss (0.49 dB) and large dimensions (~200 µm length). To overcome these penalties, smaller pitches and weaker modal confinement can be pursued instead. A silicon-nitride two-plane platform with a pitch of 900 nm was bridged with a 100 µm long adiabatic taper with <<0.01 dB loss per coupler. However, a consequence of the reduced inter-plane isolation was a severe penalty of 0.167 dB loss per out-of-plane waveguide crossing. With even smaller gaps, considerably shorter couplers can be achieved with similar loss performance, but nothing is done to address the issues of cross talk and crossing loss. One way to circumvent these issues is to employ an additional intermediate routing plane to allow efficient coupling between smaller gaps, while maintaining a large separation in crossing areas; this has been realized with $3.1 \times 10^{-3}$ dB per crossing while co-integrating modulators and detectors on the same platform, showcasing the utility of 3D integration for high-density interconnect and transceiver applications. For interconnect applications including a few photonic planes, the need to utilize an entire plane to augment the interplane pitch may not significantly impact the cost or complexity of the system. However, it does not take full advantage of the surface area present in each layer, which could be used to attain even greater performance. Furthermore, for interconnects requiring many planes, the impact of doubling them is a consideration.

Much research has focused on crossing loss mitigation, and cross talk is generally avoided with the assumption of perpendicular (or significantly angled) waveguide orientations at overlapped regions on the wafer, to limit evanescent coupling-induced cross talk. Such a routing/layout scheme inherently has poor utilization of the available surface area and is incompatible with conventional, Manhattan-type routing layouts in which nearby paths will lie parallel to each other for considerable distances. An interconnect layout that prohibits co-propagation of out-of-plane waveguides will also increase the number of crossings and thus increase the optical loss.

The ideal 3D photonic integration architecture allows fully packed waveguide integration (density-limited by lateral coupling) on each additional plane, allows Manhattan-style routing with both perpendicular and parallel paths for different planes, and realizes compact, low-loss crossings and transitions, allowing maximum flexibility to the routing layout—a crucial consideration for further scaling. To realize these goals, we propose a 3D integration strategy comprising an efficient IPC design and a robust optical routing technique. We experimentally demonstrate the system's performance in the key performance metrics of crossing loss, cross talk, and interplane coupling loss. Additionally, to assess the film properties of the stack, we fabricate and characterize micro-ring resonators on each of the three planes. The platform is represented in FIG. 36. It employs 200 nm-thick a-Si waveguiding planes with an interplane pitch of 900 nm. For each a-Si plane in the stack, the nominal width of routed waveguides is alternated between two values, $w_a$=470 nm and $w_b$=550 nm. In this way, continuous constructive interference between adjacent planes is prevented via a phase mismatch, allowing these waveguides to be co-propagated over arbitrary distances; this is analogous to the use of superlattices for increasing the horizontal packing density of a single plane of waveguides. For this design, an intraplane horizontal waveguide pitch of 2 µm is sufficient to guarantee a cross talk of <−19 dB for a co-propagation length of 2 mm. In our platform, waveguides on different planes are also staggered with a horizontal offset (half of the intraplane waveguide pitch) to further limit cross talk without compromising the packing density. In effect, these choices allow a smaller interplane pitch and relax the demands on the IPC. The use of waveguide superlattices in the horizontal direction may also be useful in reducing the in-plane spacing of waveguides, when the set of waveguide widths is appropriately chosen.

The platform was prototyped at the Boulder Microfabrication Facility at NIST. The fabrication flow is shown in FIG. 37. Three waveguiding planes denoted P1, P2, and P3 were employed, though the process is in principle scalable to larger numbers. The a-Si deposition was performed with an inductively coupled plasma chemical-vapor-deposition (ICP-CVD) system, utilizing $SiH_4$/Ar chemistry at 150° C. Prism-coupling measurements indicate a refractive index value of 3.12±0.1 and a slab propagation loss in 144 nm-thick films of ~1.4 dB per cm at λ=1550 nm. Patterning was performed with electron-beam lithography. ICP reactive-ion etching utilized a $SF_6/C_4F_8$ chemistry. Unused areas were patterned with a periodic partial fill to homogenize the surface and limit film stress. The fill pattern was implemented on every plane for the slab areas immediately beyond the waveguide trench isolation. To prevent interplane coupling from waveguides into slabs on other planes, any fill pattern that overlapped a device feature on another waveguide plane was completely etched away. Images of the finished sample after fabrication are shown in FIG. 37(g)-FIG. 37(j). The experimental interplane pitch of ~700 nm is smaller than the design value of 900 nm, which may be explained by inaccuracies from using a white-light interferometer to track film thicknesses throughout the fabrication.

The fabricated devices were characterized via a tunable laser source and detector system. Light was coupled on- and off-chip via fully etched grating couplers and single-mode fibers at a nominal wavelength of 1540 nm. Statistical uncertainties are reported as the standard deviation in transmitted optical power for sets of reference paths consisting of two grating couplers and a waveguide.

With regard to micro ring resonators, the waveguiding performance and material quality of each of the three planes (P1-P3) was assessed by fabricating and measuring micro-ring resonators with radii of 30 µm (FIG. 38). A ring-bus coupling gap of 500 nm was employed, incurring minimal loading. A set of grating couplers (input, output, and drop ports) was fabricated with each ring. The measured and normalized drop-port transmission for one doublet resonance from each ring (waveguide width of 550 nm for all three planes) is plotted in [FIG. 38b], as well as the fitted value based on coupled-mode theory. The loaded quality factors (Qs) for the P1, P2, and P3 doublet pairs (with the two peaks in the doublet denoted a and b) are as follows:

$Qa=6.1 \times 10^4, Qb=6.4 \times 10^4$;  P1:

$Qa=6.2 \times 10^4, Qb=8.2 \times 10^4$;  P2:

$Qa=2.5 \times 10^4, Qb=3.2 \times 10^4$.  P3:

Based on the Q-factor of $8.2 \times 10^4$ measured from the P2 resonator, a corresponding propagation loss of 7.4 dB per cm was observed. These values are likely predominantly limited by pattern and etch-induced sidewall roughness (based on the earlier observed slab propagation loss of 1.4 dB per cm), which was not optimized in this work.

With regard to inter-plane couplers, interplane pitch of 900 nm, combined with the high-confinement a-Si core, poses a challenge for the IPC. State-of-the-art IPCs for similar interplane pitches exhibit typical lengths between 100 and 200 µm, or compromise the efficiency for shorter device lengths (~1 dB over a 60 µm long coupler).

An effective IPC design, consisting of a tapered width transition between two waveguides, should behave adiabatically (which enhances bandwidth and tolerance to fabrication errors) but should also be designed to enhance the evanescent coupling strength between the two waveguides. This can be achieved with narrower waveguides to reduce the mode confinement. For large interplane pitches, the average waveguide width throughout the transition should be minimized to the point that it does not introduce losses due to sidewall roughness. However, a simple linear taper of the waveguide width between the maximum and minimum values results in excessively long couplers, since little coupling occurs until the waveguide dimensions are significantly narrowed. We have thus implemented a two-level IPC design, making use of a "fast" initial taper to rapidly compress the waveguide width at the outer regions, combined with a "slow" extended taper region over which a much smaller width transition occurs [FIG. 39b]. The result is strong coupling over most of the useful taper length, while eliminating unnecessary space for bulk width adjustments at the input/output. Compared to a simple uniform directional coupler approach, this has increased tolerance to thickness variations between layers. The proposed design has the parameters $L_1=4$ µm, $L_2=15$ µm, $w_{min}=320$ nm, $w_{mid}=350$ nm, and $w_{max}=510$ nm, with a total length of 38 µm. The simulated insertion loss is 0.032 dB per coupler at a wavelength of 1540 nm via 3D finite-difference time-domain (FDTD). A series of parametric variations near these design parameters was fabricated. Each design was tested in a cut-back arrangement by comparing the spectral transmission of 32 successive transitions between P1/P2 to the averaged spectral transmission of twelve reference waveguide paths (waveguide width=510 nm) of the same total length, distributed across the test array. Each IPC is separated from the next on the same plane by a 10 µm-long gap, which prevents parasitic coupling. The estimated parasitic coupling for any residual light is estimated by FDTD to be <0.3%. The resultant loss spectrum of the best-performing design observed is plotted in FIG. 39e. A minimum loss of 0.05±0.02 dB per coupler is observed at a wavelength of 1526 nm. A loss better than 0.1 dB per coupler is maintained over a 35 nm span from $\lambda=1512$ nm to 1547 nm. The measured device has designed parameters $L_1=3$ µm, $L_2=15$ µm, $w_{min}=330$ nm, $w_{mid}=370$ nm, and $w_{max}=510$ nm, comprising a total length of 36 µm. The difference in optimal design parameters likely comes from the reduced interplane pitch in the fabricated structure, leading to stronger-than-expected coupling.

With regard to waveguide crossings, we investigate the performance of perpendicular out-of-plane waveguide crossings. Test devices FIG. 40a were fabricated with $N_c=0$, 200, 400, and 600 crossings for both P1/P2 and P1/P3 types. The waveguide stubs acting as crossings were separated from each other by a pitch of 3 µm. The total path length in each measurement is the same, regardless of the number of waveguide crossings, such that the propagation loss is automatically subtracted from the per-crossing loss values. For P1/P3 crossings, the loss per crossing is below the measured standard error of $3 \times 10^{-4}$ dB per crossing. For P1/P2 crossings, the measured value is $3.1 \times 10^{-3} \pm 7 \times 10^{-4}$ dB per crossing, on-par with the best measured to date, without the need for a dedicated plane to expand the interplane pitch. We note that a spectral scan of the insertion loss for a device with 600 P1/P2 crossings, compared to one with zero crossings, revealed that the waveguide stubs do not induce a grating effect capable of affecting the loss measurement. These results demonstrate the scalability of this integration strategy to large waveguide packing densities.

With regard to cross talk, to effectively utilize the space available, and to avoid dilemmas in the routing, the cross talk between co-propagating waveguides on different planes must be managed. We now explore the performance of phase velocity mapping of waveguides on adjacent planes via a small difference in waveguide width. This was done by co-propagating P1 and P2 or P3 waveguides for a variable distance and measuring the maximum ratio of upper-waveguide power to the total power from both arms. For P1/P2 devices, both cases of $\Delta w_w=0$ nm and $\Delta w_w=80$ nm were considered, while the P1/P3 case utilized the same nominal waveguide widths. Test devices [FIG. 41a] were fabricated and measured, with the results plotted in [FIG. 41b]. The theoretically predicted cross talk behavior for the fabricated test structures (via FDTD simulations) is also plotted to provide a comparison. The highest values of cross talk occur at different lengths due to differences in propagation constant and coupling strengths in each case. For overlapped P1/P2 waveguides with identical widths, a severe maximum cross talk of −4.8±0.7 dB was measured for a co-propagation length of 16 µm. However, using a difference of 80 nm in the waveguide width, the cross talk was dramatically reduced to −12.5±0.7 dB (58 µm co-propagation length), even in the extreme case of direct overlapping. FDTD simulations show that a straightforward cross talk improvement (based on the observed performance so far) to <<−33 dB is achievable for P1/P2 phase-velocity-mapped waveguides by offsetting them by 1 µm in the horizontal direction when co-propagation is required (see FIG. 36). This would have no significant impact on the available surface area, since the same intra-plane pitch can still be used. Finally, for the P1/P3 over-lapped case, a negligible cross talk value of −35±0.7 dB was experimentally observed (at 25 µm length). At the maximum measured length of 58 µm, the experimentally observed P1/P3 cross talk is 16 dB smaller than the theoretical value. This is most likely due to a minor difference in thickness of ~10 nm between the P1/P3 films. As a result, there is a small phase mismatch between them, and the waveguides only constructively transfer power over a shorter length than what is required for maximum coupling. To support this conclusion, we simulated the effect of a 10 nm reduction in the thickness of the P2 and P3 films, also considering the experimental interplanar pitch (700 nm) in this case. In the P1/P3 case, a maximum cross talk of −34.5 dB is predicted, which closely agrees with the observed value of −35 dB. In the P1/P2 case with identical waveguide widths, the predicted maximum cross talk is −2.8 dB, also in good agreement with the measurement of −4.8 dB. Finally, in the case of mismatched widths in P1/P2 waveguides, this thickness difference partially counteracts the phase velocity engineering, resulting in a predicted cross talk of −6.7 dB. The difference between this and the measured value of −12.5 dB could be from a small deviation in the P1/P2 interplane pitch or a different thickness variation.

For efficient photonic routing in 3D-integrated systems, a prototype implementation was experimentally realized with three planes of amorphous silicon waveguides. Detailed characterization reveals exceptional performance in the critical performance metrics of out-of-plane crossing loss, interplane coupler loss, and cross talk. Micro-ring resonators were fabricated on all three planes, showing a quality factor up to $8.2 \times 10^4$. An out-of-plane waveguide crossing loss of $3 \times 10^{-3} \pm 7 \times 10^{-4}$ dB per crossing for adjacent planes (P1/P2) was observed, and for double-spaced planes (P1/P3), the crossing loss was below the measurement limit of $3 \times 10^{-4}$ dB per crossing. The large interplane pitch was bridged with a compact and efficient two-stage interplane coupler (IPC) design, showing a peak performance of $0.05 \pm 0.02$ dB per coupler at $\lambda=1526$ nm. Next, anticipating that Manhattan-style routing will be a necessary feature of high-density 3D optical interconnects, we investigated a means of enabling waveguides on adjacent planes to be propagated parallel to each other for arbitrary distances, without introducing excessive cross talk. By slightly modifying the waveguides on alternate planes to be 80 nm wider, continuous constructive interference is disrupted. Directly overlapped waveguides employing this technique showed a nearly six-fold reduction in cross talk compared to those with identical widths. This could later be combined with a simple constant horizontal offset (half of the intraplane pitch) that will lead to $\ll -33$ dB cross talk between P1/P2 waveguides. These results, showing drastically increased layout flexibility and space-efficiency, bolster the case for 3D integrated photonics.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A neuromimetic circuit comprising:
   a primary single photon optoelectronic neuron;
   a synapse in optical communication with the primary single photon optoelectronic neuron; and
   an axonic waveguide in optical communication with the primary single photon optoelectronic neuron and the synapse such that the axonic waveguide optically interconnects the primary single photon optoelectronic neuron and the synapse, and primary single photon optoelectronic neurons are interconnected by integrated axonic waveguides, such that primary single photon optoelectronic neurons receive photonic signals from other primary single photon optoelectronic neurons.

2. The neuromimetic circuit of claim 1, further comprising:
   a primary input communication path in communication with the primary single photon optoelectronic neuron and that communicates a primary signal to the primary single photon optoelectronic neuron.

3. The neuromimetic circuit of claim 2, further comprising:
   a secondary single photon optoelectronic neuron in optical communication with the synapse such that the synapse interconnects the primary single photon optoelectronic neuron and the secondary single photon optoelectronic neuron.

4. The neuromimetic circuit of claim 3, further comprising:
   a dendritic communication path in communication with the synapse and the secondary single photon optoelectronic neuron,
   wherein the dendritic communication path interconnects the synapse and the secondary single photon optoelectronic neuron.

5. The neuromimetic circuit of claim 4, wherein the primary single photon optoelectronic neuron and the secondary single photon optoelectronic neuron independently comprise:
   a transmitter in communication with the synapse;
   a receiver in communication with the transmitter; and
   a superconducting wire that electrically interconnects the receiver and the transmitter.

6. The neuromimetic circuit of claim 5, wherein the receiver comprises:
a superconducting photon detector; and
an integrator in communication with the superconducting photon detector.

7. The neuromimetic circuit of claim 6, wherein the receiver further comprises:
a superconducting transfer synapse in communication with the superconducting photon detector and in electrical communication with the integrator.

8. The neuromimetic circuit of claim 7, wherein the receiver further comprises:
a thresholding member in electrical communication with the integrator.

9. The neuromimetic circuit of claim 6, wherein the receiver further comprises:
a photonic transfer synapse in optical communication with the superconducting photon detector.

10. The neuromimetic circuit of claim 6, wherein the transmitter comprises:
a superconducting voltage amplifier in communication with the integrator of the receiver; and
a photon emitter in communication with the superconducting voltage amplifier.

11. The neuromimetic circuit of claim 1, wherein the synapse comprises:
a synaptic axon waveguide in communication with the axonic waveguide; and
a synaptic dendrite waveguide in communication with the synaptic axon waveguide.

12. A process for performing neuromimetic computing, the process comprising:
receiving a primary signal by a primary single photon optoelectronic neuron;
producing an axonic photonic signal by the primary single photon optoelectronic neuron;
communicating the axonic photonic signal to a synapse;
receiving the axonic photonic signal by the synapse;
producing a dendritic signal in response to receipt of the axonic photonic signal;
communicating the dendritic signal from the synapse to a secondary single photon optoelectronic neuron;
receiving the dendritic signal by the secondary single photon optoelectronic neuron;
producing a second axonic photonic signal in response to receipt of the dendritic signal to perform neuromimetic computing.

13. The process of claim 12, further comprising:
producing, by a receiver, a threshold signal in response to receipt of the primary signal.

14. The process of claim 13, wherein producing, by the receiver, the threshold signal comprises:
detecting; by a superconducting photon detector; a photon;
producing a synaptic signal based on detection of the photon;
integrating the synaptic signal to produce an integrated signal; and
producing the threshold signal based on the integrated signal.

15. The process of claim 13, wherein producing, by the receiver, the threshold signal comprises:
detecting, by a photonic transfer synapse, the primary signal;
producing a photon in response to detection of the primary signal;
detecting; by a superconducting photon detector; the photon producing a signal based on detecting the photon; and
producing the threshold signal based on the signal from the superconducting photon detector.

16. The process of claim 13, further comprising:
receiving, by a superconducting voltage amplifier, the threshold signal; and
producing the axonic photonic signal in response to receipt of the threshold signal.

17. The process of claim 16, further comprising:
amplifying, by the superconducting voltage amplifier, the threshold signal;
producing a transmitter electrical signal from the threshold signal; and
emitting the axonic photonic signal based production of the transmitter electrical signal.

18. The process of claim 12, wherein producing the dendritic signal in response to receipt of the axonic photonic signal comprises:
receiving, by a synaptic axon waveguide, the axonic photonic signal;
communicating the axonic photonic signal from the synaptic axon waveguide to a synapse; and
producing the dendritic signal in response to receipt of the axonic photonic signal by the synapse.

* * * * *